United States Patent [19]

May et al.

[11] Patent Number: 4,891,743
[45] Date of Patent: Jan. 2, 1990

[54] POWER SUPPLY CONTROLLER

[75] Inventors: Ronald F. May, Lannon; Kenneth G. Kafer, New Berlin; Gregory W. Schuelke, Hartford; Michael T. Verstegen, Appleton, all of Wis.

[73] Assignee: Enercon Industries Corporation, Menomonee Falls, Wis.

[21] Appl. No.: 118,829

[22] Filed: Nov. 9, 1987

[51] Int. Cl.$^4$ ............................................. H02M 5/42
[52] U.S. Cl. ...................................... 363/87; 364/483
[58] Field of Search ...................... 363/85, 87, 88, 128, 363/129; 364/138, 188, 480, 483; 324/121 R; 340/706, 715; 368/43, 82, 83

[56] References Cited

U.S. PATENT DOCUMENTS

| | | | |
|---|---|---|---|
| 4,084,402 | 4/1978 | Moyer | 368/83 |
| 4,189,765 | 2/1980 | Kotalik et al. | 364/188 |
| 4,303,973 | 12/1981 | Williamson, Jr. et al. | 340/706 X |
| 4,320,662 | 3/1982 | Schaub et al. | 364/565 X |
| 4,327,268 | 4/1982 | Frank | 219/10.77 |
| 4,347,562 | 8/1982 | Galloway | 363/87 |
| 4,396,977 | 8/1983 | Slater et al. | 340/706 X |
| 4,423,461 | 12/1983 | Kaainoa et al. | 361/235 |
| 4,442,424 | 4/1984 | Shirasaki et al. | 340/715 X |
| 4,490,780 | 12/1984 | Nondahl | 363/87 |
| 4,507,722 | 3/1985 | Dewan et al. | 363/79 |
| 4,511,956 | 4/1985 | Dewan et al. | 363/49 |
| 4,587,605 | 5/1986 | Kouyama et al. | 364/483 X |
| 4,612,775 | 9/1986 | Branz et al. | 364/188 X |
| 4,674,053 | 6/1987 | Bannai et al. | 364/188 X |
| 4,707,795 | 11/1987 | Alber et al. | 364/483 X |
| 4,803,039 | 2/1989 | Impink, Jr. et al. | 364/188 X |

Primary Examiner—Patrick R. Salce
Assistant Examiner—Kristine Peckman
Attorney, Agent, or Firm—Quarles & Brady

[57] ABSTRACT

A control system for an industrial inverting type power supply is disclosed which provides for both operational control and a diagnostic capability for the power supply. The operational control aspects includes measuring and displaying a plurality of operational signals from within the power supply, and for providing several automatic modes of operation for the power supply. The diagnostic aspects of the control system include measuring and displaying a plurality of diagnostic values, particularly the measurement of several waveform characteristic values of the switching waveform of the power supply. Other diagnostic capabilities include a set of remote inputs, each of which, when activated, triggers an entry into a history table, thereby maintaining a record of remote input activations. Each remote input may also be configured with a descriptive message to be displayed on an operator display and a code which specifies the action that is to be taken by the control system when that remote input is activated. A short detection circuit is also included which operates when the power supply is stopped to test the switching elements of the power supply for shorts.

29 Claims, 38 Drawing Sheets

| DIP SWITCH NO. | ASSIGNMENT | |
|---|---|---|
| 1 | LINE CURRENT | ⎫ |
| 2 | OUTPUT CURRENT | ⎪ |
| 3 | OUTPUT ENERGY | ⎪ OPERATIONAL INFORMATION ELEMENTS TO BE DISPLAYED IN 4TH METER POSITION |
| 4 | INPUT ENERGY | ⎬ |
| 5 | GENERAL PURPOSE INPUT | ⎪ |
| 6 | DC BUS VOLTAGE | ⎪ |
| 7 | DC BUS CURRENT | ⎪ |
| 8 | LINE VOLTAGE | ⎭ |
| 9 | NOT USED | |
| 10 | NOT USED | |
| 11 | SWITCHING FREQUENCY | ⎫ |
| 12 | SCR PEAK VOLTAGES | ⎪ DIAGNOSTIC INFORMATION ELEMENTS TO BE DISPLAYED IN DIAGNOSTIC WINDOW |
| 13 | B SUPPLY VOLTAGES | ⎬ |
| 14 | SCR TK TIME | ⎪ |
| 15 | SCR TOT TIME | ⎪ |
| 16 | HIGHEST SCR PEAK VOLTAGE | ⎭ |
| 17 | NOT USED | |
| 18 | AUTOMATIC RESTART ENABLE | |
| 19 | TACHOMETER START ENABLE | |
| 20 | VOLTAGE PEAK HOLD | |
| 21 | TPP PROGRAM | |
| 21 | TPP EXECUTE | |
| 23 | EPP PROGRAM | |
| 24 | EPP EXECUTE | |
| 25 | ALARM DISABLE | |
| 26 | VOICE DISABLE | |
| 27 | HISTORY TABLE DISABLE | |
| 28 | REMOTE DISPLAY DISABLE | |

FIG. 1B

| | |
|---|---|
| LINE VOLTAGE FULL SCALE TEXT | LINE VOLTAGE SCALING FACTOR |
| LINE CURRENT FULL SCALE TEXT | LINE CURRENT SCALING FACTOR |
| OUTPUT VOLTAGE FULL SCALE TEXT | OUTPUT VOLTAGE SCALING FACTOR |
| OUTPUT CURRENT FULL SCALE TEXT | OUTPUT CURRENT SCALING FACTOR |
| OUTPUT FREQUENCY FULL SCALE TEXT | OUTPUT FREQUENCY SCALING FACTOR |
| D. C. BUS VOLTAGE FULL SCALE TEXT | D. C. BUS VOLTAGE SCALING FACTOR |
| D. C. BUS CURRENT FULL SCALE TEXT | D. C. BUS CURRENT SCALING FACTOR |
| D. C. BUS POWER FULL SCALE TEXT | D. C. BUS POWER SCALING FACTOR |
| GENERAL PURPOSE INPUT (GPI) HEADER LINE 1 ||
| GENERAL PURPOSE INPUT (GPI) HEADER LINE 2 ||

EEPROM 107

FIG. 4C

| RECORD NUMBER | TYPE FIELD | POLARITY FIELD | FAULT MESSAGE FIELD | VOICE MESSAGE FIELD |
|---|---|---|---|---|
| 1 | TYPE | POLARITY | 20 CHARACTER FAULT MESSAGE | VOICE MESSAGE CODE |
| 2 | TYPE | POLARITY | 20 CHARACTER FAULT MESSAGE | VOICE MESSAGE CODE |
| ... | | | | |
| 64 | TYPE | POLARITY | 20 CHARACTER FAULT MESSAGE | VOICE MESSAGE CODE |

EEPROM 107

FIG. 4D

| HISTORY TABLE RECORD NUMBER | CONTROL VOLTAGE FIELD | HISTORY TIMER FIELD | LAST BUTTON FIELD | ID FIELD |
|---|---|---|---|---|
| 1 | CONTROL VOLTAGE VALUE | MINUTES SINCE LAST ENTRY | LAST BUTTON PUSHED | VOICE MESSAGE CODE |
| 2 | CONTROL VOLTAGE VALUE | MINUTES SINCE LAST ENTRY | LAST BUTTON PUSHED | REMOTE INPUT # |
| ... | | | | |
| 2,000 | CONTROL VOLTAGE VALUE | MINUTES SINCE LAST ENTRY | LAST BUTTON PUSHED | REMOTE INPUT # |

EEPROM 107

FIG. 4E

| CONTROL MODE | MANUAL CONTROL | AUTOMATIC CONTROL | | |
|---|---|---|---|---|
| | | TIMED POWER PROFILE (TPP) EXECUTE | EVENT POWER PROFILE (EPP) EXECUTE | EXTERNAL CONTROL |
| HOW ENABLED | AUTO/MAN PUSHBUTTONS ON MASTER DISPLAY IN "MANUAL" POSITION | AUTO/MAN PUSHBUTTONS ON MASTER DISPLAY IN "AUTO" POSITION AND "TPP ENABLE" DIP SWITCH ON | AUTO/MAN PUSHBUTTONS ON MASTER DISPLAY IN "AUTO" POSITION AND "EPP ENABLE" DIP SWITCH ON | AUTO/MAN PUSHBUTTONS ON MASTER DISPLAY IN "AUTO" POSITION AND NO OTHER AUTOMATIC MODE SELECTED |
| CONTROL VOLTAGE SOURCE | MASTER DISPLAY OPERATOR POWER DIAL | PRESET LEVELS (1 TO 5 AND DEFAULT) BASED ON PRESET TIME INTERVALS | PRESET LEVELS (1 TO 5 AND DEFAULT) BASED ON "EVENT" DIGITAL INPUTS | PRESET SCALE FACTOR MULTIPLIED BY THE EXTERNAL CONTROL ANALOG INPUT SIGNAL |

FIG. 31

POWER SUPPLY CONTROLLER

BACKGROUND OF THE INVENTION

The field of the invention is controllers for industrial power supply systems.

High power inverting type power supplies are used for such typical industrial applications as induction heating, corona treating, and cap sealing. The inverting power supply system first rectifies the incoming AC supply voltage to Direct Current (DC). Switching elements, for example silicon controlled rectifiers (SCR's), are then used to switch energy from the DC bus into a tank circuit which is tuned to a resonant frequency, usually much higher than the input line frequency.

The control systems used for controlling such inverter power supplies provide basic control over the operating power level of the inverter power supply and some limited instrumentation to indicate basic operational quantities such as, for example, the input voltage, the output voltage, the output frequency, etc. Only a few of such quantities are displayed since each one requires a dedicated meter. To display a large number of operational quantities requires many dedicated meters, which increases the cost and panel space required for the system. When a problem develops with the inverter power supplies, maintenance must be performed on site due to their large size. This usually involves travel by a technician from the power supply manufacturer to the site of the failed power supply. Then, test equipment must be connected to the power supply to obtain diagnostic signals to identify the cause of the malfunction. One of the most useful diagnostic signals is the switching waveform signal produced across the switching elements. The most common practice is to connect an oscilloscope to the switching waveform signal so that timing measurements may be obtained.

Other points within the power supply too may need to be monitored, and other tests may need to be performed to determine the cause of the malfunction. For example, the technician may need to test the switching elements or SCR's, to determine if any of them are shorted. This task also requires connection of special test equipment to the power supply.

In short, diagnosing a faulty power supply has been a time consuming task requiring on site maintenance with sophisticated test equipment.

SUMMARY OF THE INVENTION

One aspect of the present invention is to provide a control system which provides a greater degree of operator control over the power supply. As a tool for operational control, a control system of this invention includes input means for measuring one or more operational signals from within the inverter power supply. The input means then produces at least one operational value based on the operational signals measured.

The control system includes controller means which calculates a set of operational information elements according to predetermined formulas applied to the operational values received from the input means. A display means is connected to the controller means for displaying the operational information elements calculated by the controller means.

The display means includes a visual indicating means, at least one portion of which is reserved to display many different operational information elements on a time slice basis. Each operational information element is displayed in the time slice portion for a fixed, predetermined period of time, and then the time slice portion is changed to display a different operational information element.

One object of the present invention is to provide the display of many different operational information elements without requiring a large number of fixed discrete meters. The time slice portion of the display means is able to present, on a cyclical basis, many operational information elements one at a time.

The controller means may include selection means for designating a selected subset of the operational information elements to be displayed. An operator may thereby select only those operational information elements of interest to be displayed in the time slice portion of the display means.

Another object of the invention is to provide a graphical representation of the operational values. The visual indicating means of the display means is capable of presenting data in graphical form, and represents each of the operational information elements by simulating a bar graph meter on the graphical display.

Another object of the invention is to allow the operational information elements maintained by the controller means to be interrogated by an external source. The controller means includes an interface for connection to the external source. The external source may comprise, for example, a Personal Computer (PC) system. The external source may then interrogate any of the operational information elements maintained by the controller. The interface to the external source may also include a modem and an interface to a telephone circuit to allow the interrogations to be performed remotely.

Another aspect of the invention is to provide automatic control modes which allow the operating power level of the power supply to be controlled automatically. The controller means includes automatic mode control means for varying the operating power level of the power supply based on either a Timed Power Profile (TPP), an Event Power Profile (EPP), or an External Control analog input signal.

The Timed Power Profile is a table maintained in the controller means comprising a set of one or more pairs of values. Each pair of values includes a time value and a corresponding power level value. In this automatic control mode, the automatic mode control means includes a clock means for keeping a current time. When the current time is equal to a time value from the Timed Power Profile, then the automatic mode control means sets the operating power level of the inverter power supply to the power level value corresponding to the time value which is equal to the current time.

One object of the TPP automatic mode is to allow the power supply to be operated automatically in applications which require differing power levels over time. This is a typical application, for example, in annealing, where a high power level may be applied for a short time to heat a sample to be treated, followed by a series of lower power levels for longer periods of time to slowly cool the sample.

In the EPP automatic control mode, the automatic mode control means includes input means for receiving one or more event inputs. The Event Power Profile is a table comprising a set of power level values, with one power level value corresponding to each event input. The automatic mode control means determines the operating power level by monitoring the event inputs and selecting a power level value from the Event Power Profile table based on which event inputs are activated. The operating power level of the power supply is then set to the selected power level value.

The External Control automatic mode allows the power level of the power supply 2 to track the External Control analog input. The automatic mode control means includes input means for receiving the External Control analog input signal from an external source. The automatic mode control means also includes calculation means for setting the operating power level to a power level value based on the External Control analog input signal.

Another aspect of the invention is provide a control system for a power supply which functions as a diagnostic tool. The input means measures one or more diagnostic signals from within the power supply. The input means then produces one or more diagnostic values based on the operational signals measured.

The control system includes controller means which calculates a set of diagnostic information elements according to predetermined formulas applied to the diagnostic values received from the input means. A display means is connected to the controller means for displaying the diagnostic information elements calculated by the controller means.

The display means includes a visual indicating means, at least one portion of which is reserved to display many different diagnostic information elements on a time slice basis. Each diagnostic information element is displayed in the time slice portion for a fixed, predetermined period of time, and then the time slice portion is changed to display a different diagnostic information element.

An object of this invention is to allow many different diagnostic values to be displayed. By utilizing a time slice portion on the visual indicating means to display the diagnostic information elements, many different diagnostic information elements may be cycled through the time slice portion on a periodic basis.

The controller means may include selection means for designating a selected subset of the diagnostic information elements to be displayed in the time slice portion so that only the selected diagnostic values are displayed in the time slice portion of the display means.

Another object of the invention is to provide diagnostic information descriptive of the switching waveform of the power supply. One of the diagnostic signals connected to the input means may be a switching waveform signal from the power supply. The diagnostic values produced by the input means then includes a set of waveform characteristic values, which represent several key characteristic values of the switching waveform.

An important object of this invention is to provide reduced maintenance time by furnishing detailed diagnostic information without the use of external test equipment. The set of waveform characteristic values may include one or more of the values: commutation time (TK), turn off time (TOT), switching frequency, positive peak voltage, and negative peak voltage of the switching waveform. These characteristic values are extremely valuable in analyzing the performance of a power supply and are provided automatically as a part of this invention.

Still another object of this invention is to provide a capability for an external source to interrogate the diagnostic information elements maintained by the controller means. The controller means may include terminal interface means to allow connection of an external source to obtain the diagnostic information elements. The terminal interface may include a modem and an interface to a telephone circuit to allow the interrogations to be performed remotely. The capability to interrogate the diagnostic information elements remotely is especially beneficial, as it allows a maintenance technician to obtain the diagnostic information without having to travel to the site of the power supply.

Another object of the invention is to provide a flexible capability for monitoring diagnostic points within the power supply. The control system may include a remote input means connected to the controller means by a serial communication interface. The remote input means may thereby be located inside the power supply to monitor diagnostic points of interest and transmit their values serially back to the controller means. The controller means then includes a Remote Input Configuration Table which is capable of defining for each remote input, a text message to be displayed if the remote input is activated.

Yet another object of the invention is to provide a historical account of the activity on the remote inputs. The controller means may include a history table which is maintained in a nonvolatile memory. The activation of each remote input triggers an entry into the history table, thereby maintaining a diagnostic record of all remote input activations.

Another object of the invention is to allow each remote input to be configured with a type identifier which determines the response to be taken by the controller upon activation of the remote input.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 1B is a table of the dip switch assignments for the control system of FIG. 1;

FIG. 4C is a detailed map of the meter configuration table section of the EEPROM map of FIG. 4B;

FIG. 4D is a detailed map of the remote input configuration table section of the EEPROM map of FIG. 4B;

FIG. 4E is a detailed map of the history table section of the EEPROM map of FIG. 4B;

FIG. 31 is a table illustrating the control modes provided by the control system of FIG. 1;

GENERAL DESCRIPTION OF THE INVENTION

Figure 1:
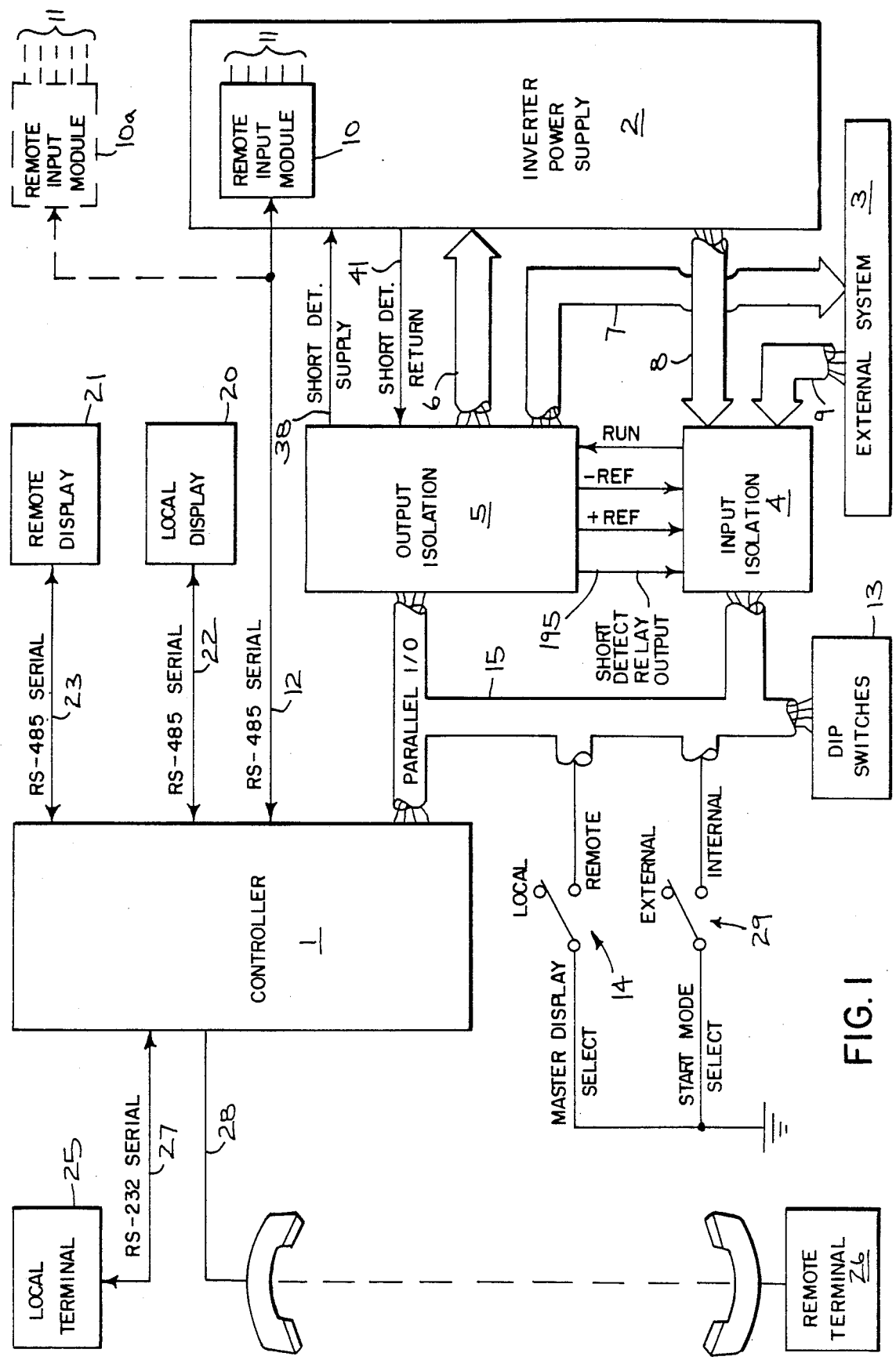
FIG. 1 is a block diagram of a control system of the present invention connected to an inverter power supply.

Referring to FIG. 1, a controller 1 is interfaced to an inverter type industrial power supply 2 and an external system 3 through an input isolation circuit 4 and an output isolation circuit 5. The input and output isolation circuits 4 and 5 provide electrical isolation for the controller 1 through the use of separate isolated power supplies (not shown) and optical isolators. The input and output isolation circuits 4 and 5 connect to the controller 1 through parallel I/O lines 15.

The external system 3 represents a typical control system for carrying out an industrial process that involves the use of the inverter power supply 2. Examples of such systems include induction heating systems, corona treating systems, and cap sealing systems. In those systems, the power supply 2 provides the high power needed for the applicable utilization equipment, for example, induction coils or corona electrodes, while the external system 3 provides for other functions in the process, for example, material handling and supervisory reporting.

The output isolation circuit 5 provides the necessary analog and digital signals 6 to command the power supply 2 to operate and provides the external system 3 with digital outputs 7 to indicate the current operational status of the controller 1. The input isolation circuit 4 monitors a set of analog and digital inputs 8 from the power supply 2. The inputs 8 include both operational and diagnostic signals.

The input isolation circuit 5 also receives a set of analog and digital inputs 9 from the external system 3. The inputs 9 are used by the controller 1 to implement several special operational features that are responsive to the external system 3.

The parallel I/O lines 15 also connect to a bank of dip switches 13. The dip switches 13 are used to set various options for the operation of the controller 1.

The controller 1 also interfaces to a local display 20 and a remote display 21 over RS-485 serial communications links 22 and 23, respectively. Displays 20 and 21 are used to provide operator control and to display certain operational and diagnostic information which is described in detail below. The displays 20 and 21 are identical to each other in construction. Each display 20 and 21 contains the switches and controls necessary for operator input and a display screen for displaying operational and diagnostic information to the operator.

Although the displays 20 and 21 may be placed anywhere within the range of the communications links 22 and 23, the local display 20 is usually located near the power supply 2, and preferably, may be mounted onto the power supply cabinet (not shown). The remote display 21 may be located at an auxiliary control point such as, for example, a control console (not shown) for the external system 3.

A master display select switch 14 connects to one input of parallel I/O 15 and is used to select either the local display 20 or the remote display 21 as the active operator control device, designated herein as the "master display". Whichever display is not selected as the master display is termed the "slave display". The slave display receives the same operational and diagnostics information as the master display. However, control inputs other than STOP and ALARM SILENCE are accepted only from the master display. The STOP and ALARM SILENCE inputs are always accepted from either display 20 or 21 for safety purposes.

A remote input module 10 is located inside the cabinet of the power supply 2 and provides additional digital remote inputs 11. The inputs 11 may then be connected to diagnostic points such as, for example, temperature, pressure, or limit switches within the power supply 2. The values corresponding to the inputs 11 are periodically transmitted from the remote input module 10 to the controller 1 over an RS-485 serial communications link 12. One or more additional remote input modules 10a may be added to the communications link 12 and located as necessary to monitor other diagnostic points of interest.

A log of all activity of the remote inputs 11 in the form of a history table is maintained by the controller 1 in nonvolatile memory. Each time a remote input 11 becomes active, the controller 1 makes an entry into the history table. An arbitrary maximum of 2,000 events are recorded in a circular fashion. The history table thus records the latest 2,000 events triggered by a remote input 11 becoming active. Each history table entry contains the identity of the remote input 11 which triggered the entry and other pertinent information at the time the event took place.

The remote inputs 11 are used to detect faults within the inverter power supply 2. Each remote input 11 is a highly flexible, general purpose input which may be assigned, or configured, with the following attributes:

A. TYPE.

Each bit of the remote inputs 11 is assigned, or configured, to be one of three types corresponding to the level of severity: ALARM, INDICATOR, or MONITOR.

1. ALARM:

An ALARM bit is used for a serious fault within the power supply 2. If an ALARM bit becomes active, the power supply 2 is stopped immediately, the event is recorded in the history table, a fault message is displayed on the displays 20 and 21, and an audible alarm is sounded at the displays 20 and 21.

2. INDICATOR:

An INDICATOR bit is used for a condition of interest which is not fatal. If an INDICATOR bit becomes active, the event is recorded in the history table and a fault message is displayed on the displays 20 and 21, but the power supply 2 is not stopped and the alarm is not sounded.

3. MONITOR:

A MONITOR bit is used only to trigger history table entries for conditions which do not need to be displayed. If a MONITOR bit becomes active, an entry is made into the history table only; the power supply 2 is not stopped and no message is sent to the displays 20 and 21.

B. POLARITY

The POLARITY attribute indicates which logic level represents the active state (HIGH or LOW). This allows signals of either polarity in the inverter power supply 2 to be used.

C. FAULT MESSAGE TEXT

Each remote input 11 may be configured with up to 20 characters of text to define the FAULT MESSAGE TEXT to be displayed on the displays 20 and 21 for ALARM and INDICATOR type remote inputs 11. The text of these messages can be configured to contain a message pertinent to the associated remote input 11. For example, a message of "WATER TEMP HIGH" may be used for a remote input connected to a temperature switch (not shown) for coolant in the inverter power supply 2.

D. VOICE MESSAGE

The displays 20 and 21 also contain a voice synthesizer and a set of fixed voice messages. Voice messages are used only for ALARM or INDICATOR bits. If an ALARM or INDICATOR bit becomes active, the displays 20 and 21 speak the designated voice message.

There is an arbitrary maximum of 64 remote inputs 11 accommodated by this embodiment. A Remote Input Configuration Table is maintained by the controller 1 which defines the above attributes for each of the 64 possible remote inputs 11.

When a remote input becomes active, the displays 20 and 21 display the text associated with the indicated remote input 11, sound an alarm if an ALARM type is indicated, and speak the associated voice message. The remote inputs 11 thereby provide a highly flexible diagnostic capability that provides audible and visual indications of faults and a permanent record of such faults in the history table.

The controller 1 also communicates with a local terminal 25 and a remote terminal 26. The terminals 25 and 26 in this embodiment are Personal Computer (PC) systems, with the PC preferred being an IBM PC-XT. The local terminal 25 is usually located on the same premises with the controller 1 and power supply 2, and communicates with the controller 1 over an RS-232 serial communications link 27. The remote terminal 26 connects to the controller 1 through a standard telephone line 28 and so may be located essentially anywhere in the world.

Both of the terminals 25 and 26 function identically to perform three main functions. Those functions are (1) to interrogate and set any of several configuration variables within the controller 1, (2) to obtain operational information from the controller 1, and (3) to obtain diagnostics information from the controller 1.

The local terminal 25 allows these functions to be performed on site, while the remote terminal 26, by virtue of its ability to connect to the controller 1 over a telephone line, allows these functions to be performed from another city, state, or even country as long as telephone service exists.

This ability of the remote terminal 26 is especially useful for remote troubleshooting of the power supply 2 by expert technicians at the power supply manufacturer's factory without having to travel to the physical site of a faulty power supply 2. In many cases, because of the detailed diagnostics information available in the controller 1 of this invention, the cause of a malfunction can be determined by the factory technicians over the remote terminal 26. Service personnel at the site of the faulty power supply 2 can then be directed to effect the necessary repairs. By reducing the need for the factory technicians to travel to the site of a faulty power supply 2, the cost of maintenance is reduced and, more importantly, the afflicted power supply 2 can be placed back on-line in a greatly reduced period of time.

As will become evident from the descriptions below, the controller 1 of this invention is highly flexible in that many different variables may be configured to suit a particular application. The values of these configured variables are maintained by the controller 1 in a writable, nonvolatile memory. The terminals 25 and 26 provide a means to interrogate nd alter any of these configured variables.

Also as explained below, the controller 1 maintains status, operational, and diagnostic information concerning the operation of the power supply 2. While this information is available at the displays 20 and 21, it may also be obtained from the terminals 25 and 26 by interrogating the controller 1. The controller I performs the following three main functions:

1. Operational Control over the power supply 2,
2. Collection and Display of Operational Information from the power supply 2, and
3. Collection and Display of diagnostic information from the inverter power supply 2.

Figure 3:
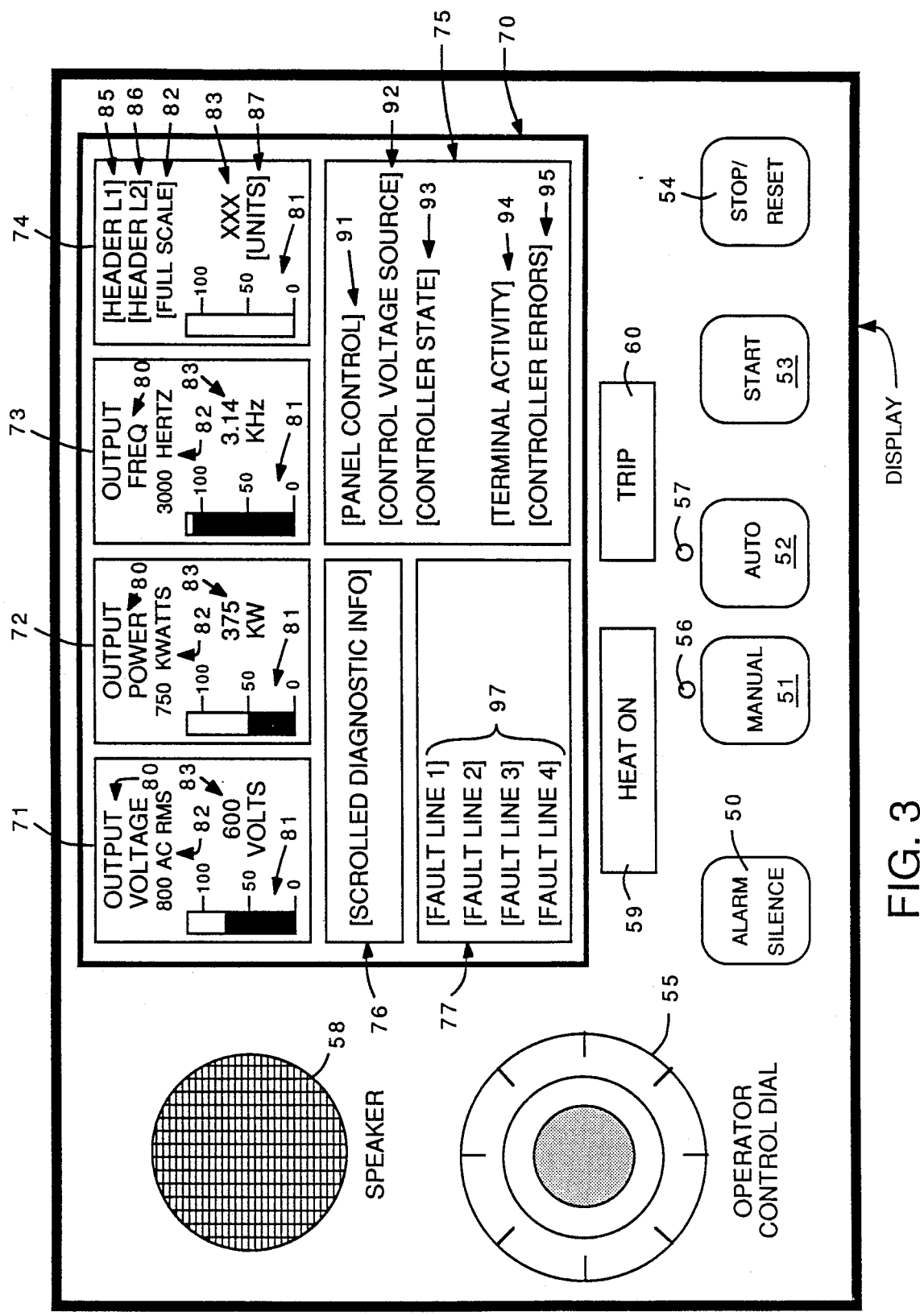
FIG. 3 is a pictorial diagram of the displays used in the control system of FIG. 1, showing the normal operational screen format.

The operator interface for these functions is provided by the displays 20 and 21. The role of the displays in providing operator inputs and displaying information is now described in relating to FIG. 3. FIG. 3 illustrates a display that is understood to represent either the local display 20 or remote display 21.

1. Operational Control

Manual controls for operator input are located in the displays 20 and 21, and include a set of membrane type pushbutton switches 50–54 and an operator control dial 55. These controls 50–55 are scanned in the displays 20 and 21 and the values of their settings are periodically transmitted to the controller 1. The controller 1 then uses these control inputs from the display designated as the master display to determine the operating state for the controller 1.

The MANUAL push-button switch 51 is used to put the controller 1 into a manual mode of operation. In the manual mode, the operating power level of the power supply 2 is determined by the setting of the operator power dial 55. In addition to the manual mode, the controller 1 of this invention provides several automatic modes of operation for the power supply 2 which were not possible with prior manual power supply controls.

The automatic modes allow the power level of the power supply 2 to be automatically varied either by time or in response to certain analog or digital input signals 8 from the external system 3. The AUTO pushbutton switch 52 is used to put the controller 1 into one of the automatic modes. The specific automatic mode to be used is determined by the settings of several of the dip switches 13 assigned for that purpose.

Light Emitting Diode (LED) indicators 56 and 57 are placed above the MANUAL and AUTO push-buttons 51 and 52 respectively, one of which being illuminated to indicate the currently active mode.

Referring to FIGS. 1 and 3 there are four different automatic modes provided by this invention which operate as follows:

A. Event Power Profile (EPP) Execute Mode

An Event Power Profile Table is configured the nonvolatile memory of the controller I. There are five digital EVENT INPUTS 325 included in the inputs 9 from the external system 3. The Event Power Profile Table contains six values of operating power level, five of which correspond to the five EVENT inputs 325, with the remaining value being a default value.

The Event Power Profile Table can be re-configured, e.g. reprogrammed, from the terminals 25 or 26, or from the master display. In the latter case, the power supply 2 is stopped and the re-programming is performed in a special off-line process called EPP Programming.

The Event Power Profile is executed in an Event Power Profile Execute mode. In the EPP Execute mode, the operating power level of the power supply 2 is determined by the states of the EVENT INPUTS 325. The value from the Event Power Profile corresponding to the most recently activated EVENT input is used to set the operating power level for as long as that EVENT input remains active, or until a new EVENT input becomes active. If no EVENT INPUTS 325 are active, the default value is used.

The EPP Execute mode is enabled by setting one of the dip switches 13 assigned for that purpose.

B. Timed Power Profile (TPP) Mode

A Timed Power Profile Table is configured in the nonvolatile memory of the controller 1. The Timed Power Profile Table contains five time increment values along with five corresponding values of operating power level. The Timed Power Profile Table can be re-programmed in an off-line process called TPP Programming.

The Timed Power Profile is executed in a Timed Power Profile Execute mode. In the TPP Execute mode, when the power supply 2 is started the operating power level is set to the value from the Timed Power Profile Table associated with the first time increment, and a timer is started. When the first time increment has elapsed, the operating power level is set to the value from the Timed Power Profile Table corresponding to the second time increment, and the timer is reset to time this second increment. This process continues through the third, fourth, and fifth time increments. After the fifth time increment, the power level is returned to zero.

One of the input signals 9 from the external system 3 is a TPP Reset input which, when activated, causes the Timed Power Profile Execute process to be restarted over again from the first time increment. The TPP Execute process may also be re-started by manually stopping and re-starting the power supply 2. The TPP Execute mode is enabled by setting one of the dip switches 13 assigned for that purpose.

C. External Control Mode

An EXTERNAL CONTROL analog input signal is included as one of the inputs 9 from the external system 3. In the External Control mode, the EXTERNAL CONTROL analog signal is used to set the operating power level for the power supply 2. The External Control mode is enabled if automatic operation is selected by the master display and no other automatic mode is selected by the dip switches 13.

Still referring to FIGS. 1 and 3, the START push-button switch 53 and the STOP/RESET push-button switch 54 normally function to start and stop the power supply 2, respectively. The controller 1 also provides an External Start mode for automatically starting the power supply 2. External Starting is selected by a START MODE SELECT toggle switch 29. One of the inputs 9 from the external system 3 is an EXTERNAL START digital input. If the START MODE SELECT toggle switch 29 is in the EXTERNAL position, pressing the START push-button 43 puts the controller 1 into a POWER READY state. Then, when the EXTERNAL START digital input becomes true, the power supply 2 is started.

Referring again to FIG. 3, the displays 20 and 21 also include a speaker 58 which is provided for audio output comprised of synthesized voice messages or a loud tone alarm. The ALARM SILENCE push-button switch 50 acts to cancel the alarm tone in the speaker 58.

A pair of back illuminated indicators 59 and 60 are provided for "HEAT ON" and "TRIP ∞ indications of the respective conditions in the power supply 2.

In prior power supply controls, the indicators used were typically fixed discrete meters for displaying basic operational values such as output voltage, output power, and output frequency. Because of the large size and cost of these meters, the number of operational quantities which could be displayed was somewhat limited.

Referring to FIG. 3, the displays 20 and 21 in this invention utilize a display panel 70 to display operational values, thereby replacing the prior discrete fixed meters. The display panel 70 is an electro-luminescent panel capable of displaying graphical or textual data.

Figure 3A:
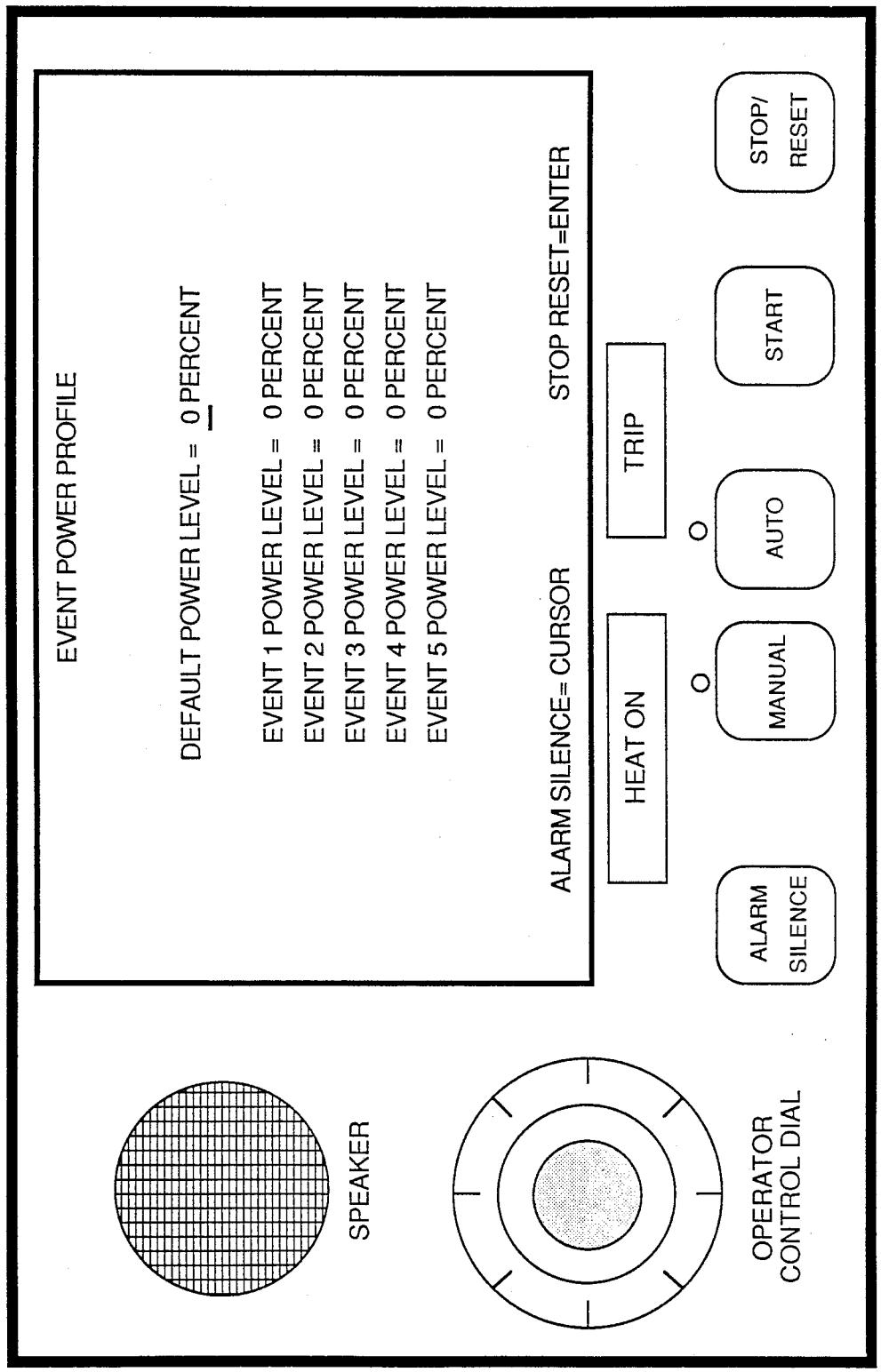
FIG. 3A is a pictorial diagram of the display of FIG. 3 showing the Event Power Profile (EPP) programming screen format.
Figure 3B:
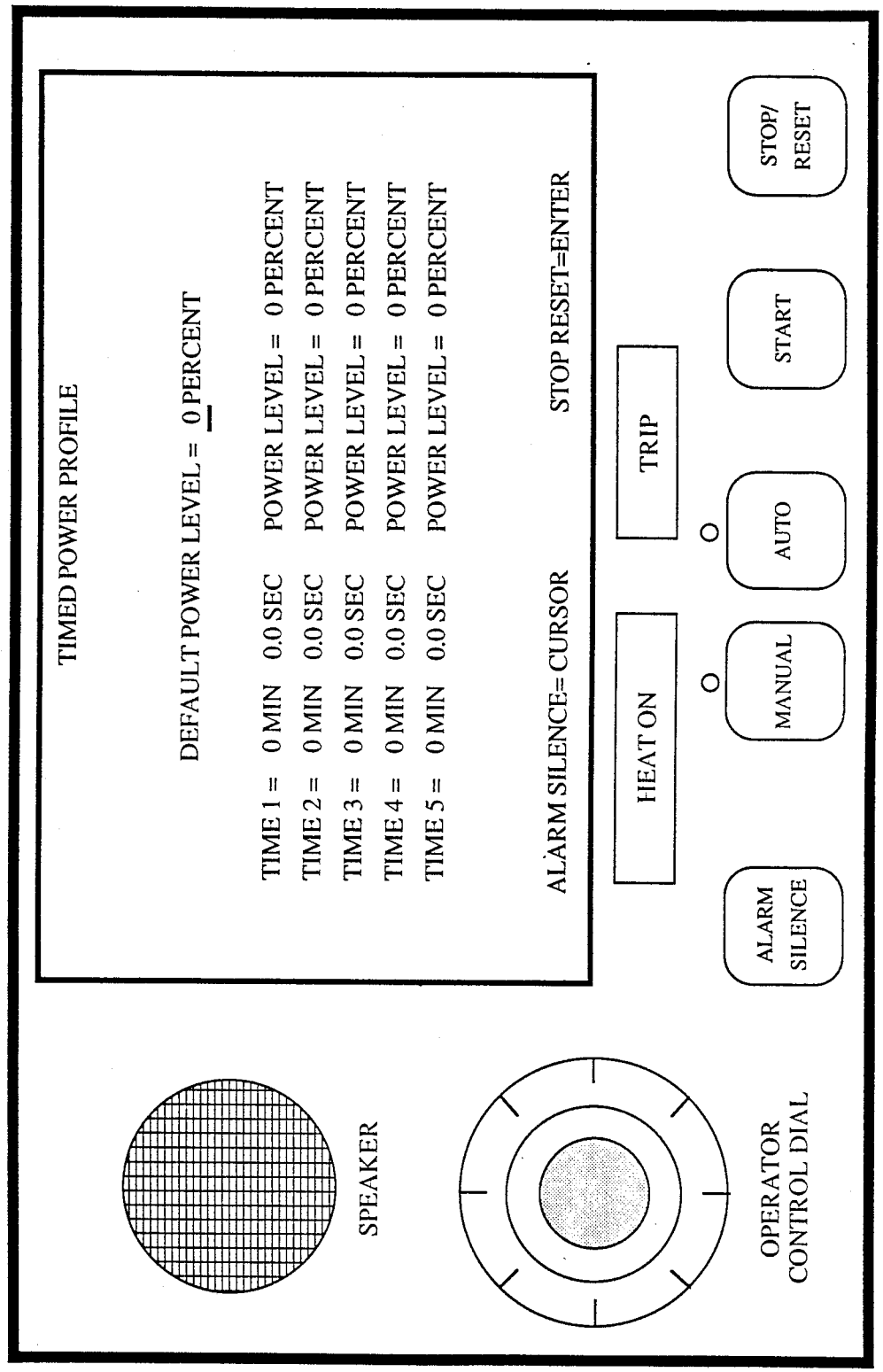
FIG. 3B is a pictorial diagram of the display of FIG. 3 showing the Timed Power Profile (TPP) programming screen format.

The panel 70 as used in this embodiment can be changed to display three different formats: a normal format, as depicted in FIG. 3; an EPP programming format, as depicted in FIG. 3A; and a TPP programming format, as depicted in FIG. 3B. These latter two programming formats are used to allow the operator to configure the Time Power Profile and Event Power Profile, and are described in detail below.

In the normal format (FIG. 3), the display panel 70 is divided into a number of separate areas, or windows 71-77. Each window 71-77 displays a particular type of information. Specifically, the normal format includes four meter windows 71-74, a status window 75, a diagnostic information window 76 and a fault window 77.

The meter windows 71-74 are described below in relation to the Collection and Display of Operational Information. The diagnostic information window 76 and the fault window 77 are described below in relation to the Collection and Display of Diagnostic Information. The Status window 75 is used for display of the current operational status of the controller 1.

The four meter windows 71-74 replace the discrete fixed meters used in prior controls and are used to display the values of operational information elements maintained by the controller 1. The first three meter windows 71-73 are dedicated to displaying, respectively, output voltage, output power and output frequency, the basic operational quantities for the power supply 2. Two lines of text 80 centered at the top of each window 71-73 display the title of the operational information element being displayed in that window 71-73.

The display panel 70 is a graphics oriented display, capable of presenting both text and graphics information. Within each window 71-73 there is drawn a bar graph 81 labeled with indicia for "0", "50" and "100", corresponding to a percentage reading for the current level of the operational information element being displayed. For each operational information element being displayed, a full scale value 82 is displayed, indicating the value which corresponds to a 100% reading.

The full scale value display 82 is configurable in the controller 1 to allow the full scale value to be defined appropriately. The ability of this invention to change, or configure, the full scale values of operational information elements is highly advantageous, since in prior systems, to change the range of a meter would require physically replacing one discrete meter with another.

A line of text 82 indicating the full scale value is displayed in each window 71-73 just below the title. The current value of each operational information element is expressed as a percentage of the full scale value by filling in each bar graph 81 to the appropriate height. The current value is also separately listed as a numerical value on two text lines 83 next to the bar graph 81.

The number of meters used in prior controls was usually limited to the three basic operational parameters described above because of the high cost and physical space required for the fixed, discrete meters. In this invention, however, the fourth meter window 74 is used to display many additional operational information elements by a process referred to herein as "Time Slicing". In the Time Slicing approach, the fourth meter position represents a Time Slice portion of the display 70 which displays different operational information elements at different times.

Time Slicing is performed by displaying on operational information element for a period of approximately five seconds, then changing to the next operational information element, and so on. After the last operational information element has been displayed, the scrolling sequence begins again and repeats continuously. As a result, many operational information elements can be displayed on the displays 20 and 21 by scrolling different operational information elements into the fourth meter window 74.

Eight different operational information elements may be scrolled into the fourth meter window 74, which are:
1. Input Line Voltage
2. Input Line Current
3. Input Energy.
4. Output Current.
5. DC Bus Voltage.
6. DC Bus Current.
7. Output Energy.
8. General Purpose Input (GPI).

Referring to FIG. IB, the operational information elements to be displayed in the fourth meter position are each associated with one of the dip switches 13. If the dip switch 13 for any particular operational information element is set, then that operational information element is included in the scrolling sequence.

For each meter position 71-74, two header lines 85 and 6, and a UNITS field 87 are defined in the displays 20 and 21 to provide a descriptive title and unit value, respectively, for the particular operational information element being displayed. For example, when the Input Line Voltage is to be scrolled into the fourth meter window 74, the header lines 85 and 86 are replaced with the text "LINE VOLTAGE", and the UNITS field is replaced with "VOLTS".

Similarly, a FULL SCALE text 82 is assigned, or configured, for each operational information element. When an operational information element is scrolled in, its descriptive title and FULL SCALE text 82 are written into the fourth meter window 74 in their respective positions. The height of the bar chart 81 and the numerical value 83 are then set according to the latest reading of the applicable operational information element.

The General Purpose Input is a special analog input from the external system 3 which allows any arbitrary quantity to be displayed in the fourth meter window 74. Accordingly, the header lines 85 and 86 for the General Purpose Input are also configurable so that a descriptive header may be assigned.

The status window 75 displays five lines of text 91-95 which contain information about the status of the controller Status line 1 (#91) indicates which display is the master control. Either the text "PANEL CONTROL=LOCAL" or "PANEL CONTROL=REMOTE" is displayed, depending on the current setting of the master display select switch 14.

Next, status line 2 (#92) displays the source for the operating power level of the power supply 2. As discussed above, the power level may be set manually by the operator power dial 55, or automatically by one of several automatic modes. An appropriate message is placed in status line 2 (#92).

Status line 3 (#93) displays a text message indicating the current state of the controller 1. The controller state is discussed in detail later.

Status line 4 (#94) displays a text message indicating if either of the terminals 25 or 26 is active. If neither terminal 25 or 26 is active, then status line 4 (#94) is left blank.

And finally, status line 5 (#94) is reserved for displaying messages indicating internal controller errors. If no internal controller errors exist, then status line 5 (#95) is left blank.

Referring again to FIG. 3, the diagnostic information window 76 displays a single line of text which contains one of several possible diagnostic information elements. Each diagnostic information element is displayed in the diagnostic information window 76 with a numerical field embedded in the text. The text is descriptive of which diagnostic information element is being presented, while the numerical field is filled in with the current value of the associated diagnostic information element. For example, a display of the TOT Time diagnostic information element would read "SCR TOT TIME=32.5uS".

Like the fourth meter window described above, the diagnostic information elements are scrolled through the diagnostic information window 76 so that many different diagnostic information elements can be displayed.

The diagnostic information elements are therefore indicating the actual values of many highly important and crucial parameters which, prior to this invention, would have required specialized instrumentation and technical supervision to obtain. The specific items of diagnostic information collected are the B Supply Voltages (+24, +15, and −15 Volts) of the controller 1 itself, and a number of key measurements made on the switching waveform produced by the inverter section of the power supply 2. In order to describe these switching waveform measurements, the internal operation of the power supply 2 is now described.

Figure 2:
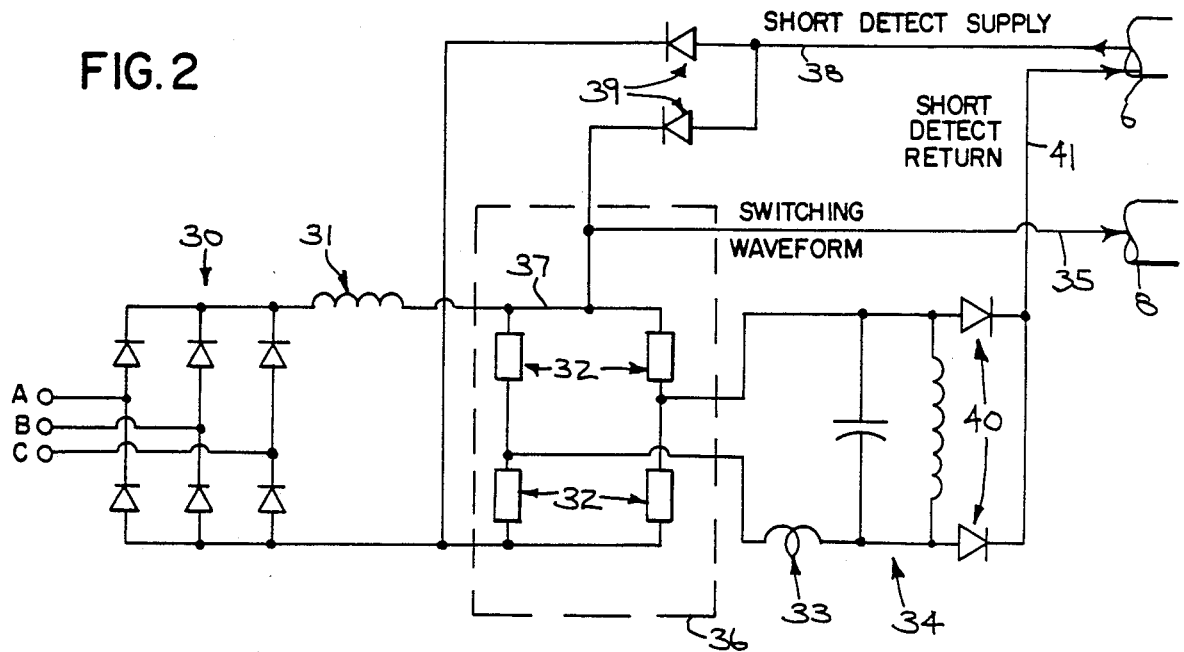
FIG. 2 is a schematic diagram of the inverter power supply showing connection of interface signals to the control system of FIG. 1.

Referring to FIG. 2, the power supply 2 includes an inverter section 36 fed by a Direct Current (DC) bus 37. The DC current for the bus 37 is derived from a rectifier circuit 30 through filter inductor 31. Four switching devices 32 comprise the inverter section 36 and are connected in a bridge configuration to drive a link inductor 33 which in turn feeds an output tank circuit 34.

The switching devices 32 are appropriately gated to generate an Alternating Current (AC) output in the tank circuit 34 which is then usually transformer coupled to applications such as, for example, induction heating, corona treating, or cap sealing. The switching devices 32 may be any type of switching device, including Silicon Controlled Rectifiers (SCRs), Gate Turn-Off devices (GTOs) or power transistors. Gating of the switching devices 32 and commutation during switching of the bridge circuit is achieved in well known fashion.

Figure 2A:
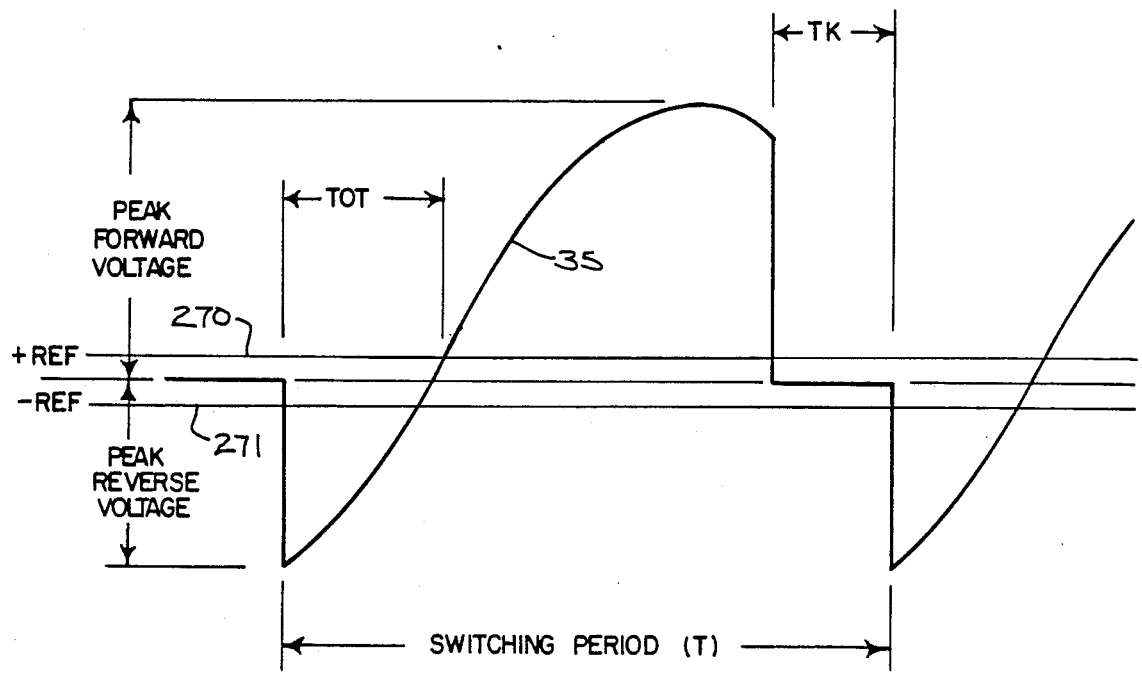
FIG. 2A is a graphical representation of the switching waveform of the inverter power supply showing the quantities measured by the control system of FIG. 1.

Referring to FIGS. 2 and 2A, a switching waveform signal 35 is tapped off the DC bus 37 and is connected as one of the analog inputs 8. The controller 1 then measures several critical parameters of this switching waveform signal 35, and the resulting switching waveform data is maintained in the controller 1. The specific quantities measured are the commutation time TK, the turn off Time TOT, the switching frequency, the peak forward voltage, and the peak reverse voltage. This switching waveform data provides an extremely detailed description of the switching waveform 35 which, prior to this invention, could only be obtained by physical measurement with an oscilloscope.

Referring to FIG. IB, the individual quantities of switching waveform data may be selected for scrolling through the diagnostic information window 76 by setting certain of the dip switches 13 assigned for that purpose. Other of the dip switches 13 are used to select scrolling of B Supply Voltage measurements. The switching waveform data may also be interrogated by the terminals 25 and 26 for monitoring or troubleshooting purposes as mentioned above.

Referring again to FIG. 3, the fault window 77 displays up to four FAULT LINEs of text. Each FAULT LINE may contain text descriptive of the associated fault. There are four general sources of faults which are detected, which include:

1. Remote Input Faults.

As described above, remote inputs 11 that are configured as ALARMS or INDICATORS result in a fault message being sent to the displays 20 and 21. The fault detection capability afforded by the configurable remote inputs 11 of this invention is an extensive and extremely flexible capability to detect faults, present that information to the operator, and take appropriate action in the controller 1.

2. SHORT TEST Faults.

Another valuable diagnostic capability of this invention is the ability to perform a SHORT TEST on the switching elements 32. Referring again to FIG. 2, whenever the power supply 2 is not running, e.g.

stopped, the controller 1 automatically enters a SHORT TEST mode. In the SHORT TEST mode, a low level DC test voltage is applied to a SHORT DETECT SUPPLY signal 38, which is one of the output signals 6. The SHORT DETECT SUPPLY signal 38 feeds the plus and minus legs of DC bus 37 through a pair of high voltage diodes 39.

When the SHORT TEST mode is disengaged, the diodes 39 do not interfere with the normal operation of the DC bus 37 because they are in a back-to-back configuration across the DC bus 37. That is, one of the diodes 39 is always reversed biased when the inverter section 36 is in operation.

When the SHORT TEST mode is engaged, however, both diodes 39 are forward biased with respect to the positive SHORT DETECT SUPPLY signal 38. A second pair of diodes 40 are connected to the interior legs of the bridge formed by the switching elements 32. The diodes 40 then feed a SHORT DETECT RETURN signal 41. As before with diodes 39, the diodes 40 appear back-to-back during operation, but are forward biased to the SHORT DETECT RETURN signal 41 in the SHORT TEST mode.

If all of the switching elements 32 are operating properly, the SHORT DETECT RETURN signal 41 is isolated from the SHORT DETECT SUPPLY signal 38. If, on the other hand, any one of the switching elements 32 is shorted, or even has excessive leakage, the SHORT DETECT SUPPLY signal 38 will be coupled through to the SHORT DETECT RETURN 41. The controller 1 is thereby able to determine the presence of a short in any switching element 32 by measuring the voltage returned on the SHORT DETECT RETURN line 41.

This test is equally effective if the switching elements 32 are composed of multiple devices which are paralleled to provide increased current capacity, as is often practiced. In that case, the SHORT TEST mode will still detect a short in any of the paralleled devices.

If the controller 1 detects a short, a SHORT DETECTED flag is set within the controller 1 and a fault message is sent to the displays 20 and 21. The fault message, when received at the displays 20 and 21, causes an alarm to be sounded and a message containing the text "SHORT DETECTED" to be displayed on one of the fault lines 97. The SHORT DETECTED flag may be interrogated by the terminals 25 and 26 for troubleshooting purposes as described above. The power supply 2 can not be started until the SHORT DETECTED flag is cleared.

3. B Supply Faults.

As described above in relation to the diagnostic information window 76, the controller monitors the B Supply voltages (+24, +15, and −15 Volts) used for operation of the controller 1 itself. The controller 1 further compares the B supply voltages with fixed high and low limits, and if any voltage deviates from its nominal value by more than 20%, a B SUPPLY FAULT flag is set and a fault message is sent to the displays 20 and 21.

The B SUPPLY FAULT fault message, when received at the displays 20 and 21, causes an alarm to be sounded and a message containing the text "B SUPPLY FAULT" to be displayed on one of the fault lines 97. The B SUPPLY FAULT flag may be interrogated by the terminals 25 and 26 for troubleshooting purposes as described above. The power supply 2 can not be started until the B SUPPLY FAULT flag is cleared 4. Line Voltage Faults.

As described above, the Input Line Voltage is one of the operational information elements which may be displayed in the fourth meter position 74. The Input Line Voltage value is also compared against a high and low limit. Since the expected variation of the Input Line Voltage depends on the supply voltages available from the serving utility, the high and low limits for the Input Line Voltage are configurable.

If the Input Line Voltage exceeds those limits, a LINE VOLTAGE FAULT flag is set and a fault message is sent to the displays 20 and 21. The LINE VOLTAGE FAULT fault message, when received at the displays 20 and 21, causes an alarm to be sounded and a message containing the text "LINE VOLTAGE FAULT" to be displayed on one of the fault lines 97. The LINE VOLTAGE FAULT flag may be interrogated by the terminals 25 and 26 for troubleshooting purposes as described above. The power supply 2 can not be started until the LINE VOLTAGE FAULT flag is cleared.

DESCRIPTION OF THE PREFERRED EMBODIMENT

Figure 4:
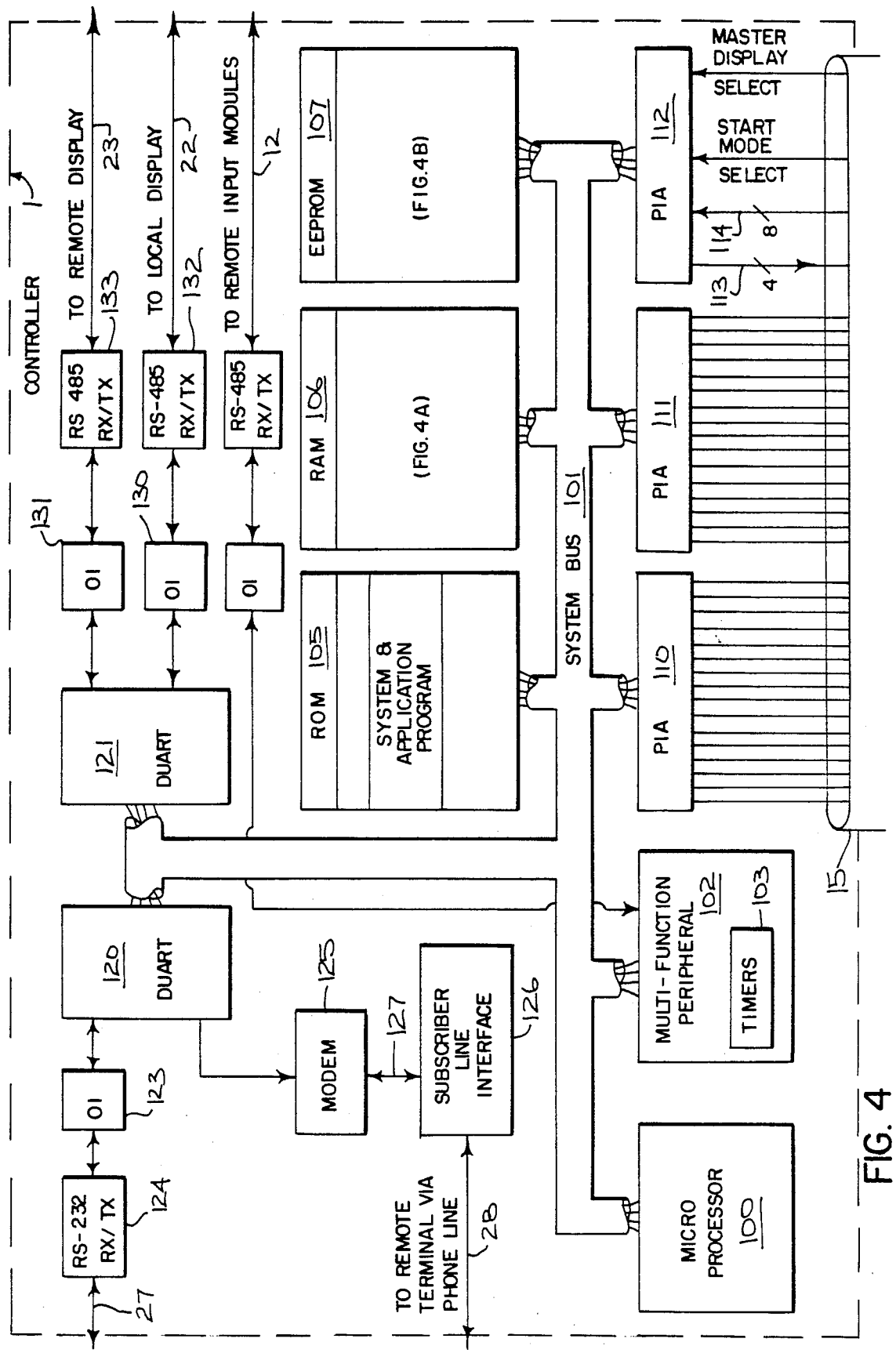
FIG. 4 is a block diagram of the controller of FIG. 1.
Figure 4A:
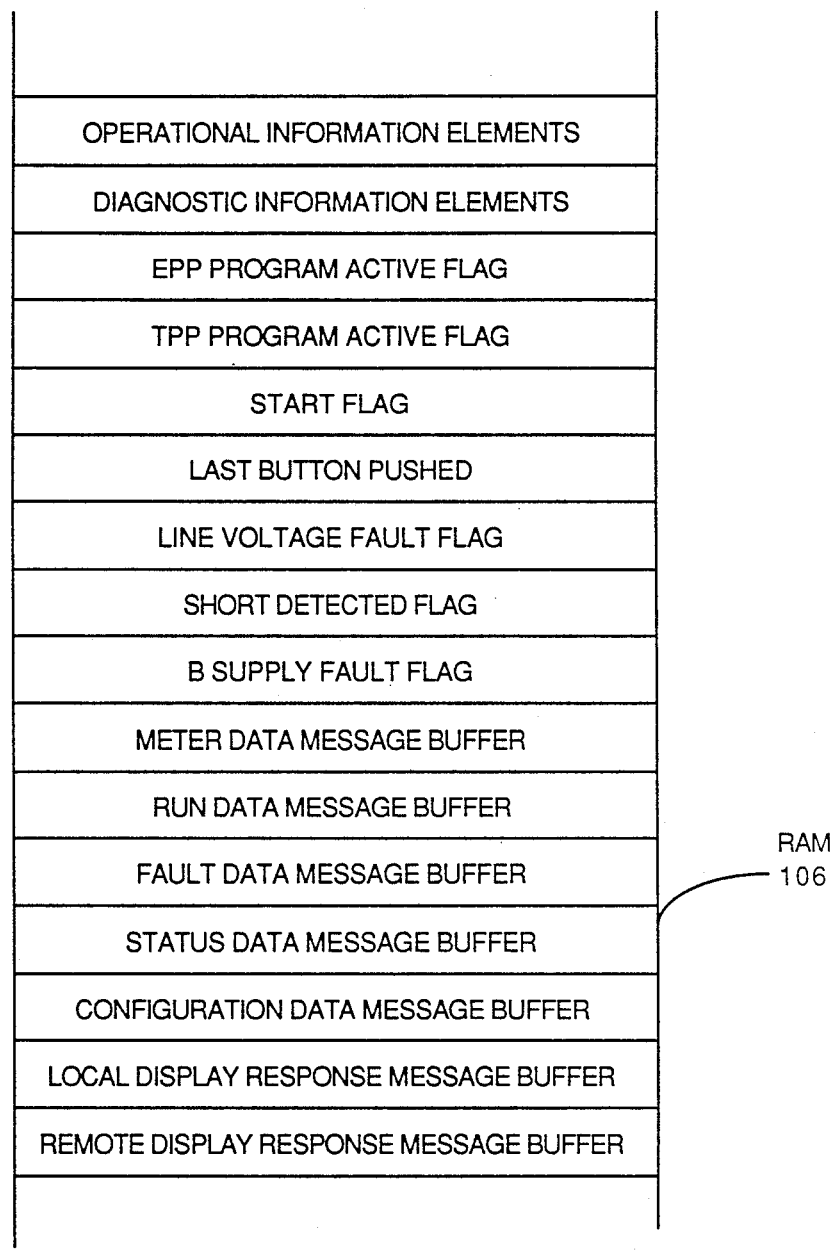
FIG. 4A is a map of the contents of the Random Access Memory (RAM) of FIG. 4.
Figure 4B:
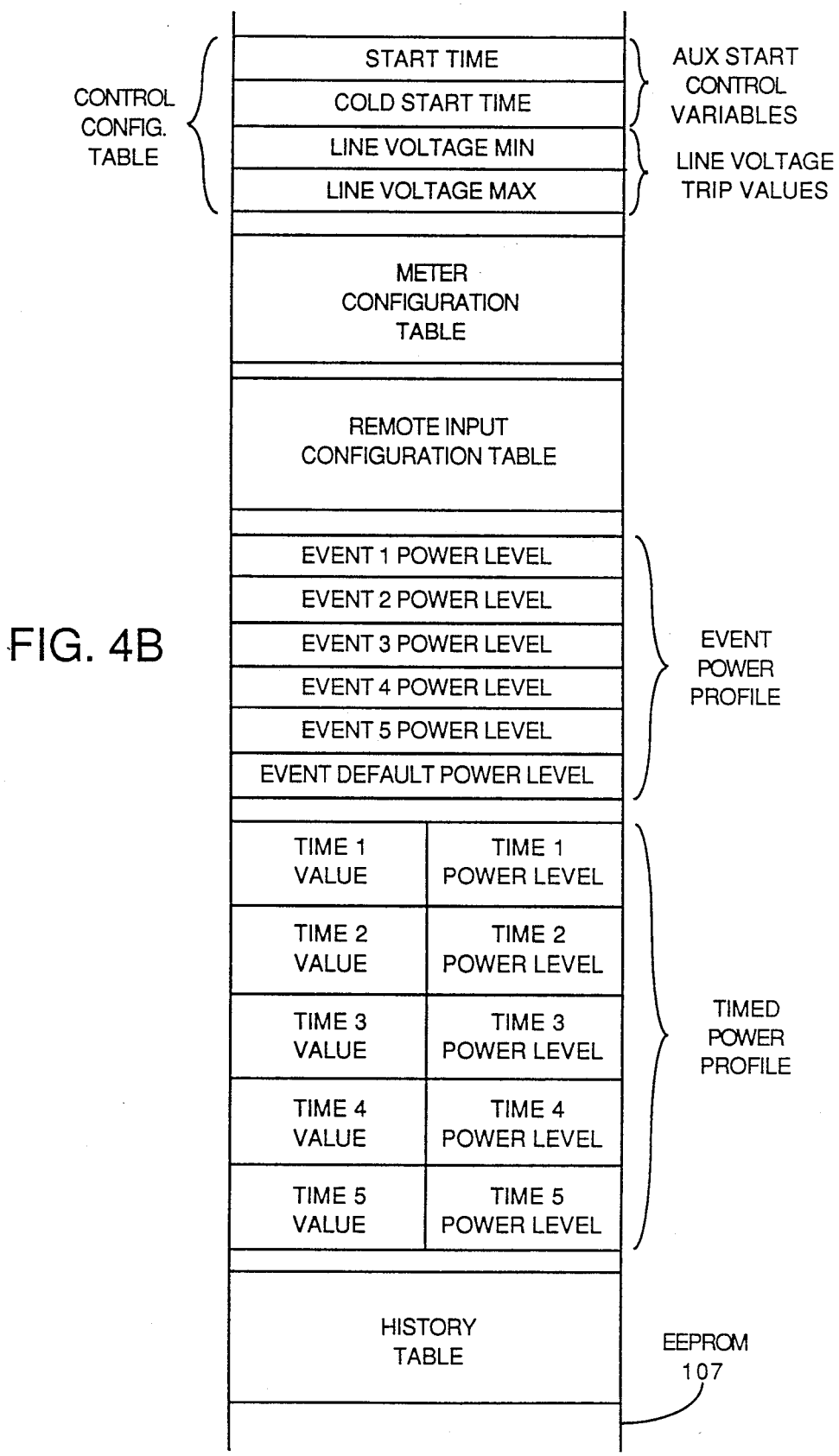
FIG. 4B is a map of the contents of the Electrically Erasable Programmable Read Only Memory (EEPROM) of FIG. 4.

Referring to FIG. 4, the controller 1 is based on a microprocessor 100. The particular microprocessor preferred for this embodiment is a Motorola MC68000 sixteen bit microprocessor. The microprocessor 100 has a system bus 101 which interconnects the microprocessor 100 with other system components. A Multi-Function Peripheral (MFP) device 102 contains three timers 103 which are used by the microprocessor 100 to perform time related functions as will be described below.

Memories connected on the system bus 101 include Read Only Memory (ROM) 105, a Random Access Memory (RAM) 106, and an Electrically Erasable Programmable Read Only Memory (EEPROM) 107.

A set of three Parallel Interface Adaptors (PIA) 110-112 are connected to the system bus 101. Each PIA 110-112 contains sixteen lines, each of which may be assigned to be either an input or an output. All sixteen lines from the three PIAs 110-112 connect to the parallel I/O bus 15.

Referring to FIGS. 1 and 4, two PIAs 110 and 111 are dedicated to performing the Input and Output (I/O) associated with the input isolation circuit 4 and output isolation circuit 5 as will be described below. PIA 112 is dedicated to performing the I/O for the master display select switch 14, the start mode select switch 29, and the dip switches 13. Two lines of the PIA 112 are set up as inputs and connected to the start mode select switch 29 and master display select switch 14.

The set of dip switches 13 contains 32 dip switches arranged in four banks of eight switches per bank, with each bank connected with diodes to form a 4×8 diode matrix. A set of four output lines 113 from PIA 112 connect to each of the four banks of the dip switches 13, one of which is energized at any one time in order to read the settings of the dip switches 13 in the associated bank. A set of eight input lines 114 on PIA 112 are connected to each bank of dip switches 13 in parallel to read the dip switch settings.

Referring again to FIG. 4, set of three Dual Universal Asynchronous Receiver Transmitter (DUART) devices 120-122 are used by the microprocessor 100 for external communications. Each DUART 120-122 provides two independent transmit and receive communication channels. DUART 120 has one channel connected through an optical isolator circuit 123 to an RS-232 receiver/transmitter circuit 124. The RS-232 receiver/transmitter 124 then connects to RS-232 serial communications line 27 for communications to the local terminal 25.

The other channel of DUART 120 is connected to a modem 125. Modem 125 in turn connects to a subscriber line interface circuit 126. The subscriber line interface circuit 126 connects to a standard telephone line 28, where a telephone connection can be established with a compatible modem (not shown) built into the remote terminal 26. The modem 125 is of the "auto-answer" type, and the interface lines 127 between the modem 125 and the subscriber line interface 126 include supervisory signals to allow the modem 125 to answer an incoming call.

DUART 121 is used for communication to the local display 20 and remote display 21. Each channel of DUART 121 connects through an optical isolator 130 and 131 to an RS-485 receiver/transmitter circuit 132 and 133, respectively. The RS-485 receiver/transmitter circuits 132 and 133 are then connected through communication lines 22 and 23 to the local display 20 and remote display 21, respectively.

Figure 5:
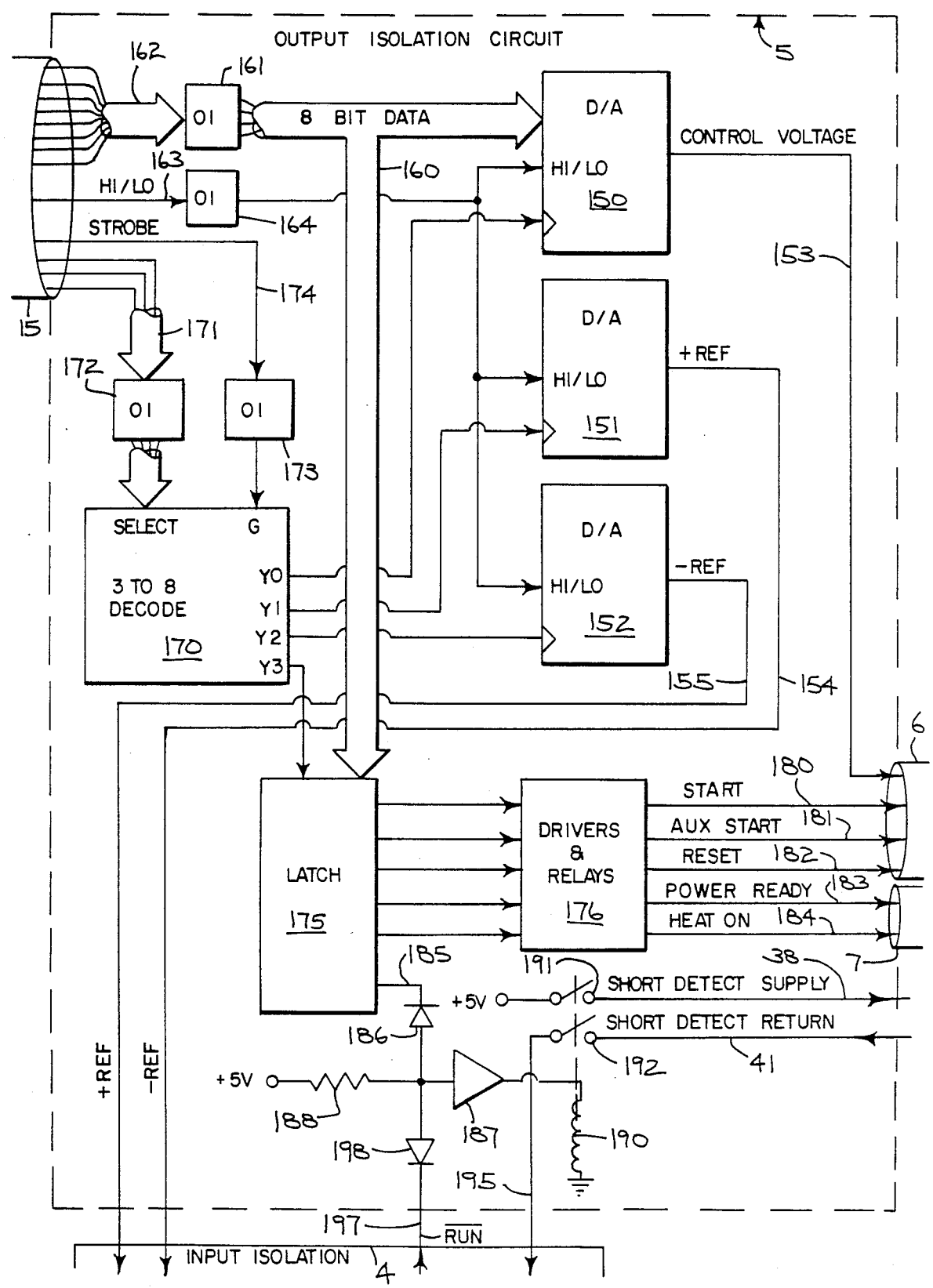
FIG. 5 is a block diagram of the output isolation circuit of FIG. 1.

Referring to FIG. 5, the output isolation circuit 5 includes three Digital to Analog (D/A) converters 150-152. D/A converter 150 produces an analog CONTROL VOLTAGE signal 153 which is connected through bus 6 to set the operating power level for the inverter power supply 2. The other two D/A converters 151 and 152 generate a pair of reference signals, one positive (+REF) 154 and one negative (−REF) 155. The reference signals 154 and 155 are connected to the input isolation circuit 4 and are used as thresholds when performing the waveform measurements on the switching waveform signal 35 as will be described below.

Data is loaded into the D/A converters 150-152 from an eight bit data bus 160, which is connected through a set of optical isolators 161 to a set of eight output lines 162 from the parallel I/O bus 15. Each of the D/A converters 150-152 is a twelve bit converter and therefore loads eight high order bits and then four low order bits into an internal buffer. A HI/LO control line 163 from the parallel I/O bus 15 is connected through an optical isolator 164 to a HI/LO input of the D/A converters 150-152 to control the loading of these high and low order bits.

Data bus 160 is also connected to a latch 175 for setting digital outputs from the output isolation circuit 5. To determine which device, either one of the D/A converters 150-152 or the latch 175, is to receive data from the bus 160, a three line to eight line decoder 170 is used. A three bit select input on decoder 170 is connected to a set of three output lines 171 from parallel I/O bus 15 through a set of optical isolators 172 A gate input (G) for the decoder 170 is connected to a strobe signal on an output line 174 from the parallel I/O bus 15 through optical isolator 173. One of the decoder outputs Y0-Y3 connects to the clock input of each of the D/A converters 150-152 and the latch 175, respectively. Data on the bus 160 is then clocked into the device selected by output lines 171 when the strobe signal 174 is activated.

Five of the outputs from latch 175 are routed through a driver and relay circuit 176. To achieve a high degree of isolation between the output isolation circuit 5 and the inverter power supply 2, the output signals from the driver and relay circuit 176 are each a pair of wires across which a set of relay contacts are either open or closed to represent off and on states, respectively. Three of these output signals are the START signal 180, the AUXILIARY START signal 181, and the RESET signal 182, all of which are connected through bus 6 to the inverter power supply 2. The use of these signals 180-182 to control the inverter power supply 2 is described below in relation to the operating software for the microprocessor 100.

The other two outputs from the driver and relay circuit 176 are the POWER READY signal 183 and the HEAT ON signal 184. These two signals 183 and 184 are connected through bus 7 to the external system 3, and are used to inform the external system 3 of the operational status of the inverter power supply 2 for system coordination purposes.

One other output 185 of latch 175 is used to enable the SHORT DETECT SUPPLY and SHORT DETECT RETURN lines 38 and 41, respectively. Output 185 connects through diode 186 to the input of a relay driver 187. The input of relay driver 187 is biased high by a resistor 188. However, when output 185 is low the diode 186 is forward biased and the input of relay driver 187 is held low. In order to engage the short detection circuitry, output 185 is raised high and resistor 188 then biases relay driver 187 on. The output of relay driver 187 connects to a relay 190.

When energized, the relay 190 pulls in a pair of contacts 191 and 192. Contact 191 connects the SHORT DETECT SUPPLY line 38 to a constant source of +5 volts. Contact 192 connects the SHORT DETECT RETURN line 41 to SHORT DETECT RELAY OUTPUT line 195. When the relay 190 is pulled in, +5 volts is applied to the SHORT DETECT SUPPLY line 38. The resulting analog return signal on the SHORT DETECT RETURN line 195 is measured by the input isolation circuit 4 to determine if any of the switching elements 32 are shorted a described above.

As a safety feature to positively prevent the relay 190 from being energized while the inverter power supply 2 is running, a RUN input 197 is connected through diode 198 to the input of relay driver 187. When the RUN input 197 is low, signifying that the inverter power supply 2 is running, the input of relay driver 187 is forced low and the relay 190 cannot be energized.

Figure 6:
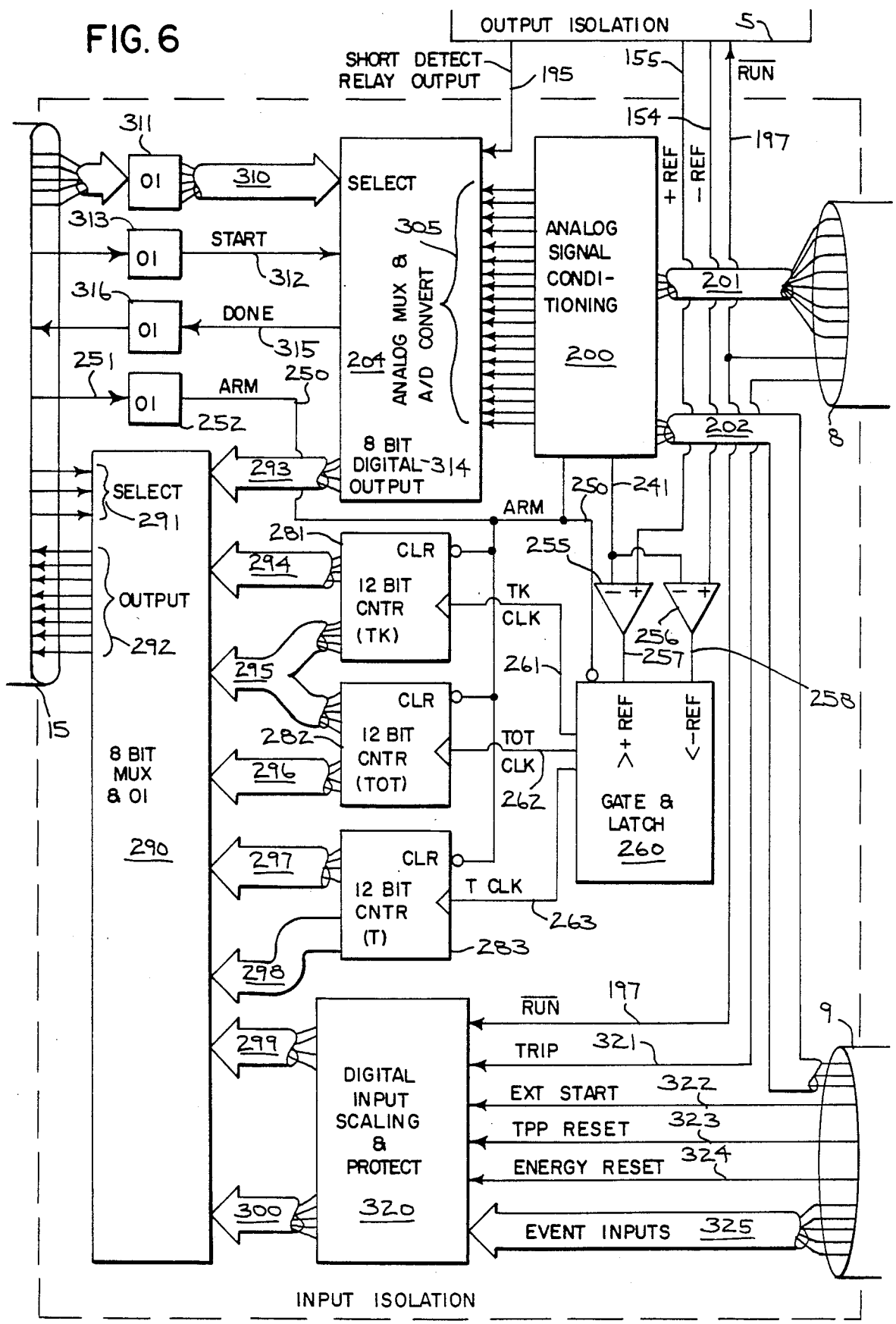
FIG. 6 is a block diagram of the input isolation circuit of the control system of FIG. 1.

Referring to FIG. 6, the input isolation circuit 4 includes an analog signal conditioning unit 200 which accepts one group of analog inputs 201 in bus 8 from the inverter power supply 2, and another group of analog inputs 202 in bus 9 from the external system 3. The analog signal conditioning unit 200 (FIG. 7) processes the raw analog inputs into a form suitable for input into an analog multiplexer and Analog to Digital (A/D) converter circuit 204, where any one of the analog inputs may be selected and converted to a digital value.

Figure 7:
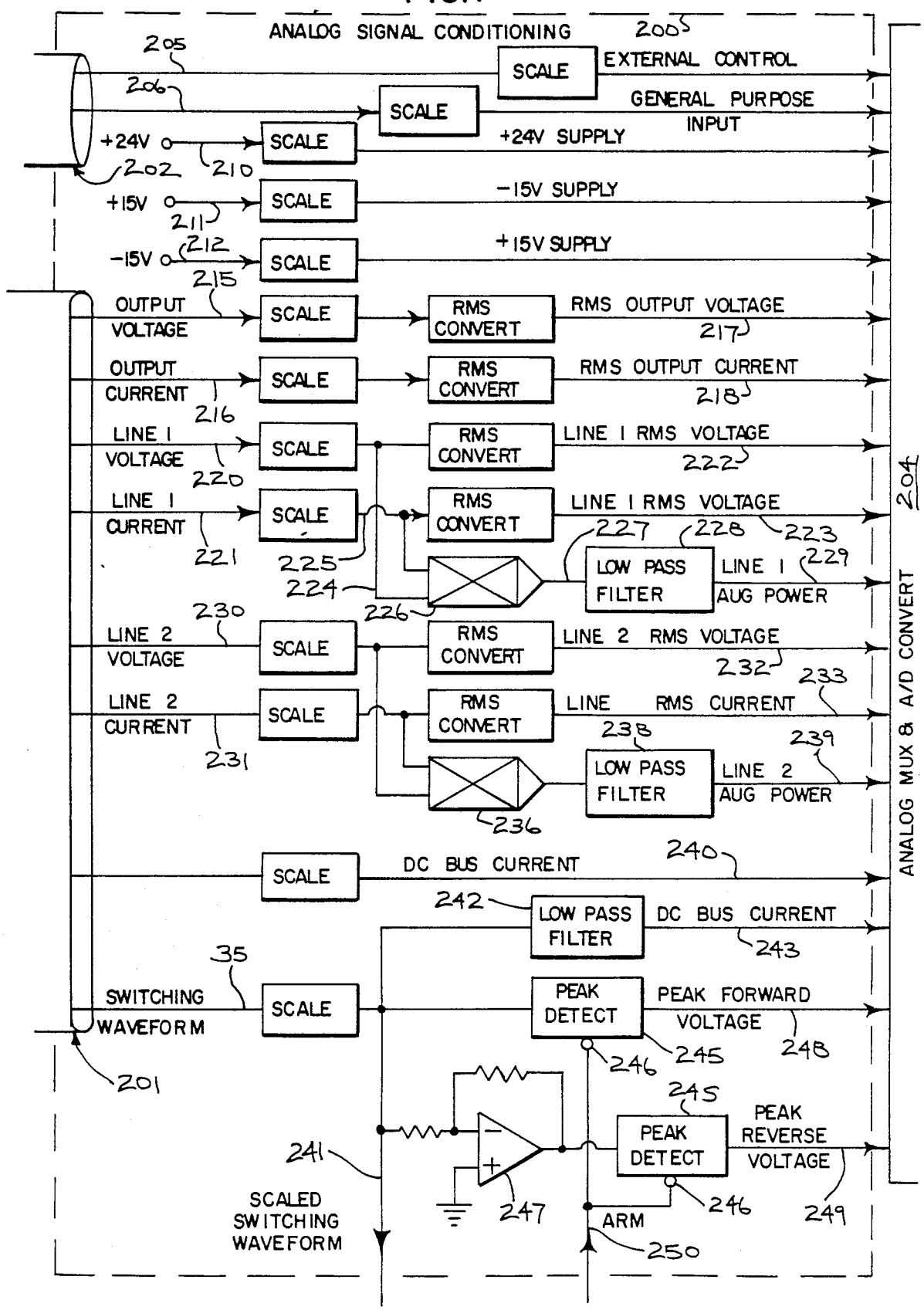
FIG. 7 is a block diagram of the analog signal conditioning circuit of the input isolation circuit of FIG. 6.
Figure 7A:
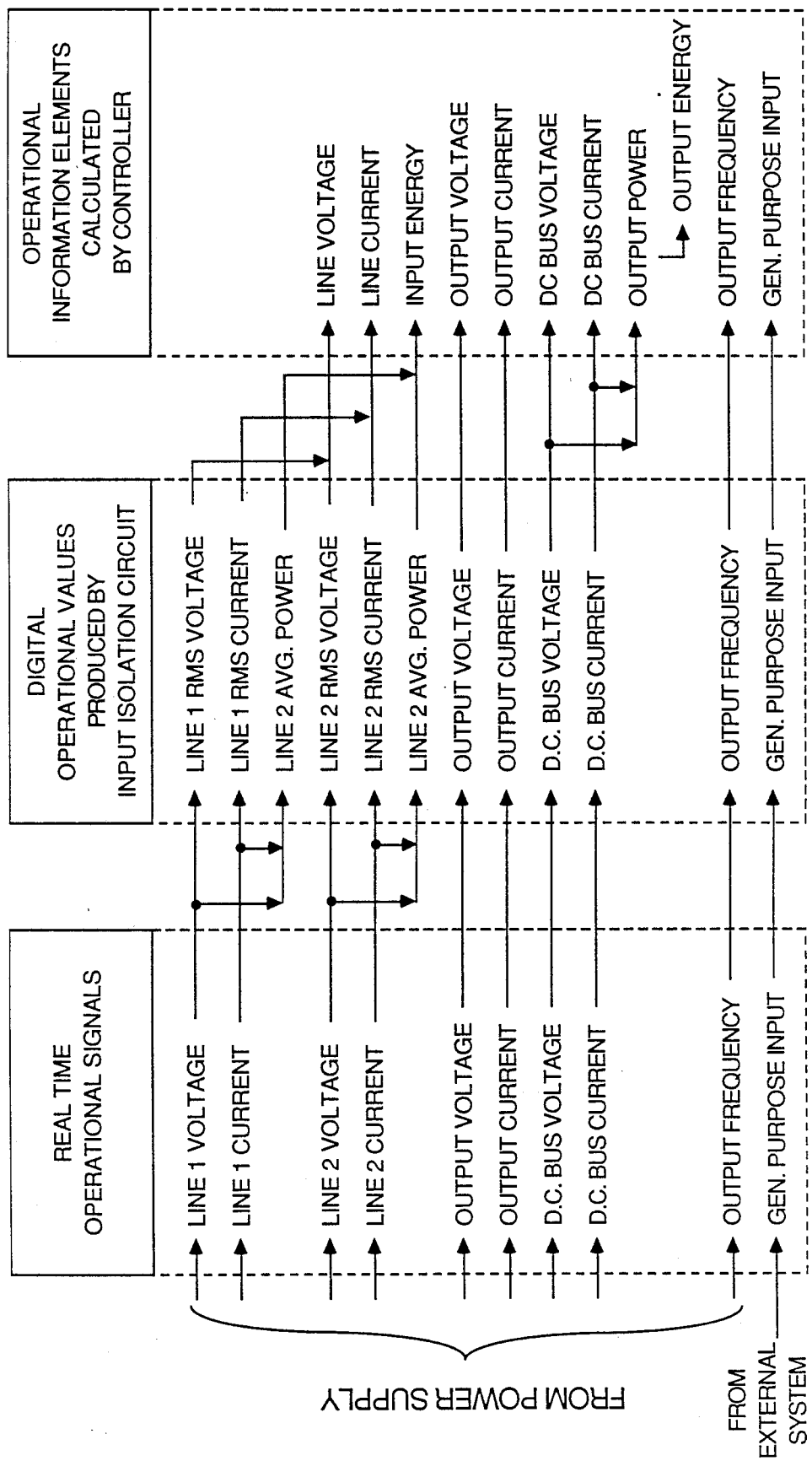
FIG. 7A is a chart depicting the development of the operational information elements in the control system of FIG. 1.
Figure 7B:
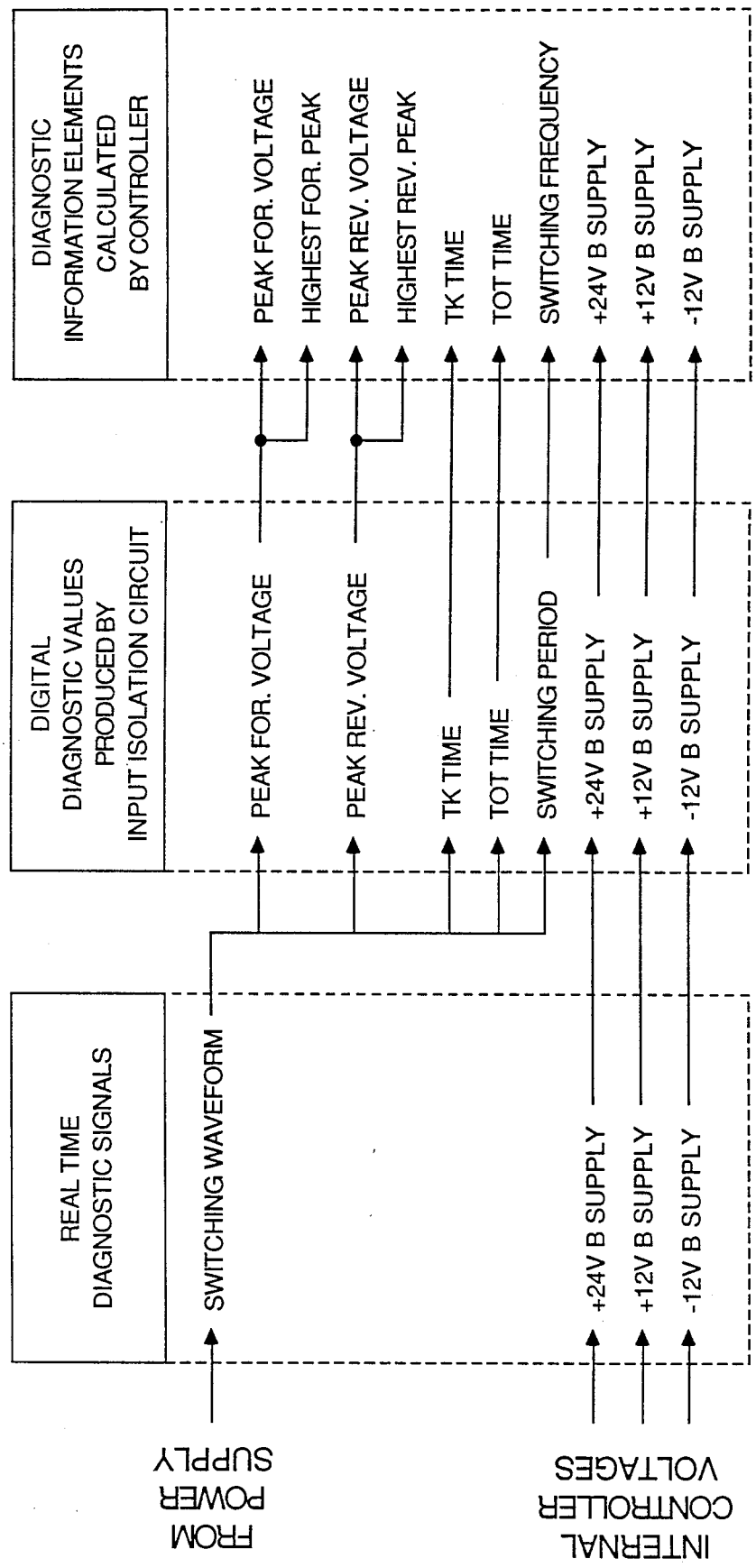
FIG. 7B is a chart depicting the development of the diagnostic information elements in the control system of FIG. 1.

Referring primarily to FIG. 7, all of the analog inputs processed by the analog signal conditioning unit 200 are scaled to a suitable voltage range using resistive voltage dividers and buffer amplifiers. This function is represented by the boxes labeled "SCALE".

The analog inputs from the External System 3 in group 202 includes two signals; EXTERNAL CONTROL signal 205 and GENERAL PURPOSE INPUT 206. These inputs are simply scaled before being passed on to the analog multiplexer and A/D converter 204.

Three internal power supply voltages (B Supply) 210-212 are also scaled and connected to the analog multiplexer and A/D converter 204. These connections allow the power supply monitoring function described above to be performed.

The analog signals in group 201 are as follows. OUTPUT VOLTAGE and OUTPUT CURRENT signals 215 and 216, respectively, represent the output voltage and current of the inverter power supply 2. These signals 215 and 216 are first scaled and then converted to direct current signals 217 and 218 which represent the Root-Mean-Square (RMS) value of the Alternating Current (AC) input signals 215 and 216, respectively. The RMS OUTPUT VOLTAGE and RMS OUTPUT CURRENT signals 217 and 218 are then connected to the analog multiplexer and A/D converter 204.

LINE 1 VOLTAGE and LINE 1 CURRENT signals 220 and 221, respectively, representing the voltage and current from one phase of the input power, are also scaled and converted to RMS values 222 and 223 before being connected to the analog multiplexer and A/D converter 204. In addition, the scaled values 224 and 225 for the LINE 1 VOLTAGE and LINE 1 CURRENT signals are connected to an analog multiplier 226, the output 227 of which represents the instantaneous power being drawn on the input phase connected to Line 1. Signal 227 representing the instantaneous power is then fed through a low pass filter 228 to produce a LINE 1 AVERAGE POWER signal 229, which is a DC signal representing the average power being drawn from the Line 1 input phase.

In a similar fashion, LINE 2 VOLTAGE and LINE 2 CURRENT signals 230 and 231, respectively, are scaled and converted to LINE 2 RMS VOLTAGE and LINE 2 RMS CURRENT signals 232 and 233. A LINE 2 AVERAGE POWER signal 239 is developed by multiplier 236 and low pas filter 238.

A DC BUS CURRENT signal 240 represents the current on the DC bus 37. The DC BUS CURRENT signal 240 is obtained by scaling an associated input from bus 201 and is then connected to the analog multiplexer and A/D converter 204.

The SWITCHING WAVEFORM signal 35 is scaled to form a SCALED SWITCHING WAVEFORM signal 241. The SCALED SWITCHING WAVEFORM signal 241 is then connected to several circuits for performing the switching waveform measurements described above.

First, the SCALED SWITCHING WAVEFORM signal 241 is fed through a low pass filter 242 to produce a DC BUS VOLTAGE signal 243, which is a DC signal that represents the average voltage on the DC bus 37. Since the DC BUS CURRENT 240 is essentially constant due to the smoothing action of inductor 31, output power can be computed by the microprocessor 100 by internally multiplying the DC BUS VOLTAGE 243 by the DC BUS CURRENT 240.

Next, the SCALED SWITCHING WAVEFORM signal 241 is applied to a peak detector circuit 245. The output of the peak detector circuit is a PEAK FORWARD VOLTAGE signal 248, which is fed into the analog multiplexer and A/D converter 204. The peak detector 245 operates in well known fashion to hold the highest peak voltage detected. The peak detector 245 also has a clear input 246 which clears the peak value to zero. This allows the peak value to be measured successively over different time intervals.

The SCALED SWITCHING WAVEFORM signal 241 is also inverted by analog operational amplifier 247. The output of amplifier 247 is connected to a second peak detector 245 to produce a PEAK REVERSE VOLTAGE signal 249. The PEAK REVERSE VOLTAGE signal 249 is similarly connected to the analog multiplexer and A/D converter 204.

Referring again to FIGS. 6 and 7, the clear input 246 of each peak detector 245 is connected to an ARM signal 250. The ARM signal 250 originates as one of the outputs 251 on parallel I/O bus 15, coupled through an optical isolator 252. The ARM signal 250, when pulsed low, serves to clear the peak detectors 245, as well as other switching waveform measurement circuits described below.

Referring again to FIG. 6, the SCALED SWITCHING WAVEFORM signal 241 is conducted out of the analog signal conditioning unit 200 to the inverting input of analog comparators 255 and 256. The non-inverting input of comparator 255 is connected to the +REF signal 155, while the non-inverting input of comparator 256 is connected to the −REF signal 154. The outputs 257 and 258 of these comparators 255 and 256 are connected as ">+REF" and "<−REF" logic inputs, respectively, to a gate and latch circuit 260.

Based on these logic inputs, the gate and latch circuit 260 generates three clock signals; a TK CLOCK 261, a TOT CLOCK 262, and a T CLOCK 263 which are used to measure, respectively, the TK time, the TOT time, and the period T of the switching waveform 35 (FIG. 2A).

Each clock signal 261-263 is generated by the gate and latch circuit 260 according to definitions for the quantities being measured (FIG. 2A). The switching period T is defined as the time between successive negative transitions of the switching waveform 35 through the −REF level. The TOT time is defined as the time between a negative transition of the switching waveform 35 through the −REF level and a positive transition through the +REF level. And the TK time parameter is defined as the time between a negative transition of the switching waveform 35 through the +REF level, and a negative transition through the −REF level.

The +REF and −REF levels 270 and 271 (FIG. 2A) are the voltage levels on the +REF and −REF signals 155 and 154, respectively, which are generated by the output isolation circuit 5 as described above. The +REF and −REF levels 270 and 271, respectively, are set by the microprocessor 100 to be ten percent of the respective peak values from the previous readings of the peak forward voltage and peak reverse voltage. This insures reliable timing measurements independent of the amplitude of the switching waveform 35.

The gate and latch circuit 260 performs a single measurement cycle each time a negative going pulse is received on the ARM signal 250. The measurement cycle consists of a singe measurement of the above defined quantities, after which the gate and latch circuit 260 reverts to a quiescent state awaiting another measurement cycle to begin. This allows the microprocessor 100 to input the measured quantities before starting the next measurement cycle.

The gate and latch circuit 260 generates the clock signals 261-263 as follows. In the quiescent state between measurement cycles, the clock signals 261-263 are inactive, held a constant high level. When a negative going pulse is applied on the ARM signal 250, the gate and latch circuit is reset to start a new measurement cycle.

The gate and latch circuit 260 includes a 10 MegaHertz (MHZ) clock generator (not shown). The 10

MHZ clock is gated onto each of the clock signals 261–263 during the time period associated with the quantity being measured as defined above.

As soon as a negative transition is observed on the "<−REF" SIGNAL 258, indicating the start of a switching period T, the 10 MHZ clock is gated onto T CLOCK 261 and TOT CLOCK 262. Then, when a positive transition is observed on the ">+REF" signal 257, the TOT CLOCK signal 262 is gated off, e.g. again held a constant high, for the remainder of the measurement cycle. The TK CLOCK signal 263 is gated on, e.g. 10 MHZ clock applied, on the negative transition of the ">+REF" signal 257. Finally, on the occurrence of a second negative transition of the "<−REF" SIGNAL 258, both TK CLOCK 263 and T CLOCK 261 are gated off, and the gate and latch circuit 260 is latched into the quiescent state, awaiting the start of another measurement cycle.

The clock signals 261–263 are each applied to the clock input of 12 bit counters 281–283, respectively. The counters 281–283 each have a clear input connected to the ARM signal 250, and are therefore cleared to zero at the start of a measurement cycle. After the measurement cycle, the counters 281–283 each contain a count, which is a measurement of the TK time, TOT time, and switching period T, respectively. Since a 10 MHZ clock is used for the counting, the measurements have a resolution of one tenth of a microsecond.

An eight bit multiplexer and Optical Isolator (OI) circuit 290 is used to select the various quantities available for input by the microprocessor 100. The multiplexer and I/O circuit 290 connects to a set of three select lines 291 and a set of eight output lines 292 from the parallel I/O bus 15, and eight input ports 293–300 from the input sources in the input isolation circuit 4. The set of three select lines 291 indicate to the multiplexer and I/O circuit 290 which input port 293–300 to connect to the output lines 292.

Each input port 293–300 is an eight bit port. The counters 281–283 are 12 bits each, and so are divided between ports. Port 294 is connected to the high order eight bits of counter 281. Port 295 is connected to the low order 4 bits of counter 281 and the high order 4 bits of counter 282. The low order 8 bits of counter 282 are connected to port 296. Ports 297 and 298 are connected to the high order 8 bits and low order 4 bits, respectively, of counter 283. The remaining ports are used for other inputs as described below.

Still referring to FIG. 6, the analog multiplexer and A/D converter 204 contains a set of analog inputs 305, with one analog input for each of the signals received from the analog signal conditioning unit 200 as described above. In addition, the SHORT DETECT RELAY OUTPUT signal 195 from the output isolation circuit 5 is connected to one of the analog inputs 305.

The analog multiplexer and A/D converter 204 receives a five bit select input 310 from the parallel I/O bus 15 via a set of optical isolators 311. The select input 311 determines which one of the analog inputs 305 is selected for the digital conversion process.

A START signal 312 from the parallel I/O bus 15 also connects to the analog multiplexer and A/D converter 204 through an optical isolator 313. When the START signal 312 is activated, the selected analog input is converted to an equivalent eight bit digital output value 314.

After the conversion is complete, the analog multiplexer and A/D converter 204 sets a DONE signal 315 true. The DONE signal 315 is connected through an optical isolator 316 to the parallel I/O bus 15 to signal the microprocessor 100 that the analog to digital conversion is complete. Then the 8 bit digital output value may then be input over port 293 of the 8 bit multiplexer and optical isolator circuit 290. In this manner, any of the analog inputs 305 ma be read by the microprocessor 100 as a digital value.

The input isolation circuit 4 also includes a digital input scaling and protection circuit 320 for inputting digital values from the busses 8 and 9. The digital input scaling and protect circuit scales the digital values with resistive voltage dividers and provides protection against hazardous voltages through the use of clamping diodes.

From the inverter power supply 2 on bus 8, the digital inputs are the RUN signal 197 and a TRIP signal 321. The RUN signal 197 is true whenever the inverter power supply 2 is supplying power on its output. The TRIP signal 321 is true whenever the inverter power supply 2 has detected an internal fault. Once that occurs, the TRIP signal 321 remains set until the inverter power supply 2 receives a pulse on the RESET signal 182 from the output isolation circuit 5.

The digital inputs from the external system 3 on bus 9 are the EXT START signal 322, the TPP RESET signal 323, an ENERGY RESET signal 324, and the set of five EVENT inputs 325 325. The function of the EXT START signal 322, the TPP RESET signal 323, and the EVENT inputs 325 is described above.

The function of the ENERGY RESET signal 324 is as follows. The microprocessor 100 maintains running values of input and output energy, computed by integrating successive values of input and output power, respectively. The ENERGY RESET signal 324 is used to command the microprocessor 100 to reset the values of input and output energy to zero.

Figure 8:
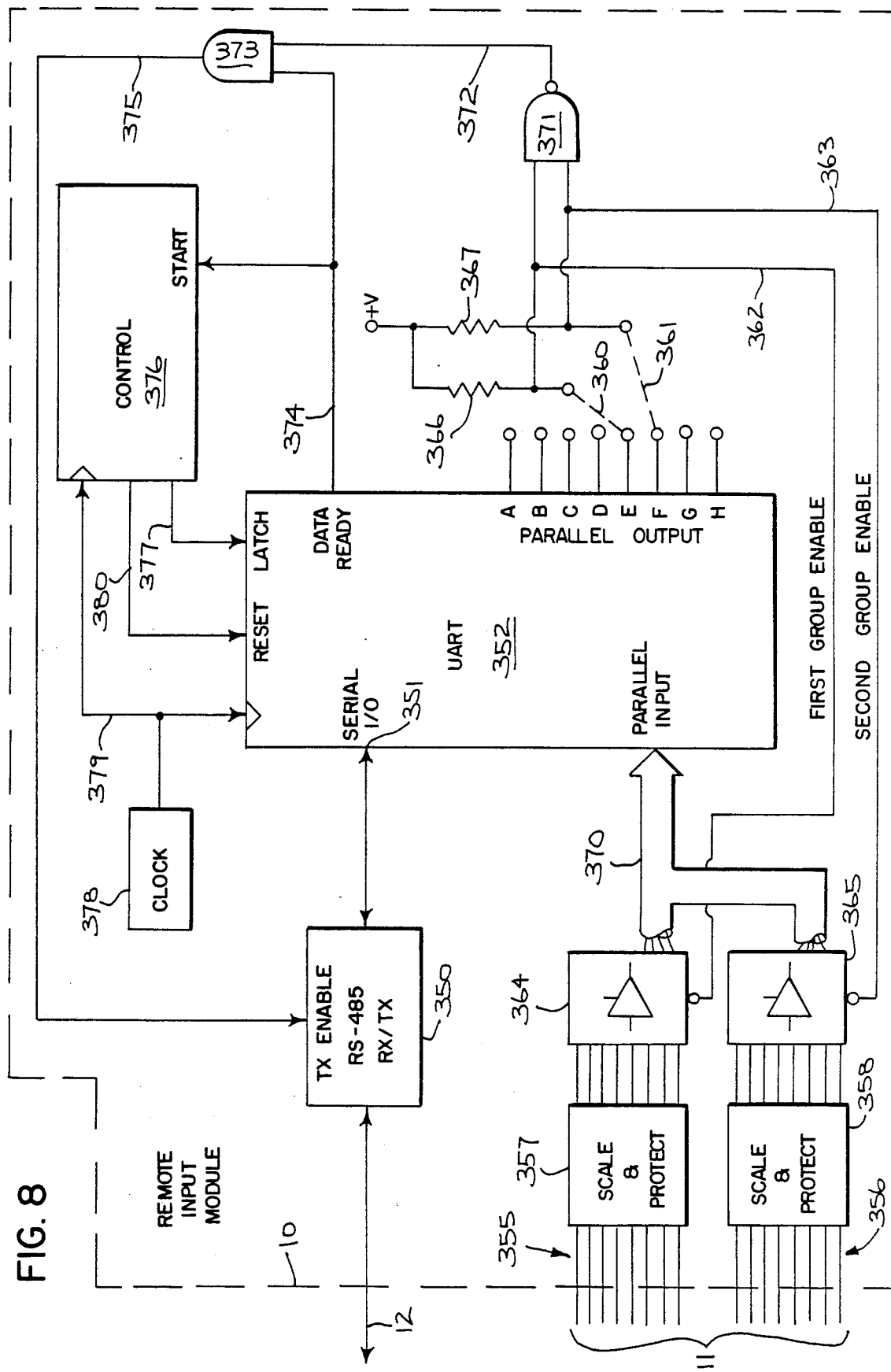
FIG. 8 is a block diagram of the remote input module used in the control system of FIG. 1.

Referring to FIG. 8, the remote input module 10 connects to the controller 1 via RS-485 serial communications line 12. An RS-485 Receiver/Transmitter circuit 350 connects to the communications line 12 and relays input and output messages to a serial I/O port 351 on a Universal Asynchronous Receiver Transmitter (UART) 352.

As described above, several remote input modules 10 may be connected onto the communications line 10. A polling protocol is used to insure that only one remote input module 10 transmits at any one time. The remote input modules 10 only transmit upon interrogation by the controller 1.

For convenience, all communications on the communications line 12 are in the form of serial eight bit bytes. Therefore, the inputs 11 are divided into two groups of eight inputs each, comprising a first group of inputs 355 and a second group of inputs 356. Each group 355 and 356 is connected through a scaling and protection circuit 357 and 358 to the inputs of tri-state driver circuits 364 and 365, respectively.

The controller 1 obtains the values on the inputs 11 by separately interrogating each group 355 or 356. Interrogations are performed by the controller 1 broadcasting an interrogation byte to all remote input modules 10 connected to the communications line 12. In each module 10, the interrogation byte is received by UART 352 and presented on a set of parallel outputs, represented by output bits "A" through "H". Each bit A-H corresponds, or addresses, one of the input groups 355 or 356 at one of the remote input modules 10. The assignments between bits A-H of the interrogation byte and the input groups 355 and 356 are made using jumpers 360 and 361.

For example, in FIG. 8, jumper 360 is shown connecting bit "E" to a FIRST GROUP ENABLE line 362, which is in turn connected to an active low enable input on tri-state drivers 364. All bits of the interrogation byte are high except for one bit, which is set low to enable the corresponding input group 355 or 356 at one of the modules 10.

Line 362 is normally held high by pull-up resistor 366. When an interrogation byte is received with bit "E" low, then the first group of inputs 355 at the module with jumper 360 connected to bit "E" is selected. The jumpers 360 and 361 at other modules 10 are arranged so that each bit A-H is used no more than once. Accordingly, a maximum of four remote input modules with two input groups 355 and 356 each can be accommodated by this protocol.

The second input group 356 is assigned in a similar fashion using jumper 361 connecting to a SECOND GROUP ENABLE line 363, held high by pull-up resistor 367. The SECOND GROUP ENABLE line 363 connects to the enable input of tri-state drivers 365. The output of the tri-state drivers 365 is also connected to bus 370 for connection to the parallel input of UART 352.

All of the remote input modules 10 receive the interrogation byte, but only one of the modules 10 responds. The module which responds is that module 10 which contains the addressed input group 355 or 356 as selected by the jumpers 360 and 361. The response to the interrogation byte consists of the transmission of a response byte back to the controller 1. The response byte contains the current values of the selected input group 355 or 356.

The response byte is transmitted as follows. Lines 362 and 363 are also connected to the input of NAND gate 371. If an interrogation byte is received, and either line 362 or 363 is connected via jumpers 360 and 361, respectively, to the bit A-H which is set low in the interrogation byte, then the output 372 of NAND gate 371 will go high.

The high on output 372 is applied to one input of AND gate 373. The other input of AND gate 373 is connected to a DATA READY signal 374 from the UART 352. The DATA READY signal 374 is set high by the UART 352 whenever a byte is received, indicating that the received data is presented at the parallel outputs A-H is valid. The output 375 of AND gate 373 is then high whenever an interrogation byte is received which addresses one of the input groups 355 or 356.

Output 375 of AND gate 373 is connected as the Transmit (TX) ENABLE input to the RS-485 Receiver/Transmitter 350, thereby enabling transmission of the response byte if the module 10 contains the addressed input group 355 or 356. The DATA READY signal 374 also connects to a START input of a control circuit 376. A clock generator 378 produces a 9600 Hz clock signal 379 which connects to the clock inputs of both the UART 352 and the control circuit 376. When the START input is made high by the DATA READY signal 374 upon reception of an interrogation byte, the control circuit 376 waits for approximately four clock cycles and then activates a latch signal 377 connected to the latch input of the UART 352.

Either input group 355 or 356 is applied to the parallel input of the UART 352 over the bus 370, depending on enable line 362 or 363 is active. Upon receiving the LATCH signal 377, the UART 352 performs a transmit cycle of one byte by latching the data on the parallel input and sending the data out serially over serial I/O port 351.

The above described transmission of the response byte is performed by the UART 352 in each module, but only one module has the RS-485 Receiver/Transmitter 350 enabled. The nonenabled UARTs 352 make a null transmission in order to maintain timing and synchronization without other complicated control circuitry.

The interrogation/response cycle is repeated continuously by the controller 1, scanning each module in the system. Normally, when one response byte ends, another interrogation byte is transmitted shortly thereafter. After the transmission of the response byte is complete, the control circuit 376 begins timing, and if another interrogation byte is not received within a predetermined period of time, a RESET signal 380 is generated. The reset signal 380 connects to a reset input on the UART 352, to reset the UART in case the inability to receive the interrogation byte is a local transitory fault.

Figure 9:
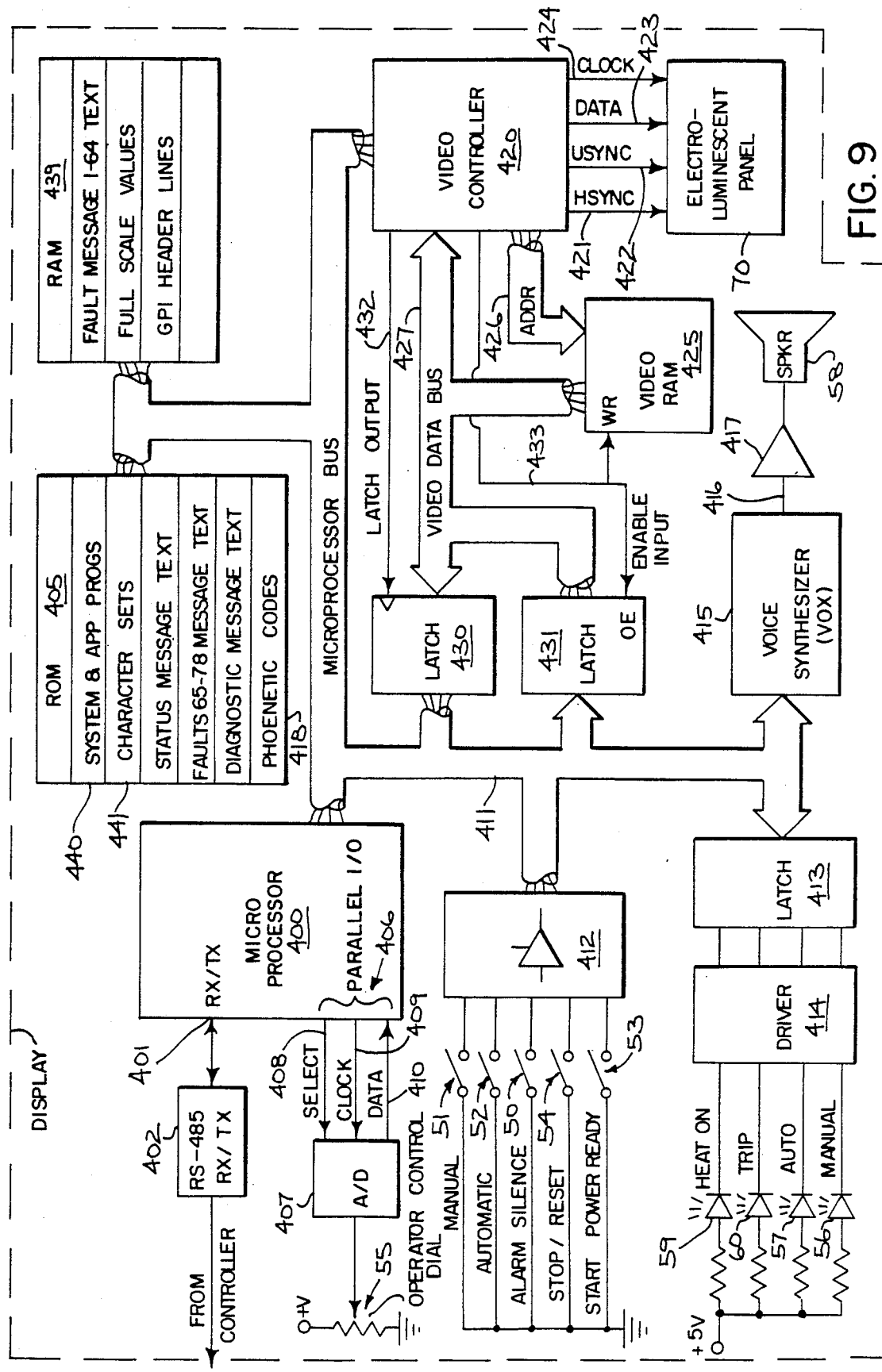
FIG. 9 is an electrical block diagram of the displays used in the control system of FIG. 1.

Referring to FIG. 9, the local display 20 and the remote display 21 are identical in construction. Each display 20 or 21 is controlled by a microprocessor 400. The microprocessor 400 preferred for this embodiment is a type 6803, manufactured by Motorola.

The microprocessor 400 includes a serial communications port 401 which is connected to an RS-485 Receiver/Transmitter 402. The RS-485 Receiver/Transmitter 402 in turn connects to either RS-485 serial communications line 22 or 23 from the controller 1, depending on whether the display is connected as the local display 20 or the remote display 21, respectively. Incoming messages are processed, and outgoing responses are generated, by the microprocessor 400 under control of software, the function of which is described below.

The microprocessor includes a set of parallel I/O lines 406 for interfacing to a single channel Analog to Digital (A/D) converter 407. The analog input 411 of the A/D converter 407 is connected to the wiper arm of the operator control dial potentiometer 55. The I/O lines 406 are connected to SELECT and CLOCK output signals 408 and 409, respectively, and DATA input signal 410. The clock signal 409 provides the basic clock for A/D converter 407. The SELECT signal 408, when activated, instructs the A/D converter 407 to begin a conversion and send the result serially to the microprocessor 400 via the DATA signal 410. The microprocessor 400 can thereby obtain a digital reading of the setting of the operator control dial 55.

Other interfacing to the microprocessor 400 is performed via a bus 411, which contains the necessary address, data, and control signals for connection of external circuits. The bus 411 provides for the input of switch settings from the pushbutton switches 50-54 described above through a set of tristate buffers 412. Similarly, discrete outputs are coupled from the bus 411 through latch 413 and driver circuit 414 to drive indicator LEDs 56, 57, 59 and 60.

The microprocessor 400 connects via bus 411 to a Read Only Memory (ROM) 405 and a Random Access Memory (RAM) 439. The ROM 405 is used for storing System and Applications programs 440 which implement the functions of the microprocessor 400 described herein. The ROM 405 also stores other fixed information as described below. The RAM 439 is used for providing read/write storage for the microprocessor 400. The contents of the RAM 439 are also described below.

The bus 411 also interfaces to a Voice Synthesizer circuit 415. The Voice Synthesizer circuit 415 is an single integrated circuit, type MEA8000 manufactured by Signetics, which accepts phonetic codes from the microprocessor 400 and produces a corresponding human synthesized voice on an audio output 416. The audio output 416 is amplified by amplifier 417 and fed to the speaker 58. A set of 16 preset, or "canned" voice messages are stored in the ROM 405 in an area 418 reserved for storing strings of phonetic codes.

Each string of phonetic codes produces one of the 16 voice messages when sent serially to the voice synthesizer 415. The beginning of the phonetic codes area 418 contains a list of pointers to the starting addresses of the 16 strings. Each string begins with a byte count indicating the number of bytes in the string. The microprocessor 400 can thereby produce any one of the 16 possible spoken synthesized voice messages by selecting the desired string and serially passing the bytes in the string to the voice synthesizer as needed on an interrupt driven basis.

The Voice Synthesizer 415 is also used by the microprocessor 400 to produce the audio alarm in the speaker 58. The alarm sound is synthesized by commanding the voice synthesizer 415 to continuously repeat a fixed set of phonetic codes. Any suitable set of phonetic codes may be used to produce a simulated alarm sound.

The bus 411 also interfaces to a video controller 420. The video controller 420 generates a set of control signals 421-424 to produce an image on the display panel 70. The control signals 421-424 include a HORIZONTAL SYNC signal 421, a VERTICAL SYNC signal 422, a DATA signal 423, and a CLOCK signal 424. The particular device used for the video controller 420 in this embodiment consists of a set of two mating integrated circuits, types SCN2672 and SCB2673, both manufactured by Signetics.

The control signals 421-424 function to produce a raster scan image which is contained in a Video Random Access Memory (RAM) 425. An Address bus 426 is generated by the video controller 420 to set the address for the video RAM 425. Normally, successive bytes of the video image are read out of the Video RAM 425 by the video controller 420 over a video data bus 427. The parallel bytes thus read are then shifted out serially over DATA line 423, with the corresponding control signals 421, 422 and 424.

Using read and write commands, the microprocessor 400 can read from and write into a set of control registers (not shown) internal to the video controller 420. The control registers are used to communicate command and status information between the microprocessor 400 and the video controller 420.

The microprocessor 400 can read and write data to the video RAM 425 indirectly through latches 430 and 431. The microprocessor 400 reads data out of the Video Ram 425 by setting an address pointer contained in one of the control registers to point to the desired location. Then a read command is deposited in another of the control registers which acts as a command buffer. During the next blanking interval, the Video Controller 420 places the requested address on address bus 426 and strobes a LATCH OUTPUT signal 432, latching the requested data into latch 430. The microprocessor 400 can then read latch 430 over bus 411 in the normal fashion.

Writing to the Video RAM 425 by the microprocessor 400 is performed in a similar fashion, by first latching the data to be written into latch 431, setting the address pointer in the Video Controller 420, and issuing a write command. During the next blanking interval, the Video Controller 420 places the desired address on address bus 426 and activates an ENABLE INPUT signal 433. The ENABLE OUTPUT signal 433 is connected to latch 431 to enable its output onto the Video Data Bus 427. The ENABLE OUTPUT signal 433 is also connected to the WRITE input of the Video Ram 425 in the write mode. The data in latch 431 is thereby written into the Video RAM 425.

The image contained in the Video RAM 425 is a graphical representation (i.e. bit map) of the information that is presented on the display panel 70 (FIG. 3). Each bit in the Video RAM 425 represents on picture Element (pixel) on the display panel 70. The outlines for areas 71-77, along with the graphic representations of the bar graphs 81 to be displayed on the display panel 70 are written into the Video RAM 425 by the Applications programs 440.

In order to present characters on the display panel 70, the ROM 405 includes a pair of character sets 441. One of the character sets 441 produces characters of 7 by 9 pixel size, while the other character set produces character of 10 by 14 pixel size. The microprocessor 400 places characters on the display panel 70 by looking up, row by row, the pixels corresponding to the desired character from the character sets 411. The pixel information is then written into the Video RAM 425 at a location corresponding to the position where the character is to appear on the display screen 70.

The text portions of the display screen 70 are formed by looking up each character in turn and placing it in the Video RAM 425. The ROM 405 includes areas for storing: (a) status message text 442, (b) fault message text 443 corresponding to fault codes 65-76, and (c) diagnostic message text 444. Each of the message text areas 442-444 contains sets of character strings associated with corresponding codes. The controller commands the microprocessor 400 to display messages from the areas 442-444 by communicating the corresponding codes rather than the message text itself, thereby allowing the messages to be much shorter than would otherwise be necessary. The format of the communications from the controller 1, along with the codes and corresponding text is described below.

Communication Formats

Figure 10:
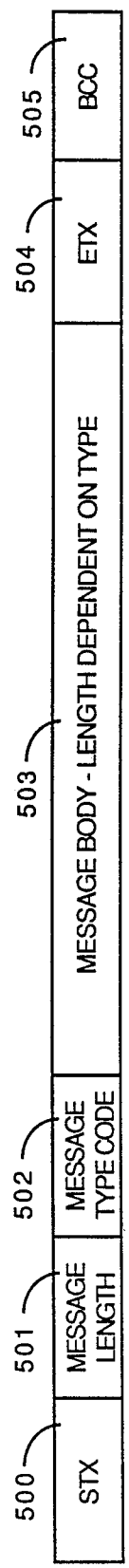
FIG. 10 is a pictorial representation of the general controller to display message format used in the control system of FIG. 1.

Referring to FIG. 10, a format for all messages sent from the controller 1 to the displays 20 and 21 is as follows. Each message begins with a "start of text" character (STX) 500. The second character in each message is a message length character 501 which indicates the length of the message to follow. The third byte in each message is a MESSAGE TYPE code 502, which designates the type of message being sent.

The MESSAGE TYPE codes, and the corresponding message types indicated, are listed in Table 1 below:

TABLE 1
MESSAGE TYPE CODES FOR CONTROLLER TO DISPLAY MESSAGE FORMAT

| Message Type Code | Corresponding Message Type |
|---|---|
| 10 → | Configuration Data Message |
| 2X → | Meter Data Message |
| 3X → | Diagnostic Data Message |
| 40 → | Fault Data Message |
| 50 → | Status Data Message |
| 60 → | TPP Program Command Message |
| 70 → | EPP Program Command Message |
| 80 → | Stop Programming Command Message |
| 90 → | Programming Result Request Message |

Following the MESSAGE TYPE code 502 is a message body 503, the length of which is dependent upon the type of message being sent, as identified by the MESSAGE TYPE code 502 for the message. After the message body 503, the last two characters in the message are an "end of text character" (ETX) 504, and a binary check character (BCC) 505. The BCC character 505 serves as an error check on the message and is calculated by taking the exclusive-or of all other bytes in the message.

Five of the MESSAGE TYPE codes 502 specify "data" type messages. The five types of data messages are the configuration data message, the meter data message, the diagnostic data message, the fault data message, and the status data message. These five message types are transmitted to the displays 20 and 21 on a periodic basis. A meter data message are transmitted each second, and a fault data message is transmitted every 2.5 second.

The remaining message types 60-90 are used for programming the Timed Power Profile and Event Power Profile tables from the displays, and are therefore only transmitted when the respective TPP or EPP programming mode is enabled.

Figure 11:
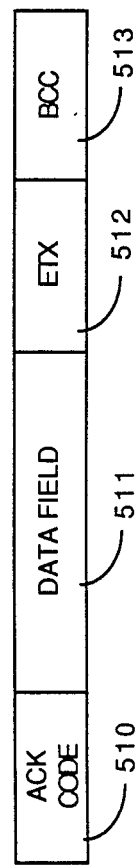
FIG. 11 is a pictorial representation of the general display to controller acknowledgement message format used in the control system of FIG. 1.

Referring to FIG. 11, whenever any message is received at a display 20 or 21, the display responds with an acknowledge message. The format of the acknowledge message is as follows. The first character of the acknowledge message is an acknowledge code 510, followed by a two character data field 511, an ETX character 512 and a BCC character 513. The data field 511 contains two byte response to the message received from the controller 1. The contents of the response data field 511 is dependent upon the type of message received, and is described below in relation to each of the message types.

Figure 12:
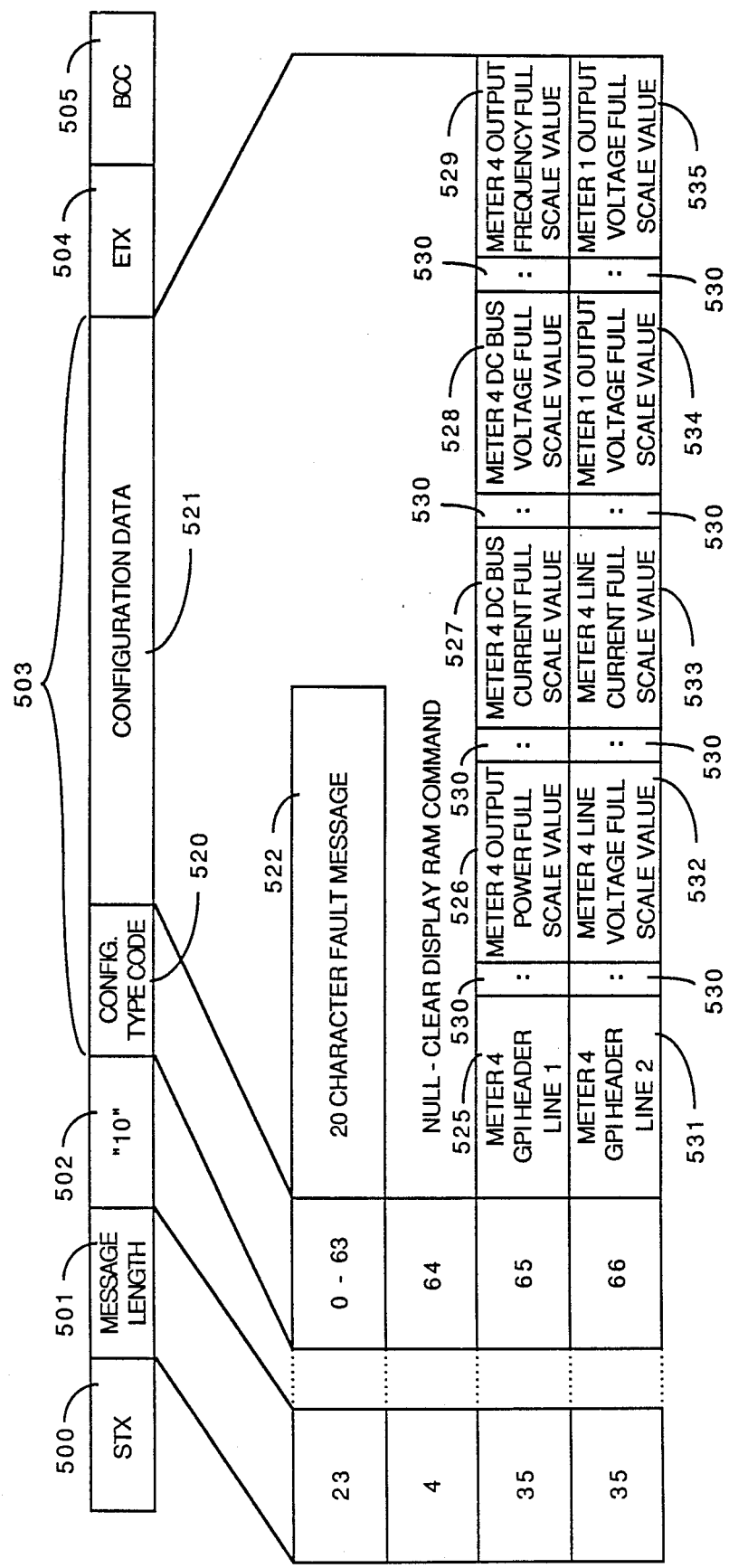
FIG. 12 is a pictorial representation of the CONFIGURATION DATA message format used in the control system of FIG. 1.

Referring to FIG. 12, a configuration data message is identified by the MESSAGE TYPE code 502 being equal to "10". In the configuration data message, the first byte of the message body 503 is a CONFIGURATION TYPE code 520. The CONFIGURATION TYPE code 520 contains a value from 0 to 66 which specifies a subclassification for the configuration data message.

A CONFIGURATION TYPE code from 0 to 63 specifies that the configuration data 521 contains a 20 character fault message 522. The message length field 501 is therefore equal to 23. The display 20 or 21 places the fault message 522 in the fault message text area of RAM 439 (FIG. 9).

If the CONFIGURATION TYPE code 520 is equal to "64", then the configuration data message is a command to the display 20 or 21 to clear the display RAM 439. In that case, the configuration data field 521 is null and the message length 501 is equal to "4".

If the CONFIGURATION TYPE code 520 to equal to "65", then the configuration data field 521 contains a group of five different configurations settings. Those five settings are the first line 525 of the General Purpose Indicator (GPI) header for the fourth meter position 74, and the full scale values 526-529 for four of the other operational information elements, including DC Bus Power, DC Bus Current, DC Bus Voltage, and Output Frequency. The GPI header line 525 is eight characters long and each of the full scale values is 5 characters long. Each of these fields is separated by a one byte space character 530, yielding a total message length 501 of 35.

Similarly, a CONFIGURATION TYPE code 520 of "66" indicates that the configuration data field 521 contains the second line of the GPI header 531, and the full scale values 532-535 for the other four operational information elements, Line Voltage, Line Current, Output Voltage, and Output Current.

Figure 13:
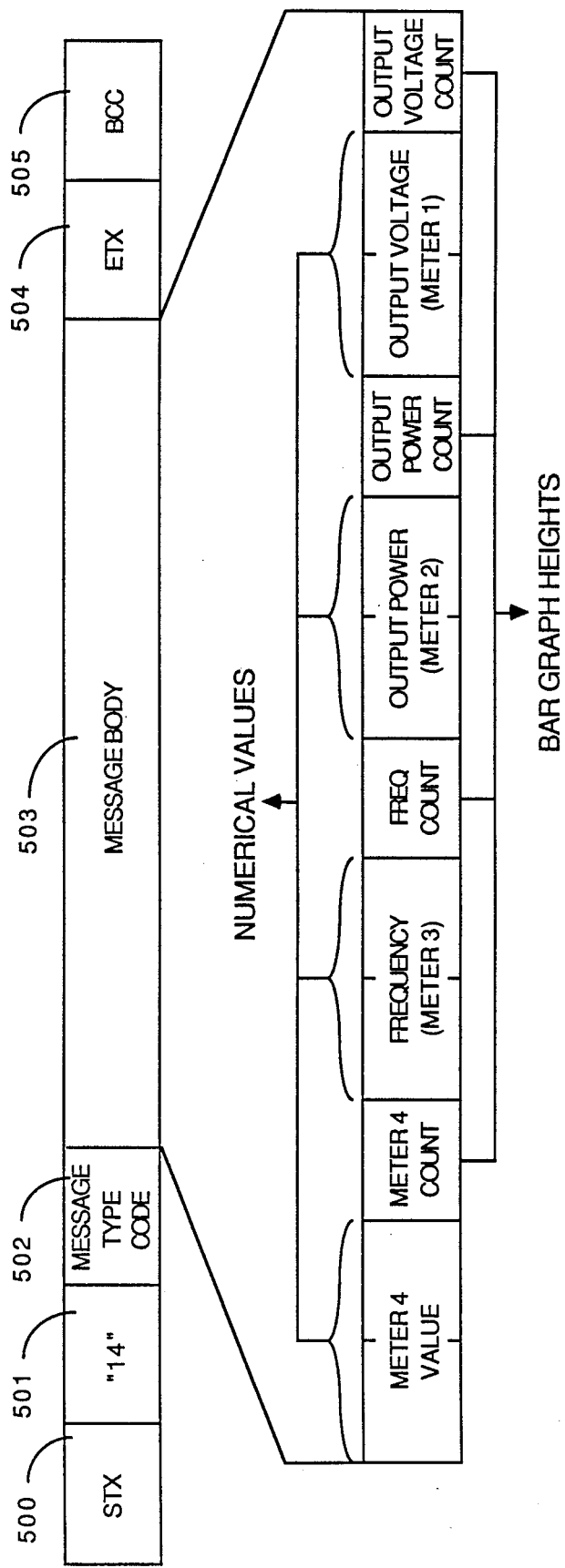
FIG. 13 is a pictorial representation of the METER DATA message format used in the control system of FIG. 1.

Referring to FIG. 13, a meter data message is indicated by a MESSAGE TYPE code 502 with a value in the range 20 to 28. The range of values 20-28 for the MESSAGE TYPE code 502 is used to specify which operational information element is to be displayed in the fourth meter position 74. The MESSAGE TYPE codes 502 and the corresponding operational information elements are as follows:

20 DC bus voltage
21 DC bus current
22 Line voltage
23 Line current
24 Output current
25 Output energy
26 Input energy
27 General purpose input (GPI)
28 BLANK (i.e. no display in fourth meter position)

The message body 503 for a meter data message contains four pairs of values for the four meter positions. Each pair of values includes a numerical value which is to be displayed in the numerical field portion 83 of each meter position, and a count which indicates the height to which the bar graph 81 should be filled in at each respective meter position.

Figure 14:
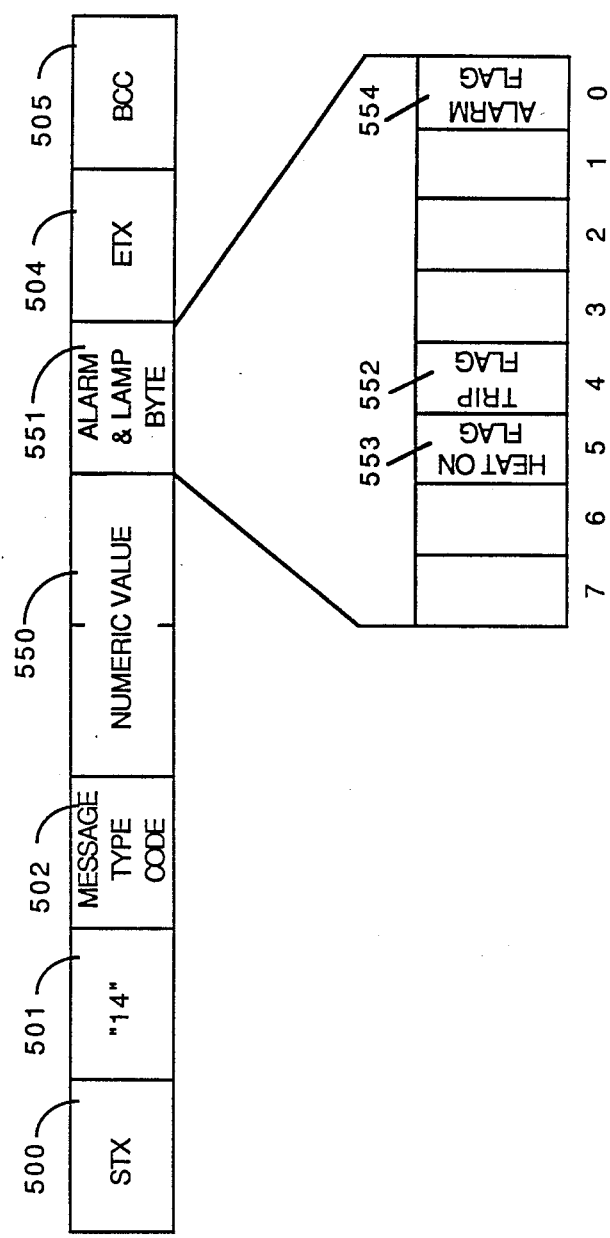
FIG. 14 is a pictorial representation of a DIAGNOSTIC DATA message format used in the control system of FIG. 1.

Referring to FIG. 14, a diagnostic data message is identified by a MESSAGE TYPE code 502 ranging from 30 to 39. Within the range 30 to 39, the MESSAGE TYPE code 502 specifies the particular diagnostic information element which is to be displayed in the diagnostic information area 76 of the display panel 70. Each diagnostic information element corresponds to an indicative text message as indicated in Table 2 below. Each of the text messages includes a numeric field indicated by X's.

TABLE 2
MESSAGE TYPE CODES FOR DIAGNOSTIC DATA MESSAGE FORMAT

| Message Type Code | Corresponding Diagnostic Data Message |
|---|---|
| 30 → | "SCR FREQ XXXXXXX HZ" |
| 31 → | "PEAK FWD VOLT XXXX V" |
| 32 → | "PEAK REV VOLT -XXX V" |
| 33 → | "+15V B SUPPLY XXX.X V" |
| 34 → | "−15V B SUPPLY -XX.X V" |
| 35 → | "+24V B SUPPLY XXX,X V" |
| 36 → | "SCR TK TIME XXX.X uS" |
| 37 → | "SCR TOT TIME XX.X uS" |

TABLE 2-continued

MESSAGE TYPE CODES FOR
DIAGNOSTIC DATA MESSAGE FORMAT

| Message Type Code | Corresponding Diagnostic Data Message |
|---|---|
| 38 → | "SCR VOLTAGE XXXXXX V" |
| 39 → | "                              " |

Following the MESSAGE TYPE code 502, the diagnostic data message includes a numeric value 550, which is converted into the corresponding text numerals and substituted for the X's in the text message before it is displayed. The result is a text message which indicates which diagnostic information element is being displayed and the current numerical value of that element.

Following the numeric value field 550, the diagnostic data message includes an alarm and lamp byte 551. Bits 4 and 5 of the alarm and lamp byte 551 are a TRIP flag 552 and a HEAT ON flag 553, respectively. These flags are used to set the state of the HEAT ON and TRIP indicator lamps 59 and 60, respectively. Bit 0 of the alarm and lamp byte 551 is an ALARM flag 554 which, if set, causes the display to energize an audible alarm.

Figure 15:
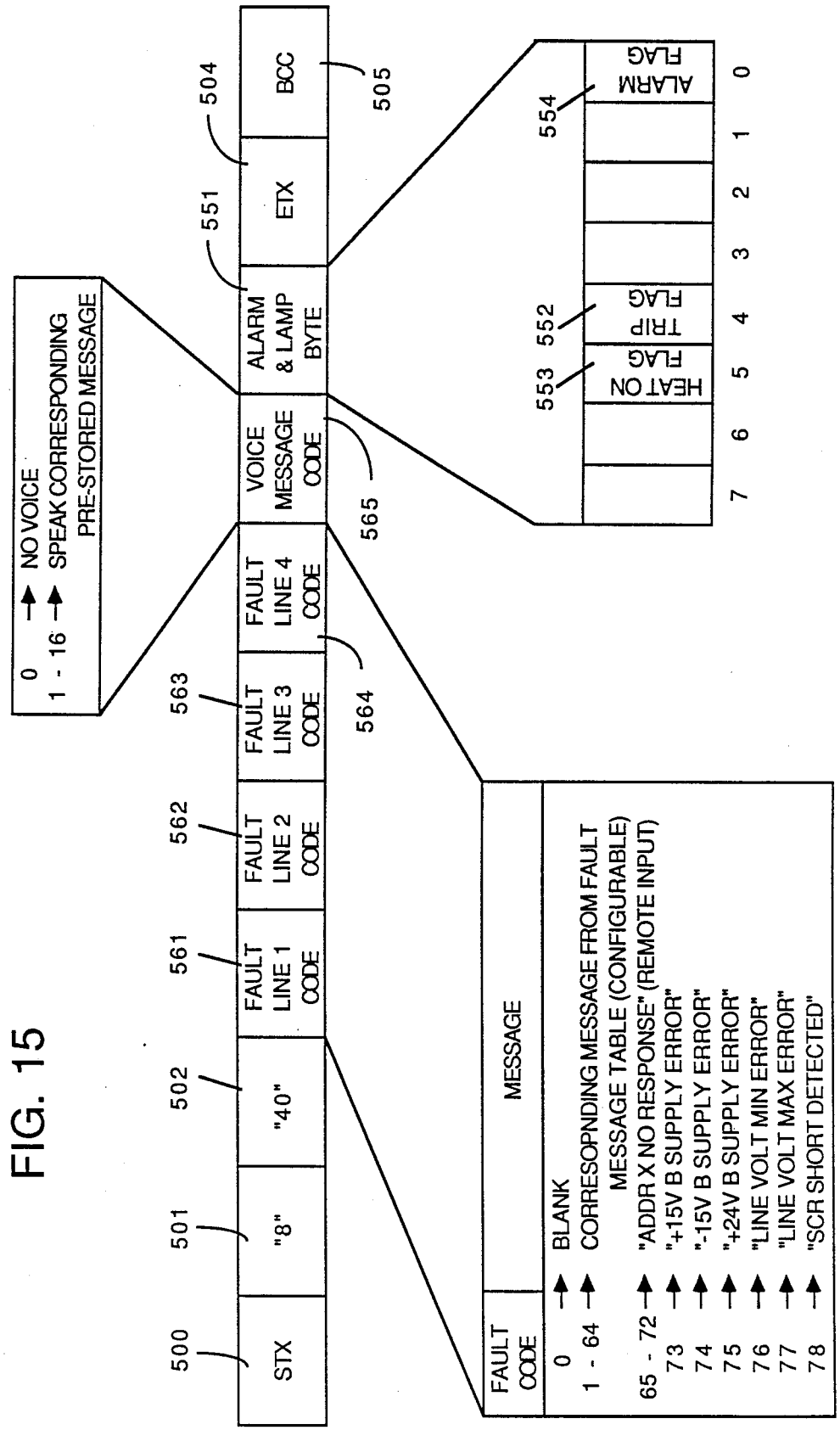
FIG. 15 is a pictorial representation of the FAULT DATA message format used in the control system of FIG. 1.

Referring to FIG. 15, a MESSAGE TYPE code 502 of 40 specifies a fault data message. Following the MESSAGE TYPE code 502 in a fault data message are four fault codes 561–564 which indicate the text to be displayed on fault lines 97 in the fault window 77 of the display screen 70.

Each of the fault codes 561–564 specifies a value within the range 0 to 78. A fault code of 0 indicates that the corresponding line is to be left blank. A fault code from 1 to 64 indicates that the corresponding message from the fault message text area of display ram 439 is to be placed on the corresponding line.

Fault codes 65–78 specify fixed text strings for fixed fault messages that are hard coded into the display ROM 405.

A fault code in the range 65–72 indicates that the message "ADDR-X NO RESPONSE" is to be placed on the corresponding fault line 97. This message is used to indicate that a response was not received from one of the eight remote input modules. The "X" in the message is replaced with a number from 1 to 8 to indicate the address of the remote input module which failed to respond. A fault code of 65 corresponds to remote input module number 1 not responding, and so forth up to a fault code of 72 corresponding to remote input module 8 not responding.

Fault codes 65–78 specify fixed text strings for fixed fault messages that are hard coded into the display ROM 405.

Fault codes 73–75 are used to indicate messages pertaining to B supply voltage errors for the +15V, −15V, and +24V supplies, respectively. Fault codes 76 and 77 specify messages for line undervoltage errors and line overvoltage errors, respectively. A fault code of 78 specifies a message indicating that a SCR short circuit has been detected.

Following the fault line codes 561–564, the fault data message includes a voice message code byte 565. The voice message code byte 565 contains a value from 0 to 16. A voice message code value of 0 indicates that no voice message is to be spoken, while a value from 1 to 16 designates which of the 16 prestored voice messages is to be spoken.

Following the voice message code byte 565, the fault data message includes an alarm and lamp byte 551 as described above for setting the state of the HEAT ON and TRIP indicator lamps 59 and 60 and the audible alarm.

Figure 16:
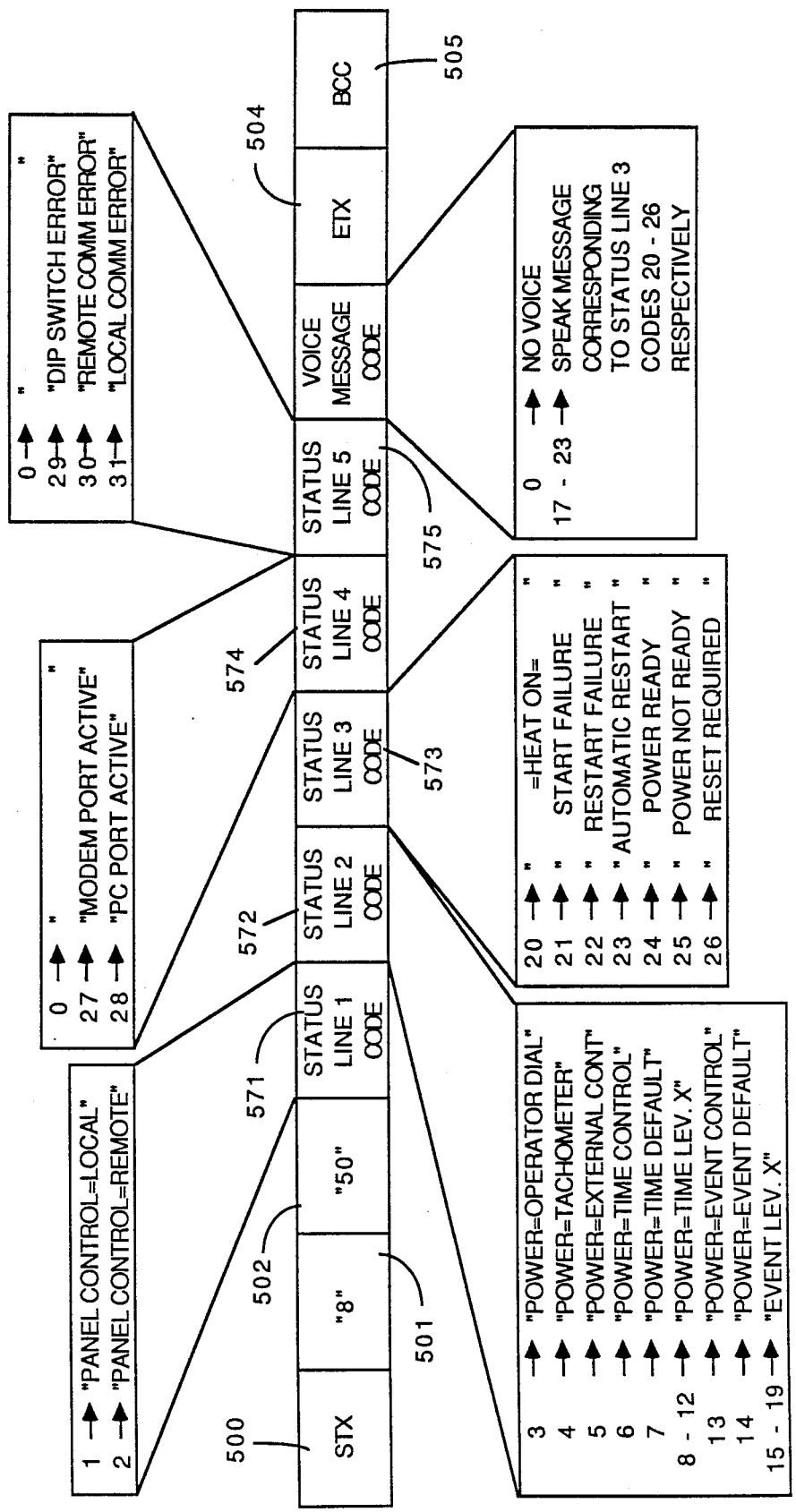
FIG. 16 is a pictorial representation of the STATUS DATA message format used in the control system of FIG. 1.

Referring to FIG. 16, a status data message is identified by a MESSAGE TYPE code 502 of "50". Following the MESSAGE TYPE code 502, the status data message contains 5 status line codes 571–575 which specify the text messages to be placed on the five status lines 91–95, respectively, on the display panel 70.

Status line 1 (#91) on the display panel 70 is used to indicate which display 20 or 21 is the controlling panel, e.g. the "master" display. The status line 1 code 571 is either "1" or "2" to indicate that the text to be placed on status line 1 91 is either "PANEL CONTROL=LOCAL" or "PANEL CONTROL CONTROL=-REMOTE", respectively.

Status line 2 (#92) is used to indicate the source which is currently being used to determine the operating power level. The status line 2 code 572 specifies a code ranging from 3 to 19, each of which specifies a text message descriptive of the current power control source.

Status line 3 (#93) is used to indicate the status of the controller 1. Status line 3 code 573 specifies a code ranging from 20 to 26. Each of the codes 20–26 specifies a text message descriptive of the currently active mode in which the controller 1 is operating.

Status line 4 (#94) is used to indicate the current state of activity by the terminals 25 and 26. The status line 4 code 574 is either 0, 27, or 28. A status line 4 code 574 of 0 indicates that neither terminal 25 or 26 is active, and specifies a line of text containing all blanks to be displayed on status line 4 (#94). If one of the terminals 25 or 26 is active, the status line 4 code 574 is set to either 27 or 28. A status line 4 code 574 of 27 specifies that the text message "MODEM PORT ACTIVE" be displayed on status line 4 (#94), and a status line 4 code 574 of 28 specifies that a text message of "PC PORT ACTIVE" be displayed on status line 4 (#94).

Status line 5 (#95) is used to indicate controller errors. Status line 5 code 575 has a value of either 0 or 29–31. A value of 0 indicates no controller errors are active and is associated with a text message containing all blanks. The values 29–31 indicate the active error condition, and cause an associated text message to be displayed on status line 5 (#95).

Figure 17:
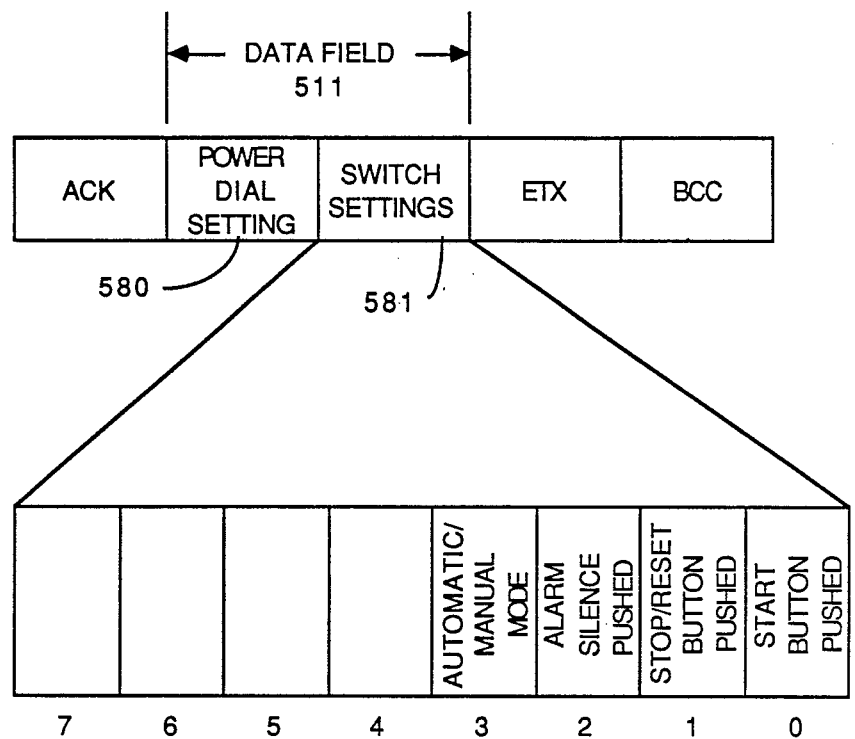
FIG. 17 is a pictorial representation of the DATA MESSAGE ACKNOWLEDGE message format used in the control system of FIG. 1.

Referring to FIG. 17, upon receipt of any of the five data messages described above, the displays 20 and 21 respond by sending a data message acknowledgement back to the controller 1. The data message acknowledgement generally conforms to the display to controller acknowledge format of FIG. 11, with the data field 511 containing a power dial setting byte 580 and a switch settings byte 581.

The power dial setting byte 580 contains an 8 bit binary value representing the most current sample of the operator control dial 55 made by the display 20 or 21. The switch setting byte 581 contains in bits 0–2 the states of the START pushbutton switch 53, the STOP/RESET pushbutton switch 54, and the ALARM SILENCE pushbutton switch 50, respectively. Bit 3 of the switch settings byte 581 specifies the most recent depression of either the MANUAL pushbutton switch 51 or AUTO pushbutton switch 52. The displays 20 and 21 maintain this information independently of the controller 1.

The controller 1 sends the five types of data messages to both displays 20 and 21, and so receives data message acknowledgements from both displays 20 and 21. However, the power dial setting byte and switch settings byte 581 from only the master display are used for operation of the controller 1. The power dial setting byte 580 and switch settings byte 581 from the slave display are discarded. A data message acknowledgement is thereby expected from both displays 20 and 21. If it is not received within a fixed timeout period, then the appropriate communications error, either local or remote, is generated.

Referring to FIGS. 18–23, a set of messages are used to command the displays 20 and 21 into either an EPP or TPP programming mode. In the EPP or TPP programming mode, the displays 20 and 21 replace the normal display on the display panel 70 with a menu containing the current values for the respective event power profiles and timed power profiles (FIGS. 3A and 3B).

Figure 18:
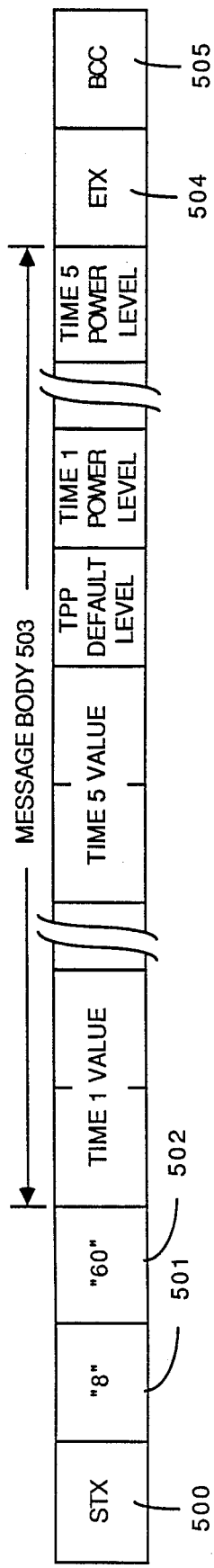
FIG. 18 is a pictorial representation of the TPP PROGRAM COMMAND message format used in the control system of FIG. 1.

Referring to FIG. 18, a MESSAGE TYPE code 502 of "60" is used to indicate a TPP PROGRAM COMMAND message. A message body 503 of the TPP PROGRAM COMMAND message includes the current values for the time increments 1–5, their five respective power levels, and the TPP default power level value.

Upon the receipt of the first TPP PROGRAM COMMAND message, the displays 20 and 21 change to the TPP programming mode, replacing the normal display on the display screen 70 with the TPP programming menu display. The time and power level values from the TPP programming message are used to fill in the initial values of the menu.

Figure 19:
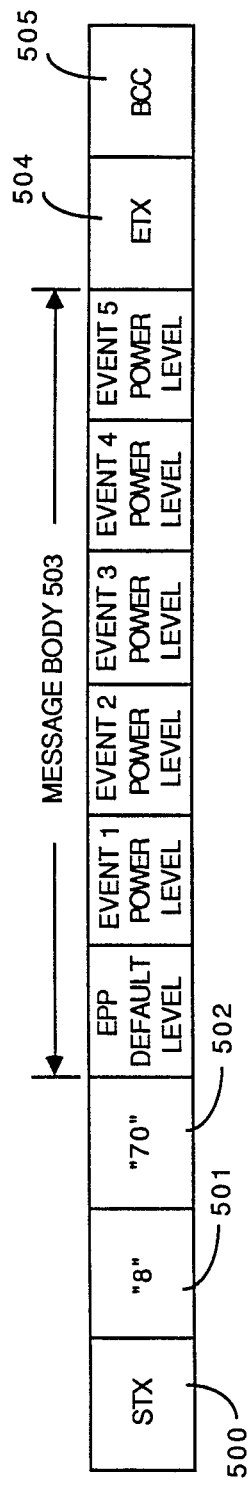
FIG. 19 is a pictorial representation of the EPP PROGRAM COMMAND message format used in the control system of FIG. 1.
Figure 21:
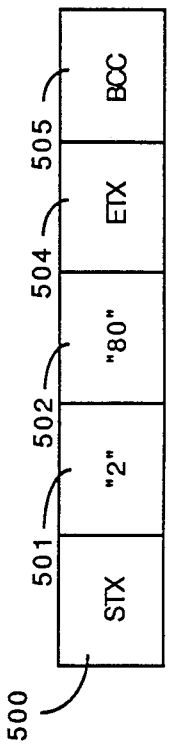
FIG. 21 is a pictorial representation of the STOP PROGRAMMING COMMAND message format used in the control system of FIG. 1.

Referring to FIG. 19, a MESSAGE TYPE code 502 of "70" specifies an EPP PROGRAM COMMAND message Like the TPP PROGRAM COMMAND message described above, when the display 20 and 21 receive the first EPP PROGRAM COMMAND message, they enter an EPP programming mode and display an EPP programming menu on the display panel 70.

Figure 20:
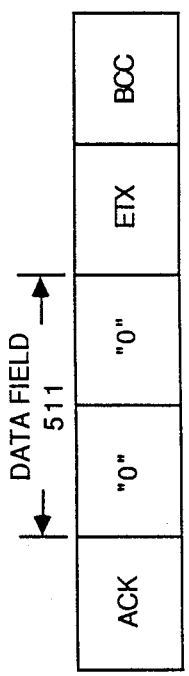
FIG. 20 is a pictorial representation of the PROGRAM ACKNOWLEDGE message format used in the control system of FIG. 1.
Figure 22:
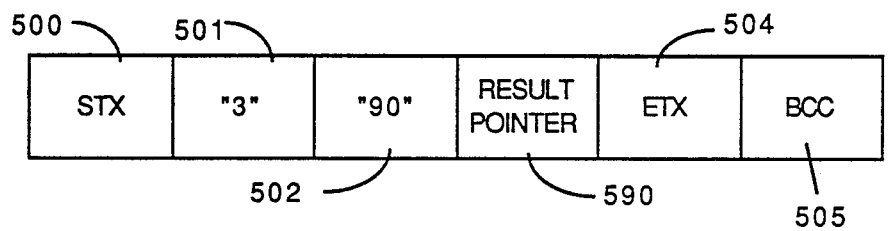
FIG. 22 is a pictorial representation of the PROGRAMMING RESULT REQUEST message format used in the control system of FIG. 1.
Figure 23:
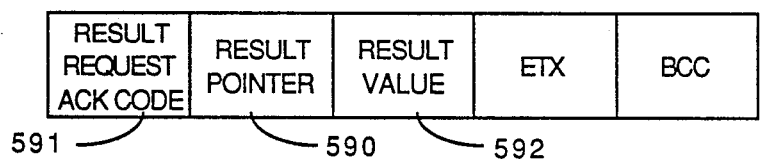
FIG. 23 is a pictorial representation of the RESULT REQUEST ACKNOWLEDGE message format used in the control system of FIG. 1.

Referring to FIG. 20, the controller 1 requires receipt of an acknowledge message from the display 20 and 21 within a fixed timeout period as described above in order to prevent indication of a communications error. Therefore, a program acknowledgement message is sent by the displays 20 and 21 to the controller 1 in response to receipt of either an EPP or TPP PROGRAM COMMAND message.

The format of the program acknowledgement message is generally that of the display to controller acknowledgement format of FIG. 11, with the data field 511 set to 0. In order to insure receipt of a program acknowledgement message periodically and within the timeout period, the controller 1 repeatedly sends TPP and EPP PROGRAM COMMAND messages on a periodic basis for as long as the controller 1 remains in the TPP or EPP programming mode, respectively.

When the controller 1 is taken out of either the EPP or TPP programming mode by switching off the appropriate dip switch 13, the controller 1 sends a STOP PROGRAMMING COMMAND message. A STOP PROGRAMMING COMMAND message is identified by a MESSAGE TYPE code equal to "80". Upon receipt of the STOP PROGRAMMING COMMAND message, the displays 20 and 21 restore the normal display to the display screen 70 and respond with a program acknowledgement message.

When the program acknowledgement message is received, any changes made in the respective TPP or EPP programming menu have been changed only in the displays 20 and 21, not the controller 1. In order for the controller 1 to obtain the results of the menu changes in the displays 20 and 21, a series of PROGRAMMING RESULT REQUEST messages are sent from the controller 1 to the displays 20 and 21. The displays 20 and 21 respond to the PROGRAMMING RESULT REQUEST messages by sending back to the controller 1 a RESULT REQUEST ACKNOWLEDGEMENT message.

The PROGRAMMING RESULT REQUEST message is identified by a MESSAGE TYPE code 502 of "90". Following the MESSAGE TYPE code 502, the PROGRAMMING RESULT REQUEST message contains a result pointer 590. Each byte of the applicable power profile, either event or time, is numbered sequentially starting from 0. The result pointer 590 specifies which byte of the applicable profile is being requested. The RESULT REQUEST ACKNOWLEDGEMENT message is identified by a unique result request acknowledge code 591 which is different than the acknowledge code 510 of other display to controller acknowledgement messages. The RESULT REQUEST ACKNOWLEDGEMENT message contains an echo of the result pointer 590 and the one byte value of the requested result 592.

PROGRAMMING RESULT REQUEST messages are sent periodically by the controller 1, each such message specifying the next sequential value of the result pointer 590 until all bytes of the applicable power profile have been received. The controller 1 then resumes the periodic transmission of the five data message types described above.

Figure 24:
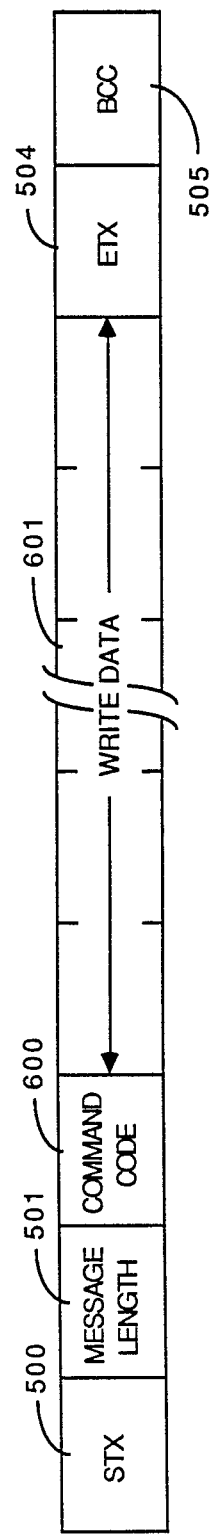
FIG. 24 is a pictorial representation of the terminal to controller message format used in the control system of FIG. 1.

Referring to FIG. 24, communications from the terminals 25 or 26 to the controller 1 utilize a terminal to controller message format. The terminal to controller message format includes the same STX character 500, message length 501, ETX character 504, and BCC character 505 as the controller to display message formats described above.

Following the message length 501 in a terminal to controller message is a command code 600. The command code 600 specifies either a request to read a particular set of data from the controller 1 or a command to write a set of data to the controller 1. The command codes 600, and the corresponding operation requested, are listed in Table 3 below:

TABLE 3

COMMAND CODES FOR TERMINAL TO CONTROLLER MESSAGE FORMAT

| Command Code | | Information Requested |
|---|---|---|
| 1 | → | History Data Request |
| 2 | → | Meter Data Request |
| 3 | → | Diagnostic Info Request |
| 4 | → | Status Data Request |
| 5 | → | Dip Switch Data Request |
| 6 | → | General Configuration Data Request |
| 7 | → | General Configuration First Write Command |
| 8 | → | General Configuration Second Write Command |
| 9 | → | Remote Input Configuration Data Request |
| 10 | → | Remote Input First Write Command |

TABLE 3-continued

COMMAND CODES FOR
TERMINAL TO CONTROLLER MESSAGE FORMAT

| Command Code | | Information Requested |
|---|---|---|
| 11 | → | Remote Input Second Write Command |
| 12 | → | EPP Data Request |
| 13 | → | EPP First Write Command |
| 14 | → | EPP Second Write Command |
| 15 | → | TPP Data Request |
| 16 | → | TPP First Write Command |
| 17 | → | TPP Second Write Command |

The controller 1 responds to a data request message from the terminals 25 or 26 by sending a response message (not shown) that contains the requested data. The types of data which may be written by the terminal 25 or 26 to the controller 1 includes general configuration data (i.e. full scale values, line voltage min. and max. values, and the GPI header lines), the remote input configuration table, the Event Power Profile, and the Timed Power Profile.

In order to insure proper transmission of these data sets, separate command codes are used to specify a first write command and a second write command for each data set. When the controller 1 receives the first write command, the data to be written is contained in a write data field 601 of the terminal to controller message. The controller 1 responds to the first write command by saving the write data 601 in a temporary buffer. The terminal 25 or 26 then sends a second write command containing identical information in the write data field 601. Upon receipt of the second write command, the controller 1 compares the write data field 601 of the second right command with the data in the temporary buffer from the first write command. If the comparison is a perfect match, the controller 1 updates its memory with the indicated data set.

Software Description

Figure 25:
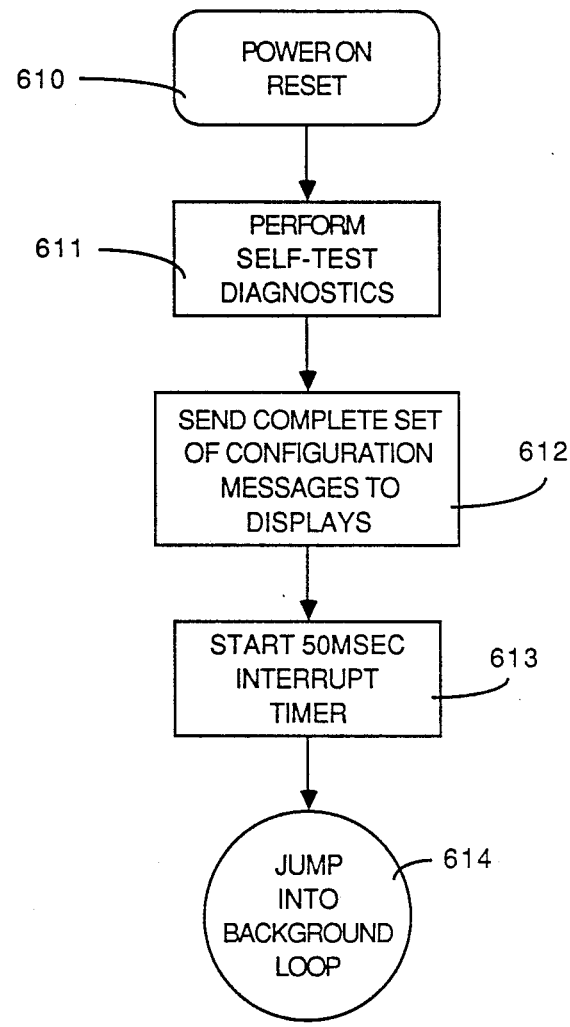
FIG. 25 is a flow chart of the POWER ON RESET routine executed by the controller of FIG. 1.

Referring to FIG. 25, the operating programs for the controller 1 begin with a reset routine 610. The first step at process block 611 is a self test diagnostics program, which checks basic hardware functions for proper operation. If the self test diagnostics check is successful, processing proceeds to process block 612.

In process block 612 a complete set of configuration messages are sent to the displays 20 and 21. These configuration messages are sent continuously until the initial configuration of all configurable variables in the displays 20 and 21 have been completed. This includes the text for fault messages 1-64, the two GPI header lines, and the set of full scale values. When all of the configuration messages have been sent, processing continues at process block 613.

In process block 613, a 50 mS interrupt timer is started, which generates an interrupt to the controller 1 every 50 milliseconds. The interrupt routine for the 50 millisecond interrupt performs all the functions for the controller 1 which are performed on a periodic basis, and also maintains counters which serve as a time reference for other programs in the controller 1.

Processing then continues at step 614, which is an unconditional jump into a background loop. Processing then remains in the background loop until the controller 1 is once again reset.

Figure 26:
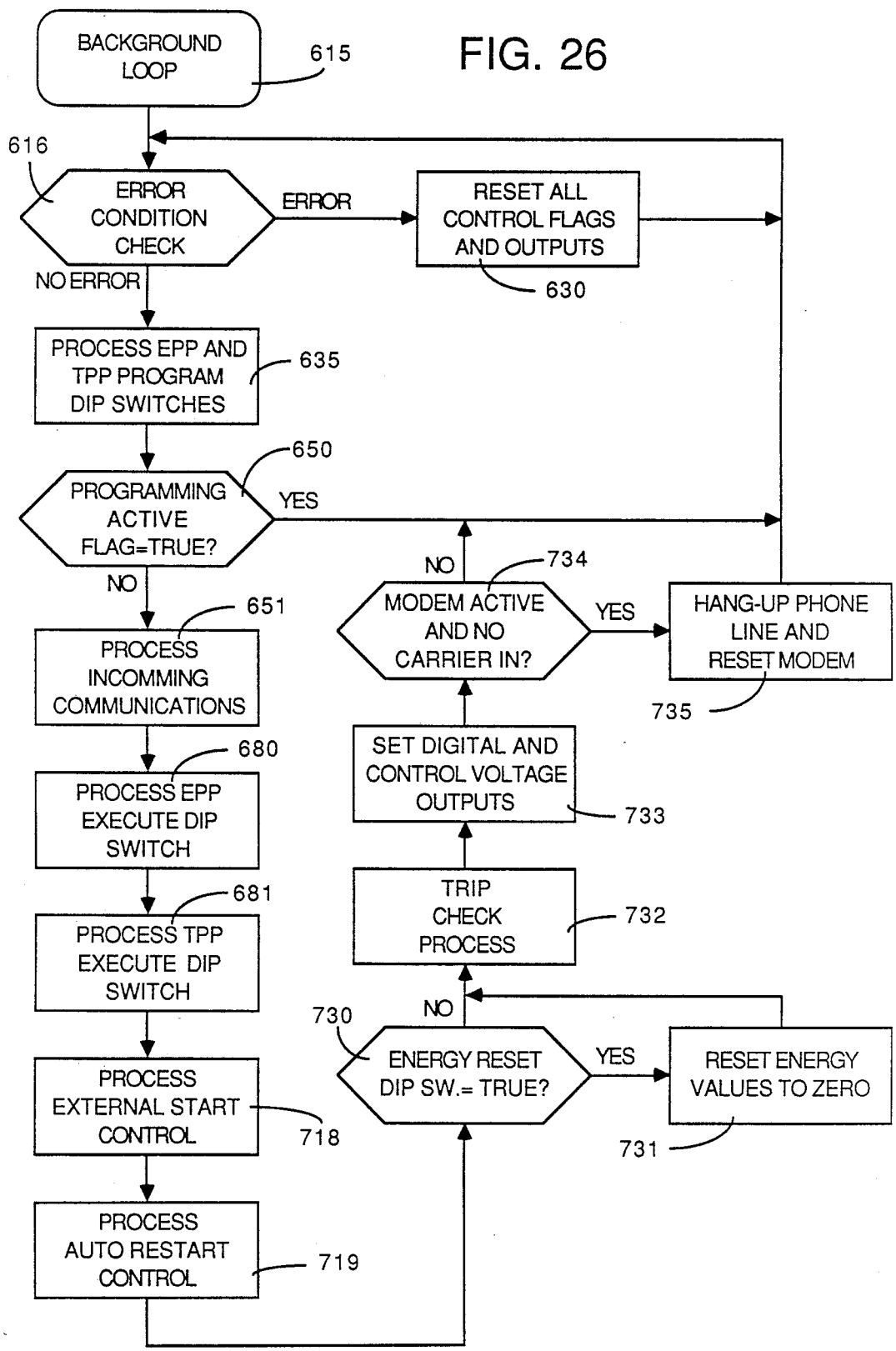
FIG. 26 is a flow chart of the BACKGROUND LOOP program called by the POWER ON RESET routine of FIG. 26.

Referring to FIG. 26, the background loop begins processing at entry point 615 and proceeds to decision block 616. In decision block 616 an error condition check procedure is executed to check for the existence of several possible error conditions within the controller 1 before proceeding on in the background loop.

Figure 27:
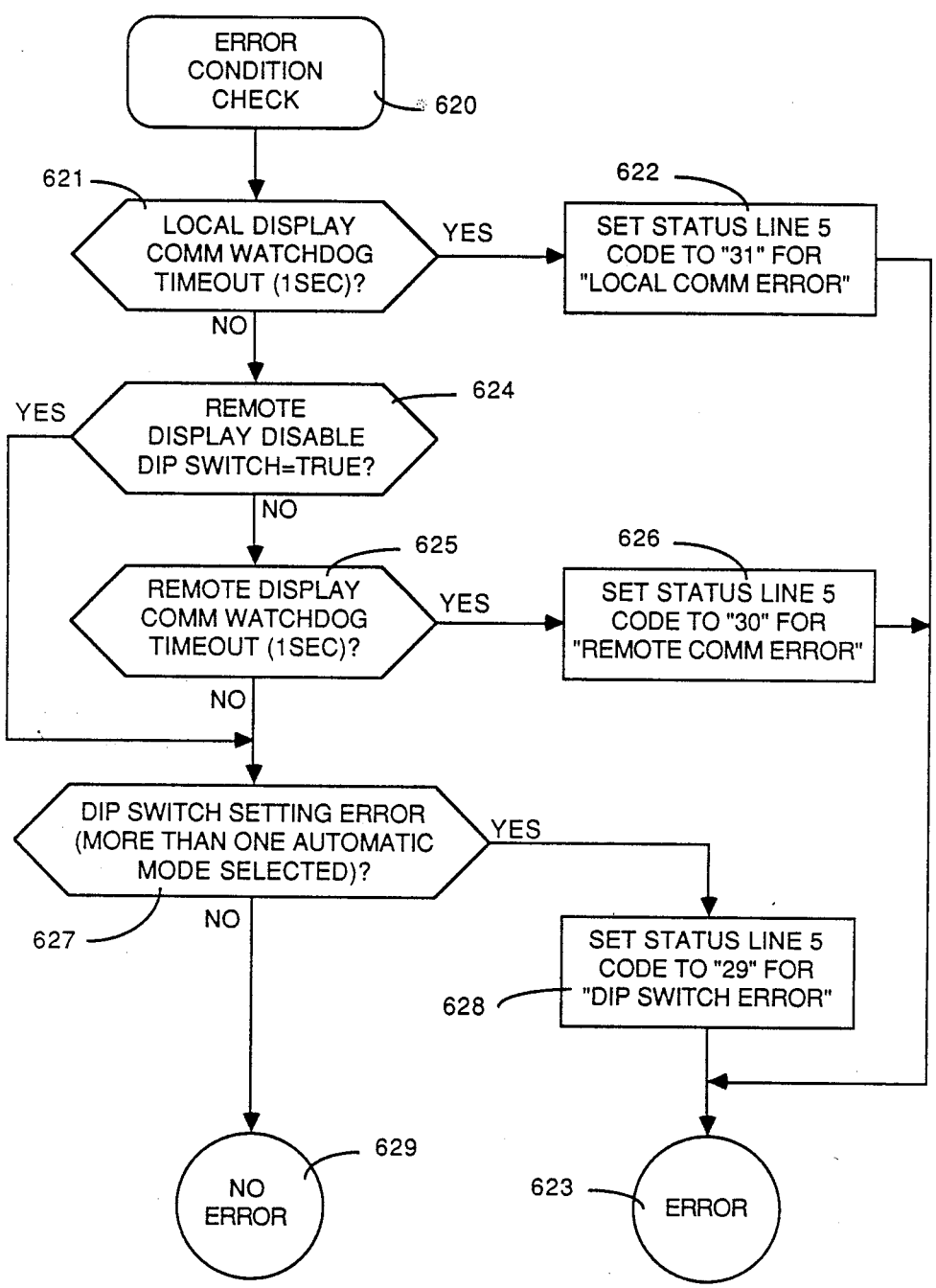
FIG. 27 is a flow chart of the ERROR CONDITION CHECK process of the background loop of FIG. 26.

Referring to FIG. 27, the error condition check procedure begins at entry point 620 and proceeds to decision block 621. In decision block 621, a check is made to determine if a watchdog timeout of one second has occurred without receiving an acknowledge message from the local display 20. If it has, then a branch is taken to process block 622. In process block 622, the status line 5 code 575 in a status data message buffer (not shown) is set to "31", the code for "LOCAL COMM ERROR". After setting the status line 5 code in block 622, error exit 623 is taken to exit the error condition check.

If at decision block 621 a timeout has not occurred on the local display, then processing transfers to decision block 624. One of the dip switches 13 is dedicated to allow the remote display 21 to be disabled, i.e. taken out of the system. This provision allows the system to be operated without a remote display, since otherwise the remote communications would be continually flagged as bad if a remote display were not physically present.

In decision block 624, if the dip switch 13 assigned to disable the remote display 21 is not set, then a remote display is expected to be in the system and processing transfers to decision block 625.

In decision block 625, a watchdog timer is tested to see if it has timed out by not receiving an acknowledgement from the remote display 21 within a one second timeout period. If a timeout has occurred, control transfers to block 626 where the status line 5 code 575 is set to "30", the code for "REMOTE COMM ERROR". From block 626, error exit 623 is taken out of the error condition check 616.

If either the remote display disable switch was set or the remote display had not timed out, control transfers to decision block 627. In decision block 627, a test is made to see if a dip switch setting error exists. A dip switch wetting error is a condition in which more than one automatic mode is selected. If this error condition exists, control transfers to block 628 where the status line 5 code 575 is set to "31", the code for "DIP SWITCH ERROR". From block 628, error exit 623 is taken out of the error condition check 616.

If at decision block 627 a dip switch setting error was not detected, then none of the error conditions has occurred and the "no error" exit 629 is taken.

Referring again to FIG. 26, if the error condition check 616 results in an error exit, then control transfers to block 630 where all control flags and outputs are put in a reset condition, e.g. the power supply 2 is stopped. From block 630, control is transferred back to decision block 616 where the error condition check is again performed. Processing therefore stays in this error loop until all error conditions are cleared. When all error conditions have been cleared, then the "no error" exit is taken from decision block 616 and control transfers to process block 635.

Two switch positions on the dip switches 13 are allocated to setting the EPP and TPP programming modes, respectively. In process block 635, these switches are tested to determine if TPP or EPP programming has been commanded by the setting of either of these switches.

Figure 28:
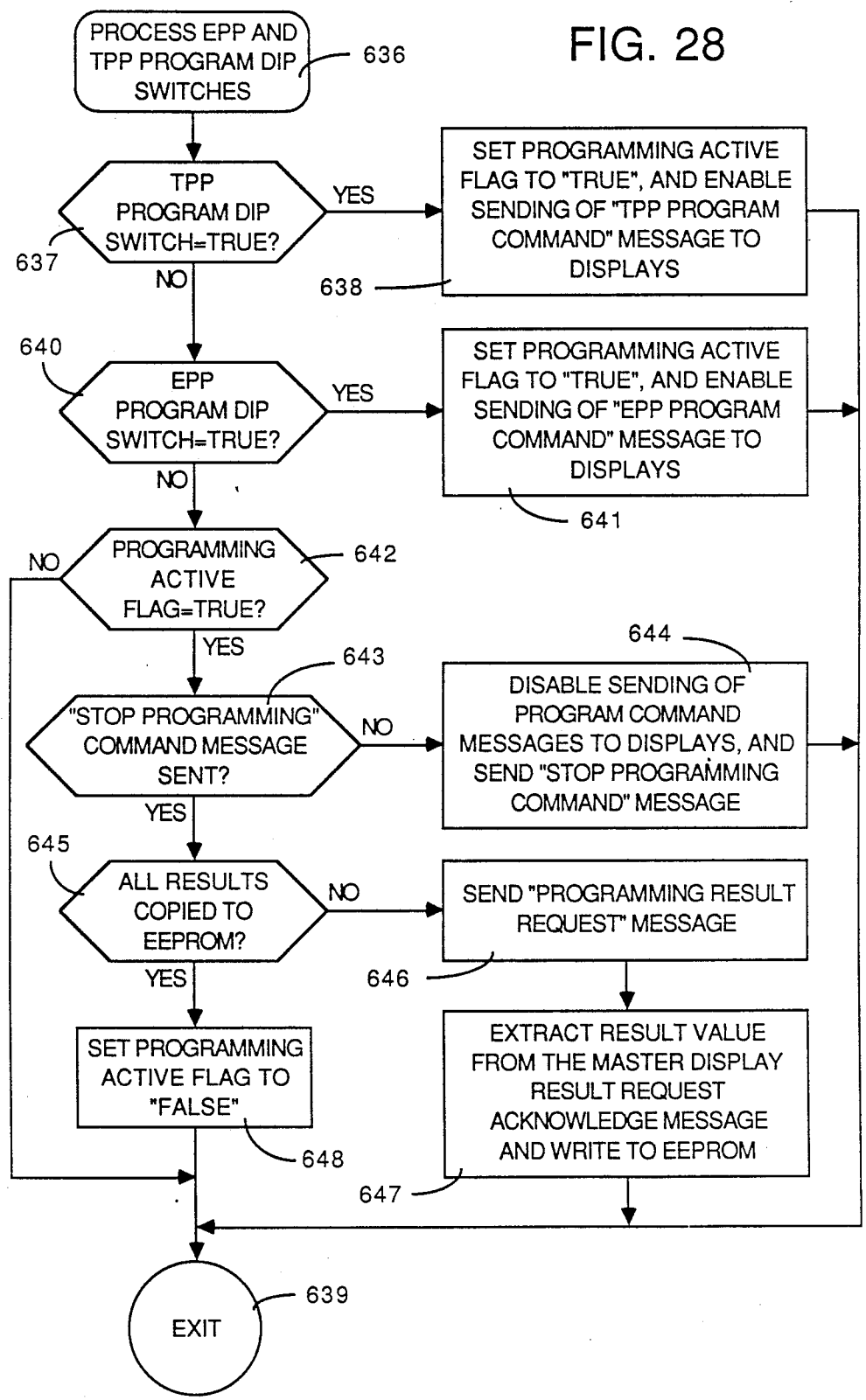
FIG. 28 is a flow chart of the EPP PROGRAM and TPP PROGRAM dip switch processing of the BACKGROUND LOOP of FIG. 26.

Referring to FIG. 28, processing of the EPP and TPP program dip switches proceeds from entry point 636 to decision block 637. In decision block 637, a test is made to determine if the TPP program dip switch is set. If it is, then control transfers to block 638 where the following actions are taken.

First, a PROGRAMMING ACTIVE flag is set true. The PROGRAMMING ACTIVE flag is used to indicate to the background loop that programming is in progress, thereby inhibiting other control functions.

Secondly, the 50 millisecond interrupt routine is enabled to periodically send the TPP PROGRAM COMMAND message to the displays 20 and 21. As described above, the TPP PROGRAM COMMAND messages are sent continuously as long as the TPP program dip switch remains set. This is done so that periodic acknowledgements are received from the displays 20 and 21 keeping their respective watchdog timers from timing out. After the processing in block 638 is complete, the PROCESS EPP AND TPP PROGRAM DIP SWITCHES routine is exited at 639.

If the TPP program dip switch is not set at decision block 637, the processing proceeds to decision block 640, where a similar test is made for the EPP program dip switch. If the EPP program dip switch is set, then processing transfers to block 641. In process block 641, the PROGRAMMING ACTIVE flag is set true, and the 50 millisecond interrupt routine is enabled to begin sending of the EPP PROGRAM COMMAND message to the displays 20 and 21. Again, the transmission of the EPP PROGRAM COMMAND message to the displays 20 and 21 continues for as long as the EPP program dip switch is set true.

If the EPP program dip switch is not set true in decision block 640, then control transfers to decision block 642 where a test is made to see if the PROGRAMMING ACTIVE flag is true. This condition will exist after either the TPP or EPP program dip switch had been on and is now switch off. In that case, the PROGRAMMING ACTIVE flag will still be set, and control transfers to decision block 643.

At decision block 643, if a STOP PROGRAMMING COMMAND message has not been sent, then control transfers to block 644. In process block 644 the sending of program command messages, either TPP or EPP, is disabled in the 50 millisecond interrupt routine, and the STOP PROGRAMMING COMMAND message is sent. From process block 644, exit 639 is taken.

Back at decision block 643, if a STOP PROGRAMMING COMMAND message has been sent, then control transfers to decision block 645. After sending the STOP PROGRAMMING COMMAND message, a series of PROGRAMMING RESULT REQUEST messages are sent to read the results of the EPP or TPP programming from the master display. At decision block 645, a test is made to see if all of the results of the programming, either TPP or EPP, have been copied to the EEPROM 107. If not, then control transfers to block 646 where another PROGRAMMING RESULT REQUEST message is sent to the displays 20 and 21.

From block 646, control transfers to block 647 where the RESULT REQUEST ACKNOWLEDGE message is awaited. Both displays 20 and 21 respond with a RESULT REQUEST ACKNOWLEDGE message. However, only the values from the display which is designated as the master display are used. The results from the slave display are discarded. The programming result which was requested is extracted from the RESULT REQUEST ACKNOWLEDGE message of the master display and written to the corresponding location in the EEPROM 107. From process block 647, exit 639 is taken.

If at decision block 645 all of the results have been copied to EEPROM 107, then control transfers to process block 648. Process block 648 sets the PROGRAMMING ACTIVE flag false, thereby terminating this programming session. From block 648, control is transferred to exit 639. Since the PROGRAMMING ACTIVE flag is set false when the programming is complete, in future passes through the EPP and TPP program dip switch process, the test at decision block 642 will be found to be false and a branch will be taken directly to exit 639.

Referring again to FIG. 26, after completing the EPP and TPP program dip switch processing at block 635, a test is made at decision block 650 to determine if the PROGRAMMING ACTIVE flag is true. If it is, then either EPP or TPP programming is in process, and no further processing is to be performed by the background loop. In that case, control transfers back to the error condition check at decision block 616. The background loop stays in this programming loop until the PROGRAMMING ACTIVE flag is reset upon completion of the EPP or TPP programming.

Figure 29:
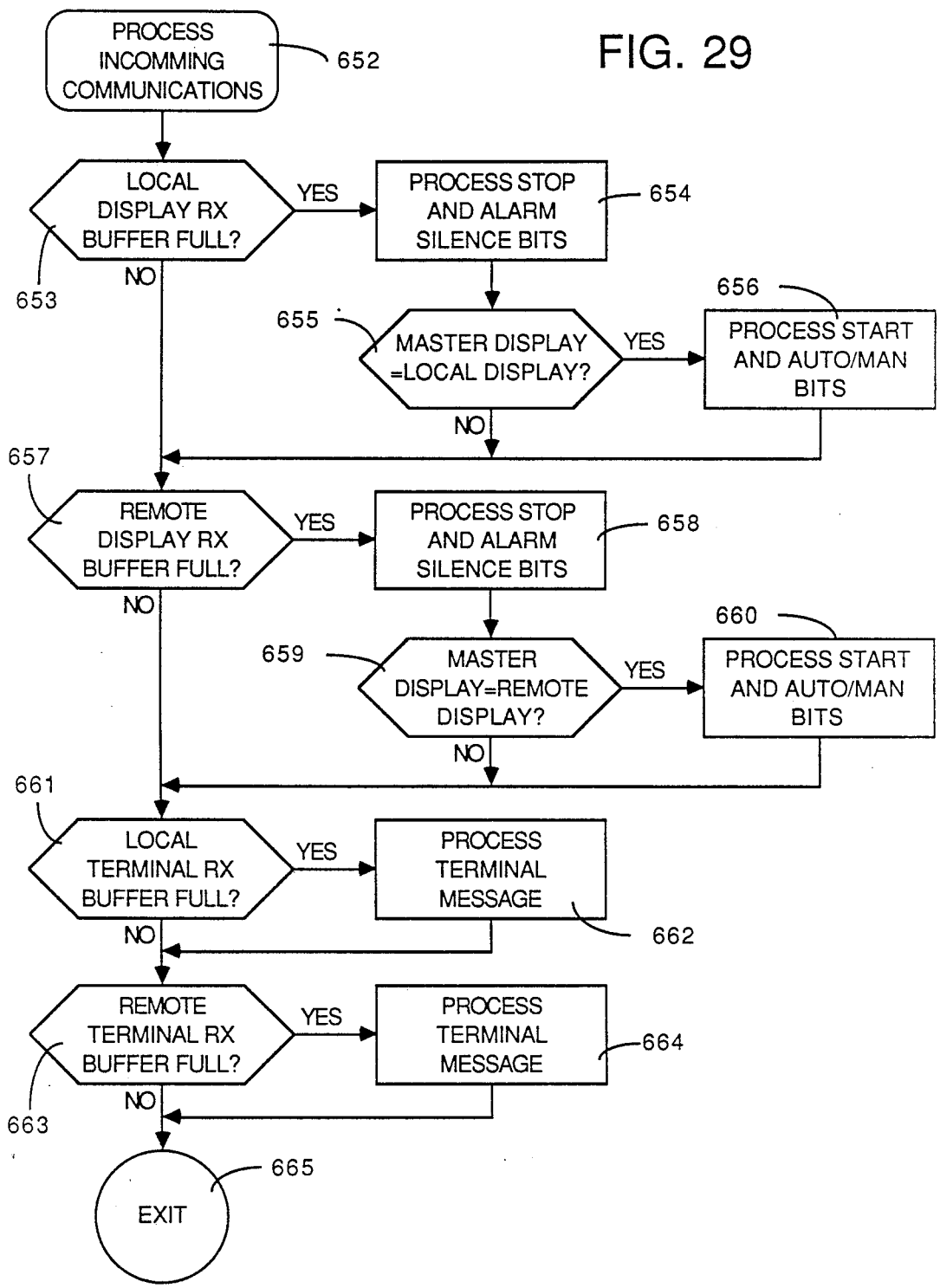
FIG. 29 is a flow chart of the INCOMING COMMUNICATIONS process of the BACKGROUND LOOP of FIG. 26.

If the PROGRAMMING ACTIVE flag at decision block 650 is false, then the background loop continues at process block 651 with an INCOMING COMMUNICATIONS process. Referring to FIG. 29, the incoming communications process begins at entry point 652 and proceeds to decision block 653. In decision block 653, a test is made to determine if an incoming message has been received in a local display receive (RX) buffer. If it has, then processing continues at process block 654.

At this point, the incoming message in the local display RX buffer can only be a data message acknowledgement, which contains the current setting of the operator control dial 55 and a switch settings byte 581 which contains the most current switch settings. At process block 654, the STOP and ALARM SILENCE bits of the switch settings byte 581 are tested. If either or both of these bits are set, the indicated operation is performed. Processing then proceeds from process block 654 to decision block 655.

In decision block 655, a test is made to determine if the local display 20 is selected as the master display by the MASTER DISPLAY SELECT switch 14. If it is, then the START BUTTON PUSHED and AUTOMATIC/MANUAL MODE bits of the switch settings byte 581 (FIG. 17) are processed in process block 656. If the START BUTTON PUSHED bit of the switch settings byte 581 is set, then the START signal 180 to the power supply 2 is activated. The mode of the controller 1 is set according to the state of the AUTOMATIC/MANUAL MODE bit in the switch settings byte 581.

Blocks 653, 655 and 656 all exit to the next step in the INCOMING COMMUNICATIONS PROCESS at decision block 657. Process blocks 657, 658, 659, and 660 perform the process described above for the local display on the communications received, if any, from the remote display 21. Processing then continues at decision block 661.

Decision block 661 tests for the completion of an incoming message from the local terminal 25. If so, then the incoming message from the terminal is processed at process block 662. A similar process is then performed at decision blocks 663 and 664 in relation to a message from the remote terminal 26, if any. After this processing, the INCOMING COMMUNICATION PROCESS exits at 665.

Figure 30:
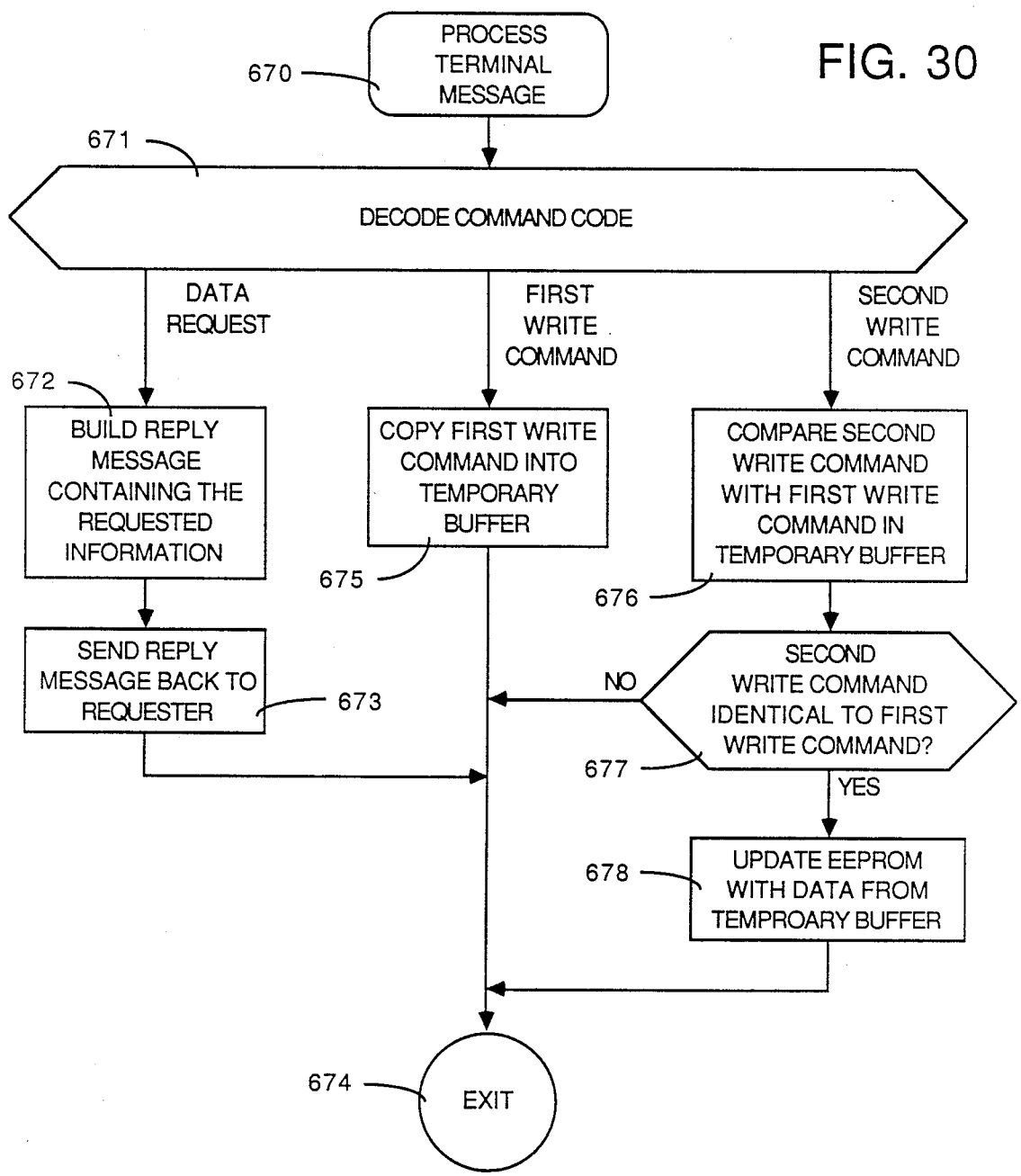
FIG. 30 is a flow chart of the TERMINAL MESSAGE PROCESSING of the BACKGROUND LOOP of FIG. 26.

The processing of terminal messages performed in blocks 662 and 664 are similar. Referring to FIG. 30, the processing of terminal messages begins at entry point 670 and proceeds to decision block 671. In decision block 671, the COMMAND code 600 of the incoming message, either from terminal 25 or 26, is decoded to specify either a data request, a first write command, or a second write command.

If the COMMAND code 600 specifies a data request, control transfers to block 672 where the requested data is placed into a reply message and transmitted back to the requesting terminal 25 or 26 at process block 673. The terminal message process then exits at 674.

If the COMMAND code 600 at decision block 671 specifies a first write command, then the first write command is copied into a temporary buffer, awaiting receipt of a second write command. The terminal message process then exits at 674.

If the command code 600 at decision block 671 is a second write command, then control transfers to process block 676, where the second write command is compared with the contents of the first write command in the temporary buffer. Then at decision block 677, a test is made to determine if the second write command is identical to the first write command contained in the temporary buffer. If it is, then control transfers to process block 678, where EEPROM 107 is updated with the data in the write data field 601 of the incoming second write command message. If the second write command is not identical to the first write command, then the EEPROM 107 is not updated and the exit 674 is taken out of the terminal message processing.

Referring again to FIG. 26, after the INCOMING COMMUNICATIONS PROCESS is complete at block 651, processing continues to process blocks 680 and 681 to process the EPP and TPP EXECUTE dip switches, respectively. The EPP and TPP execute modes are two of the automatic control modes provided by this invention, and each is enabled by one of the dip switches 13.

Referring to FIG. 31, the controller 1 provides a manual control mode and three automatic control modes: a Timed Power Profile (TPP) execute mode, an Event Power Profile (EPP) execute mode, and an external control mode. The manual mode is enabled when the AUTO and MANUAL pushbutton switches 51 and 52 on the master display were last set to the "manual" position. In the manual mode, the control voltage 153 which sets the operating power level for the power supply 2 is taken from the master display operator power dial 55.

All of the automatic control modes require that the AUTO and MANUAL pushbutton switches 51 and 52 on the master display be in the "auto" position. Then, a TPP enable switch, as one of the dip switches 13, must be switched on to enable the TPP execute mode. Similarly, an EPP enable dip switch 13 must be on to enable the EPP execute mode. If neither of these dip switches 13 are on, and the automatic mode is enabled by the AUTO and MANUAL pushbutton switches 51 and 52 on the master display, then the external control mode selected.

In the automatic control modes, the control voltage is derived as described below.

Figure 32:
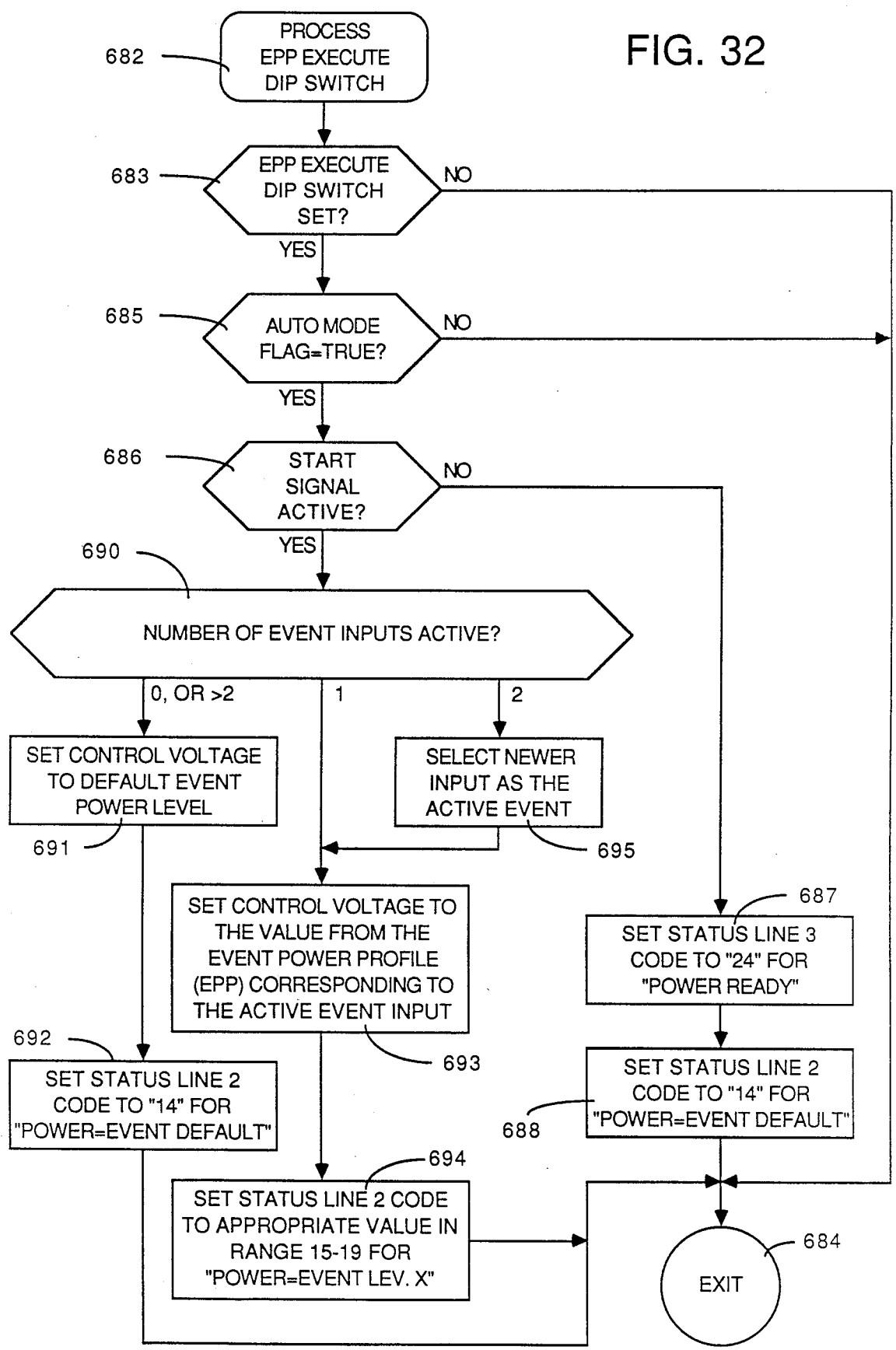
FIG. 32 is a flow chart of the EPP EXECUTE dip SWITCH processing of the BACKGROUND LOOP of FIG. 26.

Referring to FIG. 32, the EPP EXECUTE dip switch process begins at entry point 682 and proceeds to decision block 683. In decision 683, the EPP EXECUTE dip switch is tested. If it is not set, then the EPP execute control mode is not enabled, and a branch is taken directly to exit 684. If the EPP EXECUTE dip switch is set, then processing continues at decision block 685.

In process block 685, a test is made to determine if the automatic mode is enabled. An AUTO MODE flag is set according to the AUTOMATIC/MANUAL MODE bit of the switch settings byte 581 of the most recent data message acknowledgement received from the master display. If the AUTO MODE flag is not set, then the automatic mode is not enabled and the branch is taken directly to exit 684.

If at decision block 685 the AUTO MODE flag is true, then processing continues at decision block 686. In decision block 686 a test is performed to determine if the START signal 180 to the power supply 2 has been activated, e.g. is the power supply 2 running? If not, then a branch is taken to process block 687, where status line 3 code 573 is set to "24", the code for "POWER READY",. This indicates that the controller 1 is waiting to be started, as described below. From block 687, processing continues at block 688, where status line 2 code 572 is set to "14", the code for "POWER=EVENT DEFAULT". After process block 688, a branch is taken to exit 684.

Back at decision block 686, if the START signal 180 is active, then a branch is taken to decision block 690. In decision block 690, the EVENT inputs 325 are examined to determine the number of EVENT inputs 325 that are active. Normally, only one event input 325 is expected to be active at any one time. However, it is possible that two EVENT inputs 325 may overlap, one becoming active before the other is deactivated. If more than two EVENT inputs 325 are active, then it is considered an error condition and the control voltage is set to the default value.

If in decision block 690 the number of EVENT inputs 325 active is zero, or more than 2, then the control voltage is set to the default power level in process block 681. Then in process block 692, status line 2 code 572 is set to "14", the code for "POWER=EVENT DEFAULT". From process block 692, a branch is taken to exit 684.

If only one of the EVENT inputs 325 are active, then control transfers from decision block 690 to process block 693. In process block 693, the control voltage is set to the value from the Event Power Profile (EPP) table corresponding to the active EVENT input 325. Processing then continues at process block 694 where the status line 2 code 572 is set to a value from "8" to "12", corresponding to the message "POWER=TIME LEV.X", where "X" is replaced with the number of the active EVENT input 325. From process block 694 a branch is taken to exit 684.

If at decision block 690, exactly two of the EVENT inputs 325 are active, then control transfers to block 695, where the newer EVENT input 325 is selected as the active event. From process block 695 control transfers to process block 693 where processing continues as described above for a single active event input.

Figure 33:
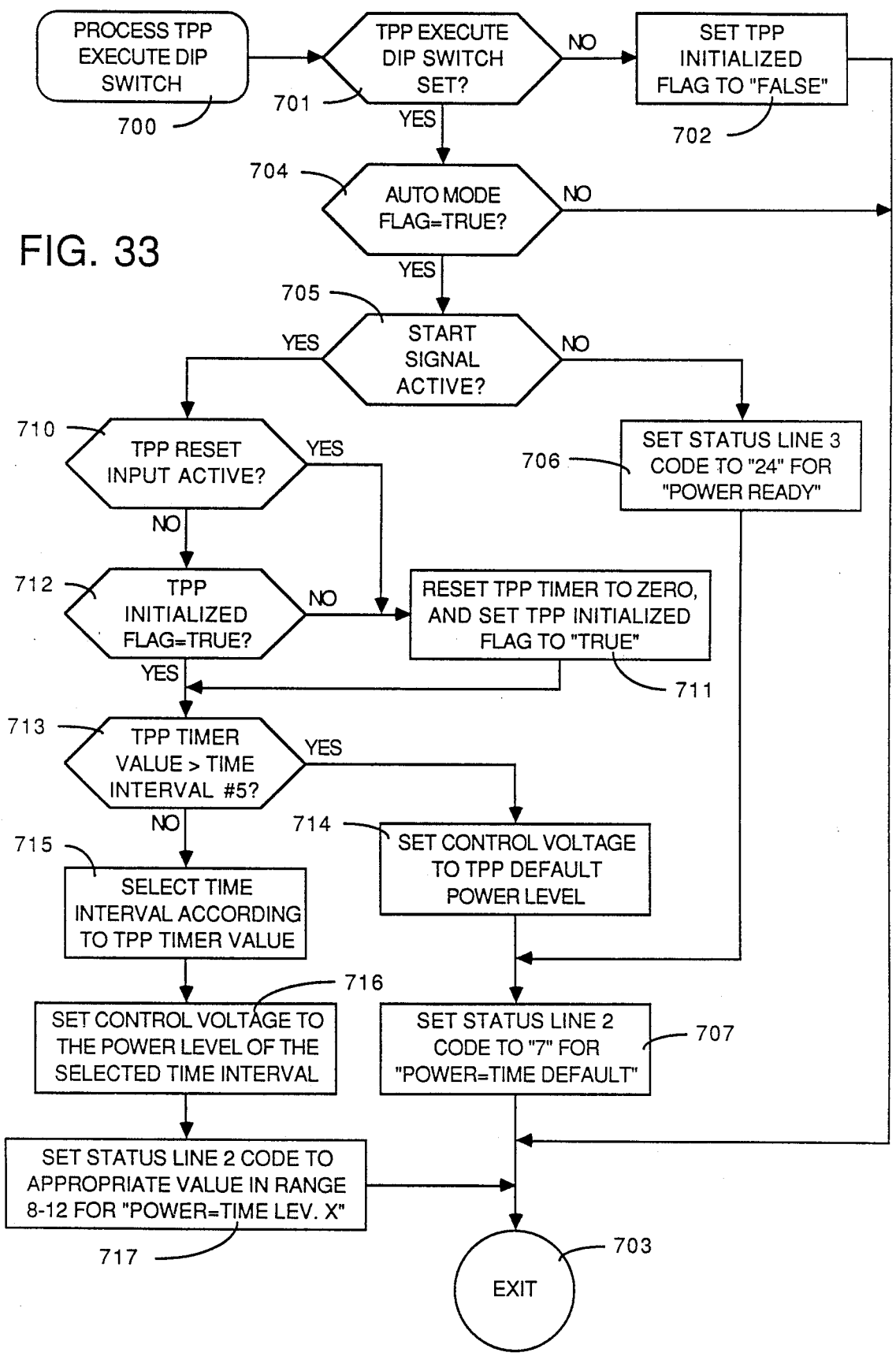
FIG. 33 is a flow chart of the TPP EXECUTE DIP SWITCH processing of the BACKGROUND LOOP of FIG. 26.

Referring to FIG. 33, the processing for the TPP EXECUTE dip switch begins at entry point 700 and proceeds to decision block 701. In decision block 701 the TPP EXECUTE dip switch is examined. If it is not set, then the TPP execute mode is disabled and control transfers to process block 702. In process block 702, a TPP INITIALIZED flag is set to "false". The TPP INITIALIZED flag is used to determine when a TPP execute process is first started so that the associated timers and counters can be reset accordingly.

From process block 702 a branch is taken directly to exit 703. If at decision block 701, the TPP EXECUTE dip switch is set, then control transfers to decision block 704.

In decision block 704, a test is made to determine if the automatic mode is enabled, e.g. by the AUTO pushbutton 52 on the master display. If it is not, then a branch is taken directly to exit 703. Otherwise, processing continues at decision block 705.

In decision block 705, the state of the START signal 190 is tested. If it is not active, e.g. the power supply 2 is not running, then control transfers to process block 706. In process block 706 the status line 3 code 575 is set to "24", the code for "POWER READY". This indicates that the controller 1 is waiting to be started. From process block 706, control transfers to process block 707, where the status line 2 code 572 is set to "7", the code for "POWER=TIME DEFAULT". From process block 707, a branch is taken to exit 703.

If at decision block 705 the START signal 190 has been activated, then control transfers to decision block 710. In decision block 710, the TPP reset signal 323 is examined. If it is active, then control transfers to process block 711. At process block 711, the timer used to time the TPP execute process is reset to zero and the TPP INITIALIZED flag is set to "true". At this point, the TPP execute process is initialized.

If, on the other hand, the TPP reset input is not active at decision block 710, then processing continues at decision block 712. At decision block 712, the TPP INITIALIZED flag is tested. On the first time through the TPP execute process, the TPP INITIALIZED flag will not be true, and a branch will be taken to process block 711, where the TPP execute process is initialized as described above. In subsequent passes through this loop, the TPP INITIALIZED flag will remain true until reset by switching the TPP EXECUTE dip switch off. If the TPP INITIALIZED flag is true at decision block 712, then processing continues at decision block 713.

At decision block 713, the current timer value is tested to see if it is greater than the highest time interval, time interval number 5. If it is, then the entire Timed Power Profile has been executed, and control transfers to process block 714 to set the control voltage back to the TPP default power level. From process block 714 control transfers to process block 707 to set the status line 2 code to "7", the code for "POWER=TIME DEFAULT", as described above.

If the timer value does not exceed time interval number 5 at decision block 713, then the Timed Power Profile is still active and control transfers to process block 715. In process block 715, the current timer value is compared to each of the time values in the Timed Power Profile to determine the time interval corresponding to the current timer value. Then in process block 716, the power level from the selected time interval is used to set the control voltage 153.

Then at process block 717 status line 2 code 572 is set to a value from "8" to "12", corresponding to the message "POWER=TIME LEV.X", where "X" is replaced with the appropriate time interval number. From process block 717 a branch is taken to exit 703.

Referring again to FIG. 26, after the processing of the EPP and TPP EXECUTE dip switches of blocks 680 and 681, respectively, control transfers to process block 718. In process block 718, the EXTERNAL START input 322 is tested. If it is active, and the controller 1 has been placed in the "power ready" state by previous activation of the START pushbutton 53 on the master display, then the START signal 180 to the power supply 2 is activated. After process block 718, processing continues at process block 719.

Figure 34:
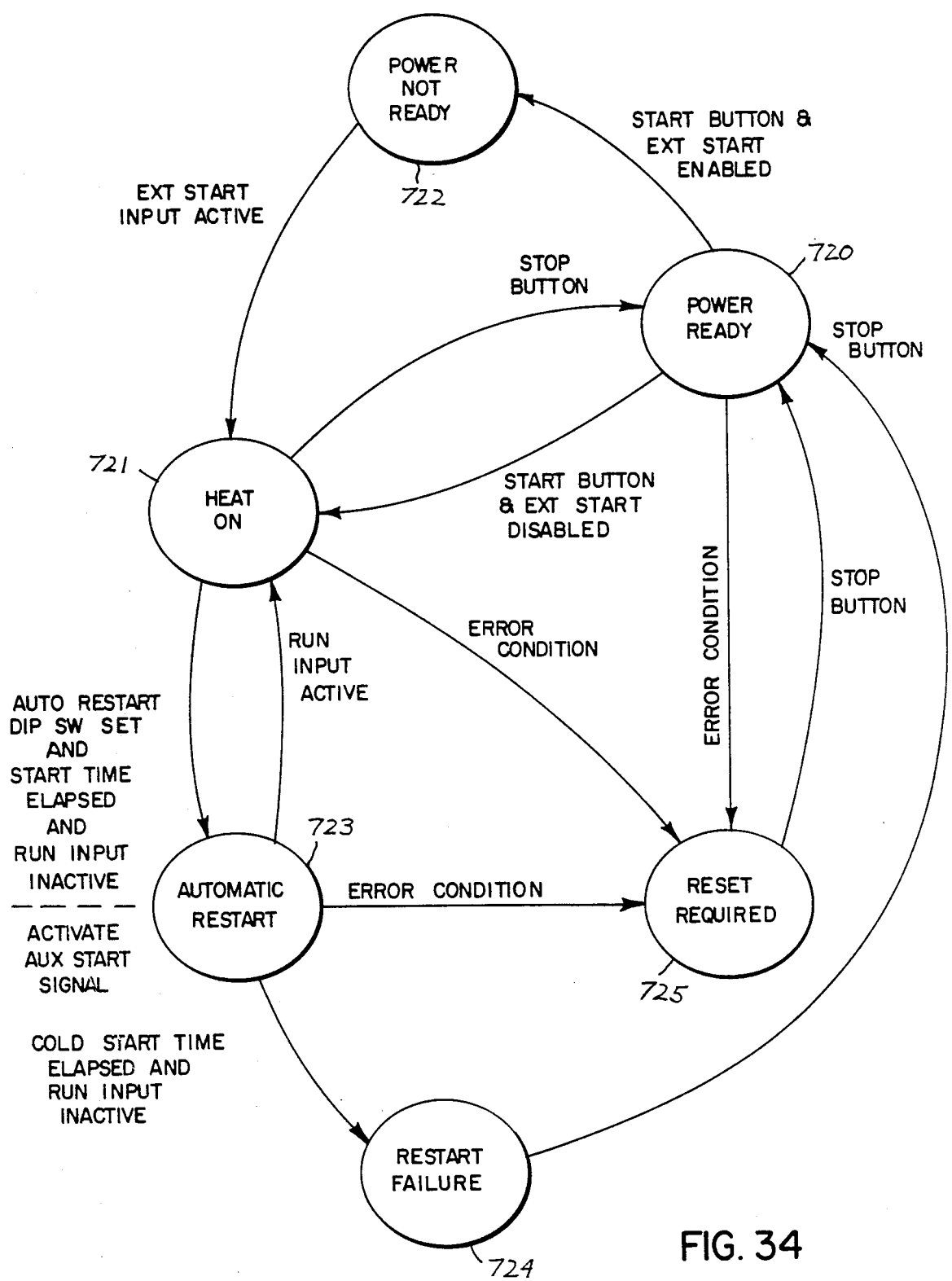
FIG. 34 is a state diagram illustrating the automatic restart function of the control system of FIG. 1.

Process block 719 is the automatic restart control processing. Referring to FIG. 34, one of the dip switches 13 is used to enable an automatic restart mode. The automatic restart mode functions as follows. The controller 1 is normally in a "power ready" state 720. The controller 1 advances to a "heat on" state 721 if the external start mode disabled and the START button on the master display is depressed. If the external start mode is enabled, then depressing the START button on the master display puts the controller 1 into a "power not ready" state 722. In the latter case, when the EXTERNAL START input 322 is activated, the "heat on" state 721 is entered from the "power not ready" state 722.

In the heat on state 721, the START signal 180 to the power supply 2 is activated. If the automatic restart dip switch is off, then the controller 1 will remain in the "heat on" state 721 whether or not the power supply 2 actually starts, as indicated by activation of the RUN signal 197. If the automatic restart dip switch is set, then as soon as the "heat on" state 721 is entered, a timer starts running towards a START TIMEOUT value.

The START TIMEOUT value is one of the configuration variables maintained in the EEPROM 107, and is set to a time within which the power supply 2 is expected to activate the RUN signal 197. If the time specified by the START TIMEOUT value elapses without the RUN signal 197 being activated by the power supply 2, then an "automatic restart" state 723 is entered, and the AUXILIARY START signal 181 to the power supply 2 is activated. The AUXILIARY START signal 181 may be connected to circuits within the power supply 2 which may facilitate starting if the standard START signal 180 fails to start the power supply 2.

In the "automatic restart" state 723, if the RUN input 97 becomes active, the "heat on" state 711 is reentered, and the start cycle is complete.

A second time value called the COLD START time is measured from the time that the "automatic restart" state 723 is entered. If the controller 1 remains in the "automatic restart" state 712 long enough for the COLD START time to elapse without the RUN input 197 becoming active, then a "restart failure" state 724 is entered. The only exit from the "restart failure" state 724 is the depression of the STOP/RESET pushbutton 54 on the master display, causing the controller 1 to reenter the "power ready" state 720.

In any of the states 720, 721 or 723, if an error condition is detected, a "reset required" state 714 is entered. The controller 1 then remains in the "reset required" state 714 until the STOP/RESET pushbutton 54 on either display 20 or 21 is depressed.

Referring again to FIG. 26, after processing the automatic restart control in block 719, processing continues at decision block 730. Two of the operational information elements maintained by the controller 1 are the input and output energy values calculated from the input and output power inputs, respectively. One of the dip switches 13 is connected as an energy reset switch to allow these energy values to be reset to zero. In decision block 730, the energy reset dip switch is tested, and if it is true then the energy values are reset at process block 731. Processing then continues at process block 732.

At process block 732, a trip check is performed, in which a set of trip conditions are checked. The trip conditions include the TRIP input signal 321, an active condition on any of the remote inputs 11 which are configured as alarms, and a restart failure by the automatic restart control. If any of these conditions exist, the power supply 2 is stopped by removing the START signal 180 and setting the control voltage 153 to zero. Otherwise, processing proceeds to process block 133.

In process block 733, the digital outputs 180–184, the +REF and −REF signals 154 and 155, respectively, and the control voltage 153 are all set according to the values established by the current pass through the background loop. Processing then proceeds to decision block 734.

In decision block 734, a test is made to determine if the modem 125 is active, e.g. in an "off hook" condition. If it is, and no carrier is being detected on the incoming phone line, then a branch is taken to process block 735 where the necessary signals are issued to the modem 125 to restore the phone line 28 to an "on hook" condition and reset the modem. After the modem processing, a branch is taken back to the top of the background loop to the error condition check 616.

We claim:

1. A control system in combination with an inverter power supply comprising:
    input means for measuring at least one operational signal from within the inverter power supply, the input means producing at least one operational value based on the operational signals measured;
    controller means for generating a set of operational information elements, each operational information element being calculated by the controller means according to a predetermined formula based on at least one of the operational values received from the input means, wherein the controller means periodically samples each operational value and updates the set of operational information elements;
    display means for providing operator interface for the controller means, the display means including visual indicates means, the visual indicating means including a first indicating area for sequentially displaying the value of one operational information element at a time from the set of operational information elements; and
    sequencing means in the controller means for alternating the operational information element value being displayed in the first indicating area on a cyclical basis by sequentially displaying the value of one operational information element for a predetermined period of time and then automatically changing the first indicating area to display a different operational information element value.

2. The control system of claim 1 in which the sequencing means includes selection means for designating a selected subset of the set of operational information elements, wherein only the values of the selected subset of operational information elements are included in the sequential display cycle.

3. The control system of claim 2 in which the input means produces at least one operational value based on a combination of more than one measured operational signal.

4. The control system of claim 2 in which the first indicating area of the visual indicating means includes a graphic representation of a bar graph meter to indicate the value of the operational information element being displayed and indicia indicating the operational information element being displayed.

5. The control system of claim 4 in which the first indicating area further includes a numeric field to indicate the value of the operational information element being displayed.

6. The control system of claim 2 in which the visual indicating means includes one or more second indicating areas, each second indicating area being dedicated to displaying the value of a single operational information element.

7. The control system of claim 6 in which each second indicating area of the visual indicating means includes a graphic representation of a bar graph meter to indicate the value of the operational information element being displayed.

8. The control system of claim 1 which includes terminal interface means for allowing an external source to interrogate the operational information elements.

9. The control system of claim 8 in which the terminal interface means includes a modem and an interface to a telephone circuit to allow the interrogations to be performed remotely.

10. A control system in combination with an inverter power supply comprising:
    controller means for controlling the operating power level of the inverter power supply, the controller means including automatic mode control means for automatically varying the operating power level of the inverter power supply, in which the automatic mode control means comprises:
    means for storing a set of automatic power control factors; and
    automatic power level calculation means for calculating the operating power level for the inverter power supply according to the set of automatic power control factors.

11. The control system of claim 10 in which the automatic power control factors comprise a Timed Power Profile table, the Timed Power Profile table including a set of one or more pairs of values, each pair of values including a time value and a corresponding power level value, and in which the automatic power level calculation means includes:
    clock means for establishing a current time; and
    means for comparing the current time to the time values in the Timed Power Profile table and setting the operating power level of the inverter power supply to the power level value corresponding to the current time.

12. The control system of claim 10 in which the automatic power level calculation means includes input means for receiving one or more event inputs, and in which the automatic power control factors comprise an Event Power Profile table, the Event Power Profile table including a set of power level values, each power level value corresponding to one of the event inputs, wherein the automatic power level calculation means determines the operating power level by monitoring the event inputs and selecting a power level value from the Event Power Profile table based on which event inputs are activated, and setting the operating power level to the selected power level value.

13. The control system of claim 10 in which the automatic power control factors comprise input means for receiving an analog input from an external system and calculation means for setting the operating power level to a power level value based on the analog input.

14. A control system in combination with an inverter power supply comprising:
  input means connected to the inverter power supply for obtaining a waveform signal which represents the switching waveform of the inverter power supply, the input means including waveform measurement means for producing at least one waveform diagnostic value based on the waveform signal;
  controller means for generating a set of waveform diagnostic information elements, each waveform diagnostic information element being calculated by the controller means according to a predetermined formula based on at least one of the waveform diagnostic values received from the input means, wherein the controller means periodically samples each waveform diagnostic value and updates the set of waveform diagnostic information elements; and
  memory means connected to the controller means for storing the set of waveform diagnostic information elements.

15. The control system of claim 14 in which the controller means includes:
  display means for providing operator interface for the controller means, the display means including visual indicating means for displaying the value of at least one of the waveform diagnostic information elements.

16. The control system of claim 14 in which one of the waveform diagnostic values comprises a value for the communication time (TK) of the switching waveform.

17. The control system of claim 14 in which one of the waveform diagnostic values comprises a value for the turn off time (TOT) of the switching waveform.

18. The control system of claim 14 in which one of the waveform diagnostic values comprises a value for the switching frequency of the switching waveform.

19. The control system of claim 14 in which one of the waveform diagnostic values comprises a value for the positive peak voltage of the switching waveform.

20. The control system of claim 14 in which one of the waveform diagnostic values comprises a value for the negative peak voltage of the switching waveform.

21. The control system of claim 15 in which the visual indicating means includes a numeric field to indicate the value of the waveform diagnostic information element being displayed.

22. The control system of claim 14 which includes terminal interface means for allowing an external source to interrogate the waveform diagnostic information elements contained in the memory means.

23. The control system of claim 22 in which the terminal interface means includes a modem and an interface to a telephone circuit to allow the interrogations to be performed remotely.

24. A control system in combination with an inverter power supply comprising:
  remote input means comprising a plurality of inputs connected to signals within the inverter power supply, the remote input means producing a remote input value corresponding to each connected signal;
  controller means for providing operational control of the inverter power supply, the controller means being physically separated from the remote input means and connected to the remote input means by a communication line, wherein the remote input means periodically transmits each remote input value to the controller means;
  memory means in the controller means for providing storage for the controller means;
  a remote input table in the memory means, the remote input table including a location to store each remote input value;
  a configuration table in the memory means, the configuration table including a textural message associated with each remote input value; and
  display means for providing operator interface for the controller means, the display means including visual indicating means for displaying said textural messages;
  wherein the controller means includes means for periodically examining each remote input value in the remote input table and when a remote input value is found to be activated, the associated textural message from the configuration table is displayed on the visual indicating means.

25. A control system in combination with an inverter power supply comprising:
  remote input means comprising a plurality of inputs connected to signals within the inverter power supply, the remote input means producing a remote input value corresponding to each connected signal;
  controller means for providing operational control of the inverter power supply, the controller means being physically separated from the remote input means and connected to the remote input means by a communication line, wherein the remote input means periodically transmits each remote input value o the controller means;
  memory means in the controller means for providing storage for the controller means;
  a history table in the memory means for storing a plurality of history table record entries; and
  a remote input table in the memory means, the remote input table including a location to store each remote input value;
  wherein the controller means includes means for periodically examining each remote input value in the remote input table and when a remote input value is found to be activated, the controller means stores a history table record in the history table, each history table record comprising a set of historical information which identifies at least the remote input value which was found to be activated.

26. The control system of claim 25 in which the memory means includes a non-volatile memory and the history table means is located in the non-volatile memory.

27. The control system of claim 25 in which the controller means includes operator interface means for accepting operator inputs, and the history table record includes a field which identifies the last operator input received prior to the activation of the remote input.

28. The control system of claim 25 which includes terminal interface means for allowing an external source to interrogate the history table contained in the memory means.

29. The control system of claim 28 in which the terminal interface means includes a modem and an interface to a telephone circuit to allow the interrogations to be performed remotely.

* * * * *